United States Patent
Sugai et al.

(10) Patent No.: US 6,795,890 B1
(45) Date of Patent: *Sep. 21, 2004

(54) DATA STORAGE METHOD, AND DATA PROCESSING DEVICE USING AN ERASURE BLOCK BUFFER AND WRITE BUFFER FOR WRITING AND ERASING DATA IN MEMORY

(75) Inventors: Naoto Sugai, Tokyo (JP); Atsushi Settsu, Tokyo (JP); Saburo Kobayashi, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 663 days.

This patent is subject to a terminal disclaimer.

(21) Appl. No.: 09/640,454

(22) Filed: Aug. 17, 2000

Related U.S. Application Data

(63) Continuation-in-part of application No. 09/504,713, filed on Feb. 16, 2000, now Pat. No. 6,571,312.

(30) Foreign Application Priority Data

Feb. 19, 1999 (JP) .......................................... 11-041260
Feb. 2, 2000 (JP) ...................................... 2000-025179

(51) Int. Cl.$^7$ ......................... G06F 13/00; G11C 16/10; G11C 16/16
(52) U.S. Cl. .................. 711/103; 711/165; 365/185.29
(58) Field of Search ................................ 711/103, 165; 365/11, 185.29, 185.33, 218

(56) References Cited

U.S. PATENT DOCUMENTS

| | | | |
|---|---|---|---|
| 5,696,929 A | * 12/1997 | Hasbun et al. | 711/103 |
| 5,699,297 A | * 12/1997 | Yamazaki et al. | 365/185.25 |
| 5,802,551 A | * 9/1998 | Komatsu et al. | 711/103 |
| 5,822,245 A | * 10/1998 | Gupta et al. | 365/185.12 |
| 5,867,641 A | * 2/1999 | Jenett | 711/103 |
| 6,571,312 B1 | * 5/2003 | Sugai et al. | 711/103 |

FOREIGN PATENT DOCUMENTS

JP          A5233478          9/1993

* cited by examiner

*Primary Examiner*—Denise Tran
(74) *Attorney, Agent, or Firm*—Birch, Stewart, Kolasch & Birch, LLP

(57) ABSTRACT

A data processing device includes flash memory; nonvolatile memory having an erasure block buffer in which there are stored data recorded in an erasure-unit region of the flash memory; a write control controller for writing into the erasure block buffer write request data, which are to be written into the flash memory; a save unit for saving non-changing data stored in the flash memory to the erasure block buffer; an erasure instruction unit for instructing erasure of the data from the flash memory; and a write unit for writing the data recorded in the erasure block buffer to the flash memory.

13 Claims, 53 Drawing Sheets

WRITE BUFFER MANAGEMENT REGION

| ERASURE UNIT NUMBER | OFFSET VALUE FOR SPECIFYING POSITION OF A WRITE REGION IN ERASURE-UNIT REGION | DATA SIZE |
|---|---|---|
| 1 | 0 x 1000 | 4096 |
| 8 | 0 | 4096 |
| -1 | | |

FIG. 15

WRITE BUFFER MANAGEMENT REGION

| ERASURE UNIT NUMBER | OFFSET VALUE FOR SPECIFYING POSITION OF A WRITE REGION IN ERASURE-UNIT REGION | DATA SIZE | WRITE NUMBER | NUMBER OF TIMES DATA ARE WRITTEN |
|---|---|---|---|---|
| 1 | 0 x 1000 | 4096 | 3 | 3 |
| 8 | 0 | 4096 | 4 | 1 |
| 10 | 0 x 4000 | 4096 | 9 | 2 |
| 22 | 0 | 4096 | 10 | 3 |

|  | DATA CHECK VALUE |
|---|---|
| WRITE REGION 1 | 0 x 1234567 |
| WRITE REGION 2 | 0 x 789a123 |
| WRITE REGION 3 | 0 x a1b8901 |

FIG. 39

| OFFSET WITHIN ERASURE-BLOCK BUFFER | SIZE | DATA CHECK VALUE |
|---|---|---|
| 0 x 0 | 0 x 1000 | 0 x 1234567 |
| 0 x 1000 | 0 x 200 | 0 x 789a123 |
| 0 x 1200 | 0 x ee00 | 0 x a1b8901 |
| -1 | | |

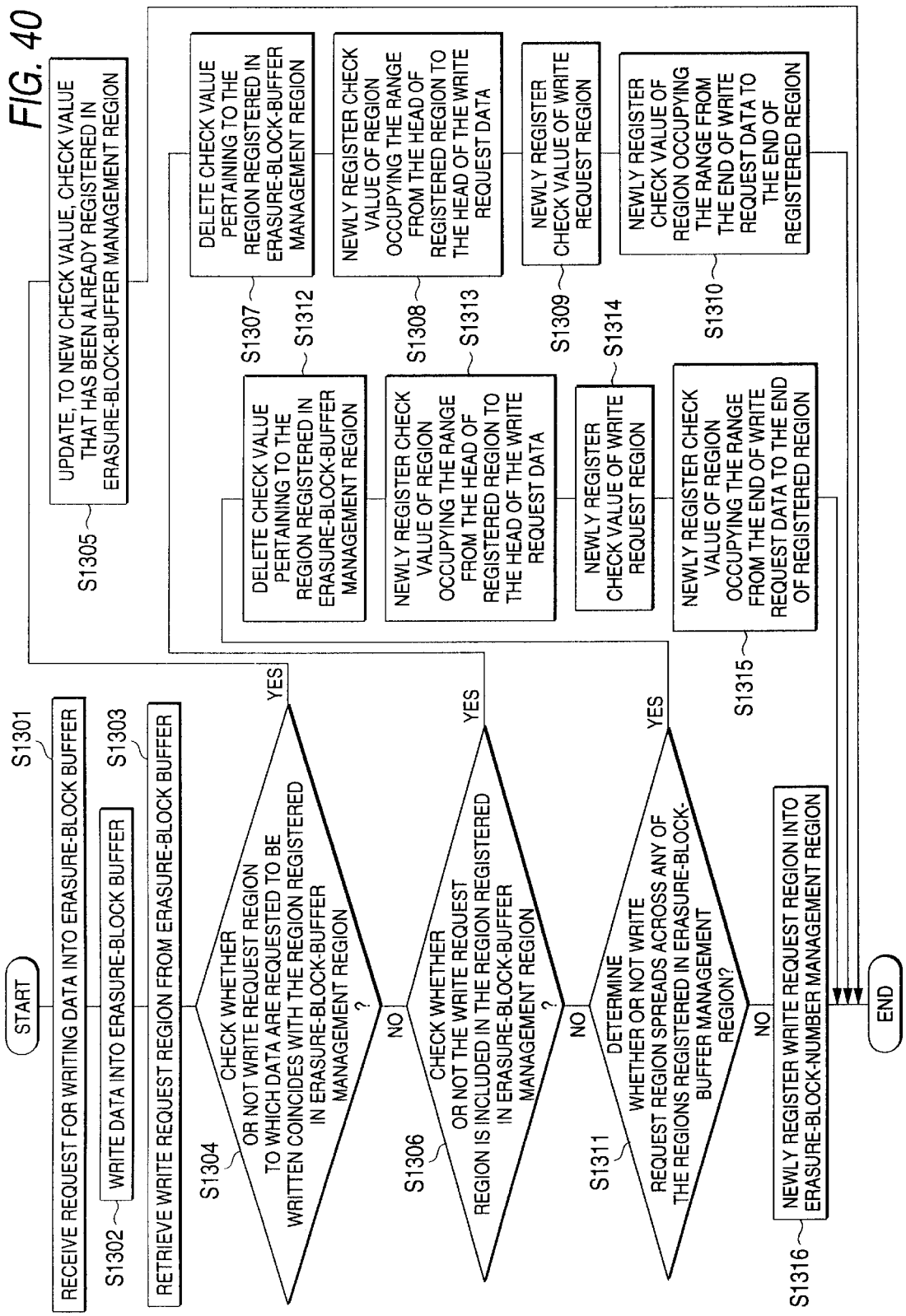

FIG. 41

DATA PROCESSING PERFORMED BY ERASURE-BLOCK BUFFER WHEN DATA PROCESSING DEVICE HAS RECEIVED A REQUEST FOR WRITING INTO MEMORY DATA HAVING AN OFFSET VALUE 0 x 2000 AND A SIZE OF 0 x 2000

EXAMPLE 1: A CASE WHERE WRITE REQUEST REGION IS IDENTICAL WITH TAHT REGISTERED IN ERASURE-BLOCK BUFFER MANAGEMENT REGION

| BEFORE WRITING | | | AFTER WRITING | | |
|---|---|---|---|---|---|
| OFFSET | SIZE | CHECK VALUE | OFFSET | SIZE | CHECK VALUE |
| 0 x 0000 | 0 x 2000 | 0 x 43dcba12 | 0 x 0000 | 0 x 2000 | 0 x 43dcba12 |
| 0 x 2000 | 0 x 2000 | 0 x a234bcd3 | 0 x 2000 | 0 x 2000 | 0 x fedca123 |
| 0 x 4000 | 0 x c000 | 0 x 01234567 | 0 x 4000 | 0 x c000 | 0 x 01234567 |
| -1 | | | -1 | | |

EXAMPLE 2: A CASE WHERE WRITE REQUEST REGION IS INCLUDED IN THE REGIONS REGISTERED IN ERASURE-BLOCK-BUFFER MANAGEMENT REGION

| BEFORE WRITING | | | AFTER WRITING | | |
|---|---|---|---|---|---|
| OFFSET | SIZE | CHECK VALUE | OFFSET | SIZE | CHECK VALUE |
| 0 x 0000 | 0 x 1000 | 0 x abedf123 | 0 x 0000 | 0 x 1000 | 0 x abedf123 |
| 0 x 1000 | 0 x 4000 | 0 x 76981234 | 0 x 1000 | 0 x 1000 | 0 x abd347da |
| 0 x 5000 | 0 x b000 | 0 x 12bcd876 | 0 x 2000 | 0 x 2000 | 0 x fedca123 |
| -1 | | | 0 x 4000 | 0 x 1000 | 0 x abe3480d |
| | | | 0 x 5000 | 0 x b000 | 0 x 12bcd876 |
| | | | -1 | | |

EXAMPLE 3: A CASE WHERE WRITE REQUEST REGION SPREADS ACROSS THE REGION REGISTERED IN THE ERASURE-BLOCK-BUFFER MANAGEMENT REGION

| BEFORE WRITING | | | AFTER WRITING | | |
|---|---|---|---|---|---|
| OFFSET | SIZE | CHECK VALUE | OFFSET | SIZE | CHECK VALUE |
| 0 x 0000 | 0 x 3000 | 0 x 98db6538 | 0 x 0000 | 0 x 2000 | 0 x fbce89de |
| 0 x 3000 | 0 x 2000 | 0 x bcef367d | 0 x 2000 | 0 x 2000 | 0 x fedca123 |
| 0 x 5000 | 0 x b000 | 0 x 12bcd876 | 0 x 4000 | 0 x 1000 | 0 x abe3489d |
| -1 | | | 0 x 5000 | 0 x b000 | 0 x 12bcd876 |
| | | | -1 | | |

EXAMPLE 4: A CASE WHERE WRITE REQUEST REGION IS NOT REGISTERED IN THE ERASURE-BLOCK-BUFFER MANAGEMENT REGION

| BEFORE WRITING | | | AFTER WRITING | | |
|---|---|---|---|---|---|
| OFFSET | SIZE | CHECK VALUE | OFFSET | SIZE | CHECK VALUE |
| 0 x 4000 | 0 x c000 | 0 x 01234567 | 0 x 2000 | 0 x 2000 | 0 x fedca123 |
| -1 | | | 0 x 4000 | 0 x c000 | 0 x 01234567 |
| | | | -1 | | |

FIG. 46

6051: ERASURE-BLOCK-BUFFER MANAGEMENT REGION

| ERASURE-UNIT-NUMBER HOLD SECTION | ERASURE-UNIT-NUMBER VALIDATION REGION | DATA CHECK VALUE |
|---|---|---|
| 2 | 2 | 0 x 12346dfe |

6052: WRITE BUFFER MANAGEMENT REGION

| ERASURE-UNIT NUMBER | OFFSET WITHIN ERASURE UNIT | SIZE | DATA CHECK VALUE | CHECK VALUE STORED IN MANAGEMENT REGION |
|---|---|---|---|---|
| 1 | 0 x 1000 | 4096 | 0 x 1234567 | 0 x 134d123a |
| 8 | 0 x 0000 | 4096 | 0 x 789a123 | 0 x 1214367d |
| -1 | 0 | 0 | 0 | 0 x 456abcde |

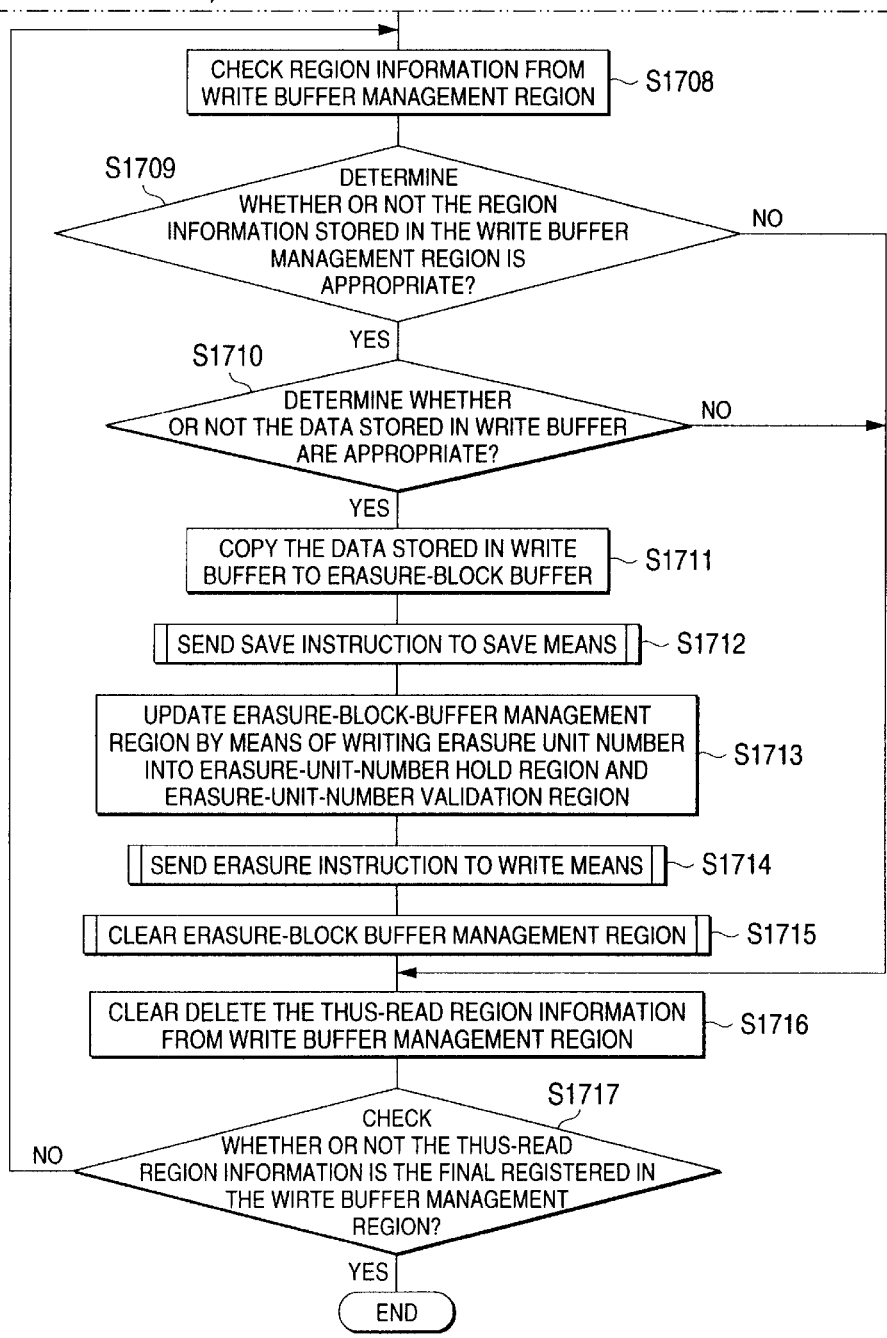

DATA STORAGE METHOD, AND DATA PROCESSING DEVICE USING AN ERASURE BLOCK BUFFER AND WRITE BUFFER FOR WRITING AND ERASING DATA IN MEMORY

This application is a continuation-in-part of application Ser. No. 09/504,713 filed on Feb. 16, 2000 U.S. Pat. No. 6,571,312, issued on May 27, 2003, the entire contents of which are hereby incorporated by reference.

BACKGROUND OF THE INVENTION

The present invention relates to memory having a plurality of erasure-unit regions in which data are erased or written in predetermined units, and more particularly, to a data processing device using, e.g., flash memory.

Flash memory corresponds to semiconductor memory in which data can be electrically written or from which data can be electrically erased. The flash memory is characterized by the ability to retain memory contents without power supply. Particularly in the field of industrial computers, flash memory is often used as a storage medium substituting for a hard disk.

However, new data cannot be written directly in flash memory. More specifically, data must be collectively erased in units of, for example 64 K (hereinafter referred to as "erasure units"), before new data are written in the flash memory. After data have been erased in erasure units, new data corresponding to the size of the erased data are written, thus rewriting the data stored in the flash memory.

Particularly, from a structural viewpoint, in large-capacity and high-density flash memory, an erasure unit is larger than the unit for rewriting (hereinafter referred to as a "rewriting unit"). For this reason, in many cases, data used for rewriting become greater in size than the erasure unit. Even in a case where such data are rewritten into the flash memory, data must erased in erasure units which may comprise data segments which do not need to be rewritten, and the data containing the thus-erased data segments must be written in the flash memory once again.

A technique for rewriting data in flash memory is described in the Unexamined Japanese Patent Application Publication No. Hei 5-233478. FIG. 18 is a block diagram showing the outline of circuitry of the background art. The operation of the circuit will now be described by reference to FIG. 18.

A data rewriting operation of FRAM 4 will be described. Data to be rewritten into the FRAM 4 are downloaded into SRAM 3. Data pertaining to an area of the FRAM 4 which does not need to be subjected to rewriting are copied to a register 5. All the contents of the FRAM 4 are deleted by means of a FRAM clear program stored in EPROM 2. The data that have been downloaded into the SRAM 3 are copied to the FRAM 4. Further, the data which have been saved in the register 5 are copied to the original area on the FRAM 4 which does not need to be subjected to rewriting.

In the prior art, in a case where volatile memory is used as the register 5 which acts as an area into which data are saved at the time of rewriting of the flash memory, in the event that supply of power to the data processing device is interrupted after erasure of data, data pertaining to an area not to be subjected to rewriting, as well as data pertaining to an area to be subjected to rewriting, are lost, thus deteriorating the reliability of flash memory.

In order to prevent loss of the data recorded in the register, the data which have been recorded on the register must be written into flash memory immediately. From an operational viewpoint, flash memory must be erased every time the data stored in flash memory are rewritten. Eventually, flash memory must be subjected to erasing operations in the number corresponding to the number of times data are rewritten. A limitation is imposed on the number of times flash memory can be subjected to erasure (usually 100,000 times or thereabouts). Therefore, the number of times flash memory is subjected to erasure must be diminished. In the background art, however, the number of times flash memory is subjected to erasure is increased, thus shortening the life of flash memory.

SUMMARY OF THE INVENTION

The present invention has been conceived to solve such a problem of the prior art and is aimed at providing a data processing device which prevents erasure of data from flash memory when the data recorded in the flash memory are rewritten and exhibits improved reliability when data are written into the flash memory.

The present invention is also aimed at providing a data processing device which diminishes the number of times flash memory is subjected to erasure, through use of a simple structure and while maintaining reliability, in the event of a limitation being imposed on the number of times flash memory is subjected to erasure.

To this end, the present invention provides a data storage method by which data recorded in memory are rewritten through use of memory having a plurality of erasure-unit regions into which data are written in predetermined units and from which data are erased in predetermined units, as well as through use of a nonvolatile erasure block buffer for storing write data to be written into the erasure-unit regions and non-changing data belonging to the erasure-unit regions, the method comprising:

a first erasure block buffer write step of writing first write data into the erasure block buffer, in response to a first write request for requesting writing of the first write data into a first erasure-unit region of the memory;

a second erasure block buffer write step of writing into the erasure block buffer non-changing data recorded in the first erasure-unit region, in response to the first write request for requesting writing of the first write data into the first erasure-unit region of the memory;

an erasure step of erasing the data from the first erasure-unit region after the second erasure block buffer write step; and a memory write step of writing into the first erasure-unit region the first write data and the non-changing data stored in the erasure block buffer.

By way of example, the present invention is described in connection with a first embodiment (shown in FIG. 3).

Further, the present invention provides a data storage method by which data stored in memory are rewritten through use of memory having a plurality of erasure-unit regions into which data are written in predetermined units and from which data are erased in predetermined units, as well as a nonvolatile erasure block buffer for storing write data to be written into the erasure-unit regions and non-changing data belonging to the erasure-unit regions, the method comprising:

a first erasure block buffer write step of writing first write data into the erasure block buffer, in response to a first write request for requesting writing of the first write data into a first erasure-unit region of the memory;

a second erasure block buffer write step of writing into the erasure block buffer non-changing data recorded in the first erasure-unit region, in response to the first write request for requesting writing of the first write data into the first erasure-unit region of the memory;

a third erasure block buffer write step of writing second write data into the memory, in response to a second write request for requesting writing of the second write data into the memory, after the first erasure block buffer write step; and a memory write step of writing the data written in the erasure block buffer into the first erasure-unit region after the second erasure block buffer write step and the third erasure block buffer write step.

By way of example, the present invention is described in connection with a second embodiment (shown in FIG. 5).

Preferably, the first erasure block buffer write step is followed by a comparison step of comparing the erasure-unit region into which the first write data are to be written with the erasure-unit region into which the second write data are to be written, and, in a case where a match is obtained as a comparison result in the comparison step, processing pertaining to the third erasure block buffer write step and processing pertaining to the memory write step are performed.

By way of example, the present invention is described in connection with a second embodiment (shown in FIG. 5).

Still further, the present invention provides a data storage method by which data recorded in memory are rewritten through use of memory having a plurality of erasure-unit regions into which data are written in predetermined units and from which data are erased in predetermined units, as well as an erasure block buffer for storing write data to be written into the erasure-unit regions and non-changing data belonging to the erasure-unit regions, the method comprising:

a first erasure block buffer write step of writing first write data into the erasure block buffer, in response to a first write request for requesting writing of the first write data into a first erasure-unit region of the memory;

a second erasure block buffer write step of writing into the erasure block buffer non-changing data recorded in the first erasure-unit region, in response to the first write request for requesting writing of the first write data into the first erasure-unit region of the memory;

an erasure step of erasing the data from the first erasure-unit region after the second erasure block buffer write step; and a memory write step of writing the data stored in the erasure block buffer into the first erasure-unit region from which the data have been erased in the erasure step, in response to a second write request for requesting writing of second write data into the memory.

By way of example, the present invention is described in connection with a third embodiment (shown in FIG. 7).

Preferably, the erasure step is followed by a comparison step of comparing the erasure-unit region into which the first write data are to be written with the erasure-unit region into which the second write data are to be written, and, in a case where a match is obtained as a comparison result in the comparison step, processing pertaining to the memory write step is performed.

By way of example, the present invention is described in connection with a third embodiment (shown in FIG. 7).

Furthermore, the present invention provides a data storage method by which data recorded in memory are rewritten, through use of memory having a plurality of erasure-unit regions into which data are written in predetermined units and from which data are erased in predetermined units, a nonvolatile erasure block buffer for storing write data to be written into the erasure-unit regions and non-changing data belonging to the erasure-unit regions, and a write buffer for storing the write data without storing the non-changing data, the method comprising:

an erasure block buffer write step of writing into the erasure block buffer first write data and the non-changing data stored in a first erasure-unit region of the memory, in response to a first write request for requesting writing of the first write data into the first erasure-unit region of the memory;

a first write buffer write step of writing second write data into the write buffer, in response to a second write request for requesting writing of the second write data into a second erasure-unit region of the memory, after the erasure block buffer write step; and a second write buffer write step of writing third write data into the write buffer, in response to a third write request for requesting writing of the third write data into an erasure-unit region of the memory, after the first write buffer write step.

By way of example, the present invention is described in connection with a forth embodiment (shown in FIG. 10).

Preferably, the data storage method further comprises a comparison step of comparing a write request region for specifying a location in the memory in which the second write data are to be written with a write request region for specifying a location in the memory in which the third write data are to be written, and, in a case where the write request region into which the third write data are to be written is included in the write request region in which the second write data are to be written, in the second write buffer write step the third write data are written over the area of the write buffer in which the second write data are written.

By way of example, the present invention is described in connection with a forth embodiment (shown in FIG. 10).

The present invention also provides a data storage method by which data recorded in memory are rewritten through use of memory having a plurality of erasure-unit regions into which data are written in predetermined units and from which data are erased in predetermined units, a nonvolatile erasure block buffer for storing write data to be written into the erasure-unit regions and non-changing data belonging to the erasure-unit regions, and a write buffer for storing the write data without storing the non-changing data, the method comprising:

a first erasure block buffer write step of writing into the erasure block buffer first write data and the non-changing data stored in a first erasure-unit region of the memory, in response to a first write request for requesting writing of the first write data into the first erasure-unit region of the memory;

a first write buffer write step of writing second write data into the write buffer, in response to a second write request for requesting writing of the second write data into a second erasure-unit region of the memory, after the first erasure block buffer write step;

a memory write step of writing into the first erasure-unit region the first write data written in the erasure block buffer and the non-changing data after the first write buffer write step, in a case where there arises a third write request for requesting writing third write data into an erasure-unit region of the memory; and a second erasure block buffer write step of writing into the erasure block buffer the second write data, the third write data, and the non-changing data stored in the second erasure-unit region, after the memory write step.

By way of example, the present invention is described in connection with a fifth embodiment (shown in FIGS. 13 and 14).

Preferably, the first erasure block buffer write step is followed by a comparison step of comparing the erasure-unit region into which the second write data are to be written with the erasure-unit region into which the third write data are to be written, and, in a case where a match is obtained as a comparison result in the comparison step, processing pertaining to the third erasure block buffer write step and processing pertaining to the memory write step are performed.

By way of example, the present invention is described in connection with a fifth embodiment (shown in FIGS. 13 and 14).

The present invention provides a data processing device which includes memory having a plurality of erasure-unit regions into which data are written in predetermined units and from which data are erased in predetermined units, and erasure means for erasing the data stored in the erasure-unit regions in the predetermined units and which rewrites the data stored in the erasure-unit region through use of first write data, the processing device comprising:

a nonvolatile block buffer which permits writing of data in arbitrary units;

write data write means for writing the first write data into the erasure block buffer;

save means for writing, into the erasure block buffer, non-changing data which are not to be rewritten by the first write data from among the data stored in the erasure-unit region of the memory; and memory write means for writing the first write data and the non-changing data, both data sets being written into the erasure block buffer, into the erasure-unit region from which the data have been erased by the erasure means.

By way of example, the present invention is described in connection with a first embodiment (shown in FIG. 1).

The present invention further provides a data processing device which rewrites data stored in memory, through use of memory having a plurality of erasure-unit regions into which data are written in predetermined units and from which data are erased in predetermined units, as well as an erasure block buffer for storing both write data to be written into the erasure-unit region and non-changing data stored in the erasure-unit region, the device comprising:

write data write means for writing first write data into the erasure block buffer, in response to a first write request for requesting writing of the first write data into a first erasure-unit region of the memory;

save means for writing into the erasure block buffer non-changing data stored in the first erasure-unit region, in response to the first request for requesting writing of the first write data into the first erasure-unit region of the memory;

memory write means for writing into the first erasure-unit region the data written in the erasure block buffer;

the erasure block buffer retaining the first write data and the non-changing data stored in the first erasure-unit region, until a second write request is issued after the first write request; and the write data write means writing the second write data into the erasure block buffer in a case where the second write request requests writing of the second write data into the first erasure-unit region, and the memory write means writing, to the first erasure-unit region, data belonging to the erasure block buffer in which the second write data are written.

By way of example, the present invention is described in connection with a second embodiment (shown in FIG. 4).

The present invention further provides a data processing device which rewrites data stored in memory, through use of memory having a plurality of erasure-unit regions into which data are written in predetermined units and from which data are erased in predetermined units, an erasure block buffer for storing both write data to be written into the erasure-unit region and non-changing data stored in the erasure-unit region, and a write buffer for storing the write data without storing the non-changing data, the device comprising:

write data write means for writing first write data into the erasure block buffer, in response to a first write request for requesting writing of the first write data into a first erasure-unit region of the memory;

save means for writing into the erasure block buffer non-changing data stored in the first erasure-unit region, in response to the first request for requesting writing of the first write data into the first erasure-unit region of the memory;

write buffer write means for writing second write data into the write buffer, in response to a second write request for writing the second write data into a second erasure-unit region of the memory;

the write buffer retaining the second write data until a third write request is issued after the second write request; and the write buffer write means writing the third write data into the write buffer in a case where the third write request requests writing of the third write data into the write request region for the second write data.

By way of example, the present invention is described in connection with a forth embodiment (shown in FIGS. 8 to 10).

The present invention provides a data processing device including:

first memory having a plurality of erasure-unit regions into which data are written and from which data are deleted in predetermined erasure units, and erasure means for deleting the data stored in the erasure-unit region in the erasure units, the data stored in the erasure-unit region being converted into first write data, the data processing device comprising:

nonvolatile second memory which has an erasure block buffer, an erasure-unit-number hold region, and an erasure-unit-number validation region and which can write data in arbitrary data units;

save means for writing, into the erasure-block buffer, non-changing data which constitute a portion of the data stored in the erasure unit regions and are not rewritten by the first write data;

write control means for writing into the erasure-unit-number hold region information for specifying an erasure-unit region into which the first write data are to be written, writing the first write data into the erasure-block buffer, and writing into the erasure-unit-number validation region information corresponding to the information written into the erasure-unit-number hold region after completion of writing of the first write data and the non-changing data;

memory write means for writing the first write data written into the erasure-block buffer and the non-changing data into the erasure-unit regions; and recovery means for recovering the data processing device on the basis of information pertaining to the erasure-unit-number hold region and the erasure-unit-number validation region. By way of example, the present invention is described in connection with a seventh embodiment (shown in FIGS. 19 to 21).

Preferably, the second memory has an erasure-block buffer validation region into which is to be written a data check value, which is obtained as a result of processing of the data stored in the erasure-block buffer;

the write control means writes the data check value into the erasure-block-buffer validation region; and the recovery means performs a recovery operation on the basis of the value stored in the erasure-unit-number hold region, the value stored in the erasure-unit-number validation region, and the data check value stored in the erasure-block-buffer validation region. By way of example, the present invention is described in connection with an eighth embodiment (shown in FIGS. 22 to 24).

The present invention also provides a data processing device including:

first memory having a plurality of erasure-unit regions into which data are written and from which data are deleted in predetermined erasure units, and erasure means for deleting the data stored in the erasure-unit region in the erasure units, the data stored in the erasure-unit region being converted into first write data, the data processing device comprising:

nonvolatile second memory which has an erasure block buffer and a write inhibition flag region and can write data in arbitrary data units;

write control means which, in response to a first write request for requesting writing of the first write data into a first erasure-unit region of the first memory, writes the first write data into the erasure-block buffer in a case where a value stored in the write inhibition flag region shows a write enable state;

save means which, in response to the first write request, writes non-changing data stored in the first erasure-unit region into the erasure-block buffer in a case where a value stored in the write inhibition flag region shows a write enable state; and memory write means which writes the data stored in the erasure-block buffer into the first memory in a case where a value stored in the write inhibition flag region shows a write enable state. By way of example, the present invention is described in connection with a ninth embodiment (shown in FIGS. 25 to 28).

Preferably, the erasure-block buffer retains the first write data and the non-changing data in the first erasure-unit region until a second write request arises after the first write request for requesting writing of the first write data; and in a case where the second write request requests writing second write data into the first erasure-unit region, the write control means writes the second write data into the erasure-block buffer, and the memory write means writes into the first erasure-unit region data stored in the erasure-block buffer in which the second write data have been written. By way of example, the present invention is described in connection with a tenth embodiment (shown in FIGS. 29 to 31).

Preferably, the write control means deletes data from the erasure-unit-number hold means and data from the erasure-unit-number validation means after completion of writing the data stored in the erasure-block buffer into the erasure-unit region of the first memory. By way of example, the present invention is described in connection with the seventh embodiment (shown in FIG. 20) and in the tenth embodiment (shown in FIG. 30).

Preferably, in a case where the value stored in the erasure-unit-number hold region coincides with the value stored in the erasure-unit-number validation region, the recovery means instructs the memory write means to write the first write data and the non-changing data, both data sets being written in the erasure-block buffer, into the erasure-unit region of the first memory through use of the erasure means. By way of example, the present invention is described in connection with the seventh embodiment (shown in FIG. 21) and the tenth embodiment (shown in FIG. 31).

Preferably, in a case where the value stored in the erasure-unit-number hold region does not coincide with the value stored in the erasure-unit-number validation region, the recovery means deletes the value from the erasure-unit-number hold region and the value from the erasure-unit-number validation region. By way of example, the present invention is described in connection with the seventh embodiment (shown in FIG. 21) and an eleventh embodiment (shown in FIG. 32).

Preferably, the second memory has an erasure-block-buffer management region which manages the regions stored in the erasure-block buffer in a divided manner and into which is to be stored a data check value, which would be obtained as a result of processing of data belonging to the divided regions;

the write control means writes the data check value into the erasure-block-buffer validation region; and the recovery means performs a recovery operation on the basis of the value stored in the erasure-unit-number hold region, the value stored in the erasure-unit-number validation region, and the data check value stored in the erasure-block-buffer validation region. By way of example, the present invention is described in connection with a twelfth embodiment (shown in FIG. 34) and a thirteenth embodiment (shown in FIG. 39).

Preferably, in a case where a write request region of the second write data coincides with the divided regions managed in the erasure-block-buffer management region, the write control means rewrites the data check value. By way of example, the present invention is described in connection with the thirteenth embodiment (shown in FIGS. 39 to 42).

Preferably, in a case where the data requested to be read are stored in the erasure-block buffer, the data processing device further comprises:

reading means for reading data from the erasure-block buffer in a case where the data requested to be read are stored in the erasure-block buffer. In a case where data stored in the erasure-block buffer are determined to be correct on the basis of the data check value stored in the erasure-block-buffer management region, the reading means reads data from the erasure-block buffer. By way of example, the present invention is described in connection with a fourteenth embodiment (shown in FIG. 43).

Preferably, in a case where the data requested to be read are stored in the erasure-block buffer, the data processing device further comprises:

reading means for reading data from the erasure-block buffer in a case where the data requested to be read are stored in the erasure-block buffer. In a case where data stored in the erasure-block buffer are determined to be incorrect on the basis of the data check value stored in the erasure-block-buffer management region, the reading means reads data from the first memory. By way of example, the present invention is described in connection with a fifteenth embodiment (shown in FIG. 44).

The present invention provides a data processing device including:

first memory having a plurality of erasure-unit regions into which data are written and from which data are deleted in predetermined erasure units, and erasure means for deleting the data stored in the erasure-unit region in the erasure units, the data processing device comprising:

nonvolatile second memory which can write data in arbitrary data units and has an erasure-block buffer for storing write data to be written into the erasure-unit region and non-changing data stored in the erasure-unit region, a write buffer for storing write data without storage of non-changing data, a region for retaining a first data check value which is obtained as a result of processing of the data stored in the erasure-block buffer, and a region for retaining a second data check value which is obtained as a result of processing of the data written into the write buffer;

write control means which writes the first write data into the erasure-block buffer in response to a first write request for requesting writing of first write data into the first erasure-unit region, writes the second write data into the write buffer in response to a second write request for requesting writing of second write data into the second erasure-unit region, and writes the first data check value and the second data check value into the second memory;

save means for writing non-changing data stored in the first erasure-unit region into the erasure-block buffer in response to the first write request;

memory write means for writing the first write data and the non-changing data, both data sets being written in the erasure-block buffer, into the first erasure-unit region from which data have been deleted by the erasure means; and recovery means which recovers the data processing device on the basis of the first data check value and the second data check value, both values being written in the second memory. By way of example, the present invention is described in connection with a sixteenth embodiment (shown in FIGS. 45 to 49).

Preferably, the recover means instructs the memory write means to write the data stored in the erasure-block buffer into the first erasure-unit region in a case where the data stored in the erasure-block buffer are determined to be correct on the basis of the first data check value, instructs the write control means to write the second write data stored in the write buffer into the erasure-block buffer in a case where the data stored in the write buffer are determined to be correct on the basis of the second data check value, and instructs the save means to write into the erasure-block buffer the non-changing data stored in the second erasure-unit region. By way of example, the present invention is described in connection with a seventeenth embodiment (shown in FIG. 50).

Preferably, the data processing device further comprises third memory which has an erasure-unit-number hold region and reds data at a higher speed than does the second memory;

the write control means writing information for specifying the erasure-unit region into the erasure-unit-number hold region of the second memory and into the erasure-unit-number hold region of the third memory. When the information for specifying the erasure-unit region is referred to, data are read from the erasure-unit-number hold region of the third memory. By way of example, the present invention is described in connection with an eighteenth embodiment (shown in FIGS. 51 to 54).

The present invention provides a data processing device including:

first memory having a plurality of erasure-unit regions into which data are written and from which data are deleted in predetermined erasure units, and erasure means for deleting the data stored in the erasure-unit region in the erasure units, the data stored in the erasure-unit region being converted into first write data, the data processing device comprising:

nonvolatile second memory which can write data in arbitrary data units and has an erasure-block buffer for storing the first write data and non-changing data stored in the erasure-unit region and a write buffer for storing write data without storage of non-changing data;

save means for writing non-changing data stored in the first erasure-unit region into the erasure-block buffer in response to the first write request;

buffer write means for writing a plurality of write data sets into the write data buffer in response to a plurality of write requests other than the first write request;

memory write means for writing the first write into the first erasure-unit region data and the non-changing data, both data sets being written in the erasure-block buffer write means; and data transfer means which calculates the amount of the plurality of write data sets stored in the write buffer, for each erasure-unit region for which a write request has been issued, and which transfers into the erasure-block buffer all the data sets to be written into a single erasure-unit region on the basis of the calculation result, wherein the save means writes into the erasure-block buffer non-changing data, which are stored in the erasure-unit region and correspond to the write data having been transferred to the erasure-block buffer. By way of example, the present invention is described in connection with a nineteenth embodiment (shown in FIGS. 55 and 56).

Preferably, in a case where, from among the write data stored in the write buffer, the amount of the write data requested to be written into a single erasure-unit region is smaller than a predetermined amount and where the amount of the write data is greater than a predetermined amount, the data transfer means transfers all the write data into the erasure-block buffer. By way of example, the present invention is described in connection with a twentieth embodiment (shown in FIG. 57).

BRIEF DESCRIPTION OF THE DRAWINGS

FIG. 15 is a table showing an example of data pertaining to the frequency of use of a write buffer region;

FIG. 39 is a table showing the configuration of an erasure-block-buffer management region 604 according to a thirteenth embodiment of the present invention;

FIG. 40 is a table showing the operation of the erasure-block-buffer write region 614;

FIG. 41 is a table showing example data manipulations pertaining to the erasure-block-buffer management region 604;

FIG. 46 are tables showing data to be recorded into a buffer management region 605;

DETAILED DESCRIPTION OF THE PREFERRED EMBODIMENTS

First Embodiment

Figure 1:
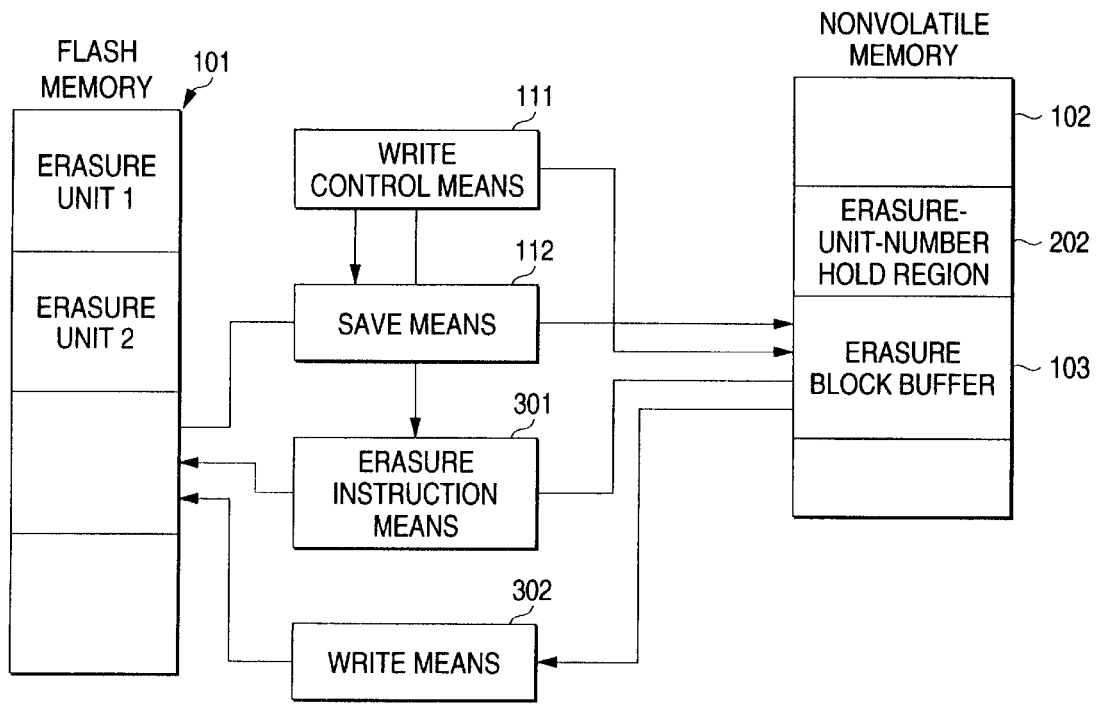
FIG. 1 is a block diagram showing a data processing device according to a first embodiment of the present invention.

FIG. 1 is block diagram showing the configuration of a data processing device according to a first embodiment of the present invention. In FIG. 1, reference numeral 101 designates flash memory comprising a plurality of erasure-unit regions. In this flash memory, data are erased or rewritten in predetermined units (hereinafter referred to as "erasure units").

Reference numeral 102 designates nonvolatile memory which does not need to erase data for rewriting purpose in predetermined erasure units, which would have been required by flash memory, and which permits direct writing of data in arbitrary units. More specifically, the nonvolatile memory 102 corresponds to battery backup SRAM.

Reference numeral 103 designates an erasure-block buffer which is provided in the battery backup SRAM, serving as the nonvolatile memory 102, and has capacity sufficient for saving and recording the data stored in one erasure-unit region of the flash memory 101. In the first embodiment, the erasure-block buffer 103 is constituted of an area having the same capacity as the erasure-unit region. The erasure-block buffer 103 is formed on the battery backup SRAM (i.e., the nonvolatile memory 102) and can permit writing of data in arbitrary units. Reference numeral 111 designates write control means for controlling writing of data into the flash memory 101; 112 designates save means for saving to the block-erasure buffer 103 the data stored in the erasure-unit region; 301 designates erasure instruction means for issuing to the flash memory 101 an instruction for erasing the data stored in the erasure-unit region; and 302 designates write means for writing write data into the flash memory 101. The term "write data" used herein designates data to be written into memory such as the flash memory 101 and the nonvolatile memory 102. Write data contained in a write request is particularly called write request data.

Reference numeral 202 designates an erasure-unit-number hold region which is provided in the nonvolatile memory 102 and records an erasure unit number.

Figure 2:
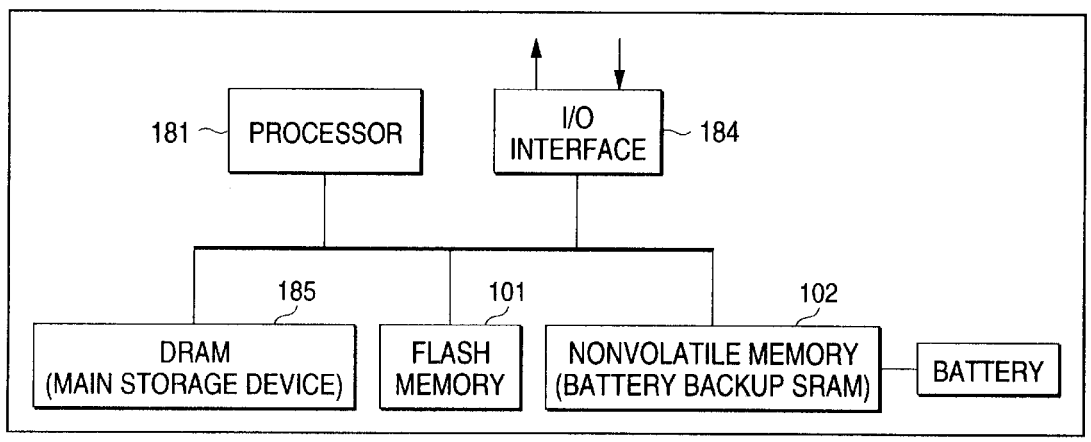
FIG. 2 is a block diagram showing the outline of a system of the first embodiment.

FIG. 2 is a block diagram showing the outline of a specific system embodying the first embodiment. Reference numeral 181 designates a processor; 102 designates battery backup SRAM; 101 designates flash memory; 184 designates an I/O interface; and 185 designates DRAM serving as a primary storage area. The write control means 111, the save means 112, the erasure instruction means 301, and the write means 302 are materialized by means of execution of software by the processor 181. The data stored in the erasure-unit region of the flash memory 101 are erased by means of hardware; i.e., the flash memory 101 which has received an erasure instruction from the erasure instruction means 301. Specifically, the erasure of the data in erasure units is effected by erasure means (not shown) of the flash memory 101. New data are rewritten when the processor 181 receives a write request from, for example, the I/O interface 184.

Figure 3:
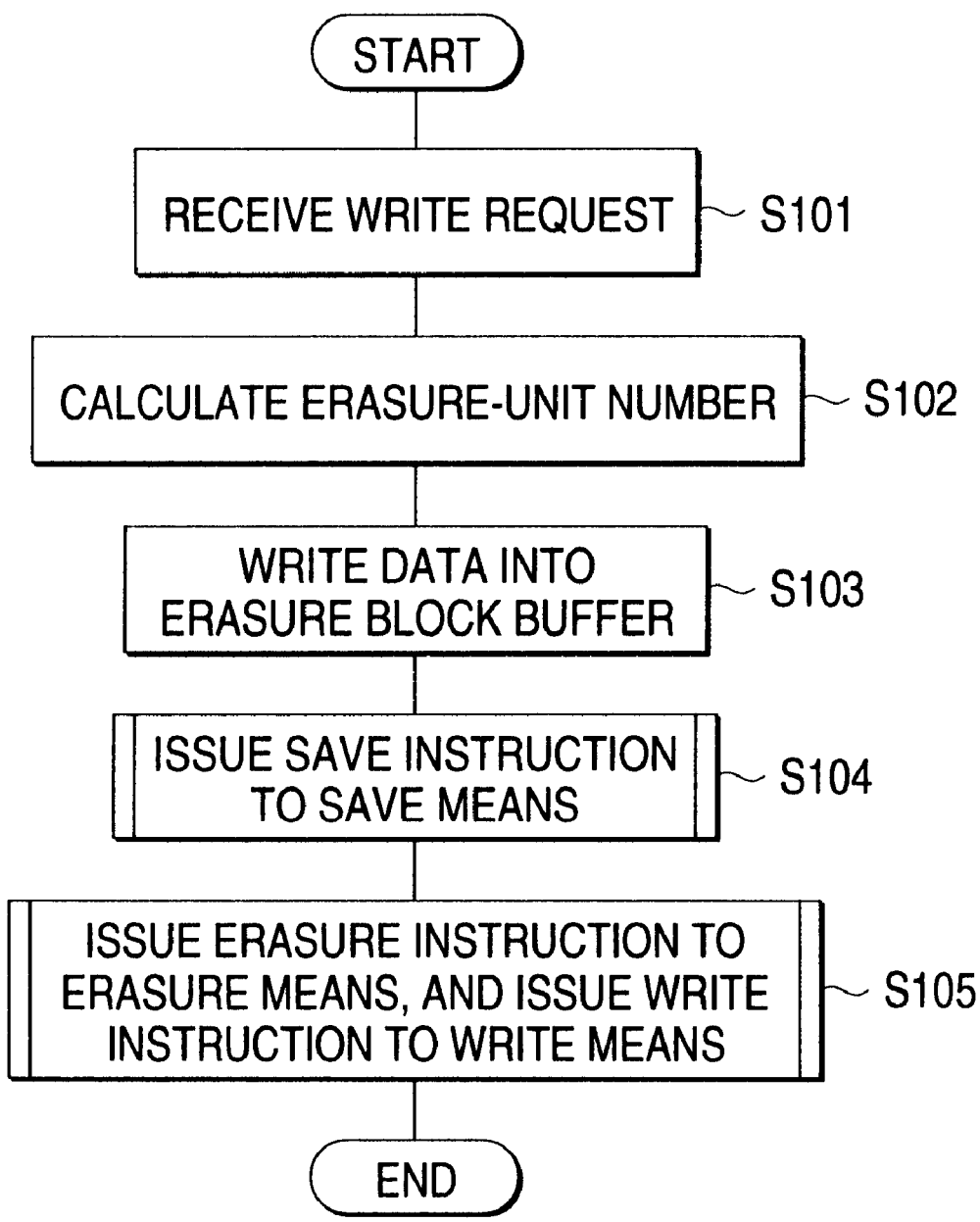
FIG. 3 is a flowchart showing the operation of the data processing device of the first embodiment for rewriting data stored in flash memory.

Rewriting of data into the flash memory 101 in the present embodiment will now be described. FIG. 3 is a flowchart according to which the data processing device of the first embodiment rewrites data into the flash memory 101. Unless otherwise specified, the write control means 111 performs the following processing operations.

In step S101, the write control means 111 receives a request for writing data into the flash memory 101. The write request contains write request data serving as write data, a write request region for specifying an address of the flash memory into which the write data are to be written, and information about the size of the write data.

In step S102, a number assigned to the erasure unit including the write request region and a position corresponding to the write request region within the erasure unit are calculated from the size of the erasure unit and by reference to the writ request region. The write request region serves as an address for specifying the relative position of the overall flash memory 101, and a position within the erasure unit specifies a relative position within a specific erasure unit.

In step S103, write request data are written into a position within the erasure-block buffer 103 corresponding to the write request region. More specifically, the write request data are written into a position in the erasure-block buffer 103, the position corresponding to the location in the erasure unit calculated in step S102.

In step S104, the write control means 111 issues a save instruction to the save means 112. The save instruction comprises numbers assigned to the erasure units, and information about a position in the erasure unit which corresponds to the write request region. Upon receipt of the save instruction, the save means 112 writes into the erasure-block buffer 103 non-changing data which correspond to the erasure unit number, calculated in step S102, within the erasure-unit region and correspond to data other than the data sets written in step S103. The term "non-changing data" used herein designate data which correspond to data sets of the data stored in the erasure unit region and are not written by the write request data.

In step S105, the write control means 111 issues an erasure instruction to the erasure instruction means 301. The erasure instruction contains numbers assigned to the erasure units of the flash memory 101. Upon receipt of the erasure instruction, the erasure instruction means 301 issues to the erasure means of the flash memory 101 an instruction for deleting one erasure unit in the flash memory corresponding to the number assigned to the erasure unit. After the erasure means of the flash memory 101 has completed erasure of the data by means of the erasure means, the write means 302 writes the data stored in the erasure-block buffer 102 into the erased erasure-unit region of the flash memory 101.

Processing pertaining to steps S101 to S105 is performed every time a write request is issued.

Next will be described recovery processing required in the event that supply of power to the data processing device is interrupted during a period from the time the data stored in the flash memory 101 are erased until new data are rewritten into the flash memory 101. Provided that data, which have not yet finished being written into the flash memory 101, still exist in the erasure-block memory 103 of the nonvolatile memory 102, next will be described processing required for again writing into the flash memory 101 the data pertaining to the erasure-block buffer 103 after power restoration.

First, ordinary recovery processing will be described.

In step S105, the write control means 111 issues an instruction for erasing data from the flash memory 101 and records into the erasure-unit-number hold region 202 provided in the nonvolatile memory 102 the number assigned to the erasure unit of the flash memory 101 contained in the erasure instruction.

After completion of writing of the data into the flash memory 101, the write control means 111 nullifies the erasure unit number recorded in the erasure-unit-number hold region 202.

Next will be described recovery processing required in the event that supply of power to the data processing device is interrupted during a period from the time data are erased from the flash memory 101 until new data are written into the flash memory 101.

After occurrence of interruption of power supply and restoration of power, the write control means 111 ascertains the erasure-unit-number hold region 202 provided in the nonvolatile memory 102. If a valid erasure unit number still exists in the erasure-unit-number hold region 202, the write control means 111 determines that the writing of data has not yet been completed. The data recorded in the erasure-block buffer 103 are written into the flash memory 101. The number assigned to the erasure unit in the flash memory 101 into which the data recorded in the erasure-block buffer 103 are to be written is recorded in the erasure-unit-number hold region 202. Subsequently, the erasure unit number recorded in the erasure-unit-number hold region 202 is made invalid. In contrast, if an effective erasure unit number does not exist in the erasure-unit-number hold region 202, writing of data into the flash memory 101 is not performed, and recover processing is terminated.

Through the foregoing processing operation, the data can be recovered in the event that supply of power to the data processing device is interrupted.

As has been mentioned, in the present embodiment, the data pertaining to the erasure unit of the flash memory 101 to be rewritten are saved in the erasure-block buffer region 103 of the nonvolatile memory 102. Even if supply of power to the data processing device is interrupted during a period from the time data are erased from the flash memory 101 until before completion of writing of new data into the flash memory 101, loss of the data is prevented. There can be provided a data processing device which exhibits excellent reliability in terms of rewriting of the data stored in the flash memory.

In the present embodiment, after in step S103 the write data have been written into the erasure-block buffer 103, non-changing data are saved in step S104. However, these operations may be performed in a retrograde sequence. Alternatively, in a case where the write data are written into the erasure-block buffer 103 after the data have been saved into the save means 112, not only the non-changing data but all the data pertaining to the erasure unit containing the non-changing data may be saved, and write data may be written over the thus-saved data.

In the first embodiment, the write data are written into the erasure-block buffer 103 in step S103. However, it is essential only that the write data be written into the erasure-block buffer 103 at least before the write means 302 writes into the erasure-unit region of the flash memory 101 the data stored in the erasure-block buffer 103.

In step S102, the number assigned to the erasure unit containing the write request region and the position in the erasure unit corresponding to the write request region is calculated from the capacity of the erasure unit and the write request region. However, data pertaining to the number and the position may be contained in the write request data. In such a case, computation processing pertaining to step S102 may be omitted.

In the present embodiment, the flash memory 101 is an example of memory comprising a plurality of erasure-unit regions from which data are erased in predetermined units or into which data are written in predetermined units. The erasure means (not shown) of the flash memory 101 is an example of erasure means for erasing in erasure units the data recorded in the erasure-unit region. The battery backup SRAM 102 is an example of nonvolatile erasure-block buffer into which data can be written in arbitrary units. The write control means 111 is an example of write data write means for writing write data into the erasure-block buffer. The save means 112 is an example of save means for writing non-changing data into the erasure-block buffer. The write means 302 is an example of memory write means for writing write data and non-changing data into the erasure-unit region.

Second Embodiment

Figure 4:
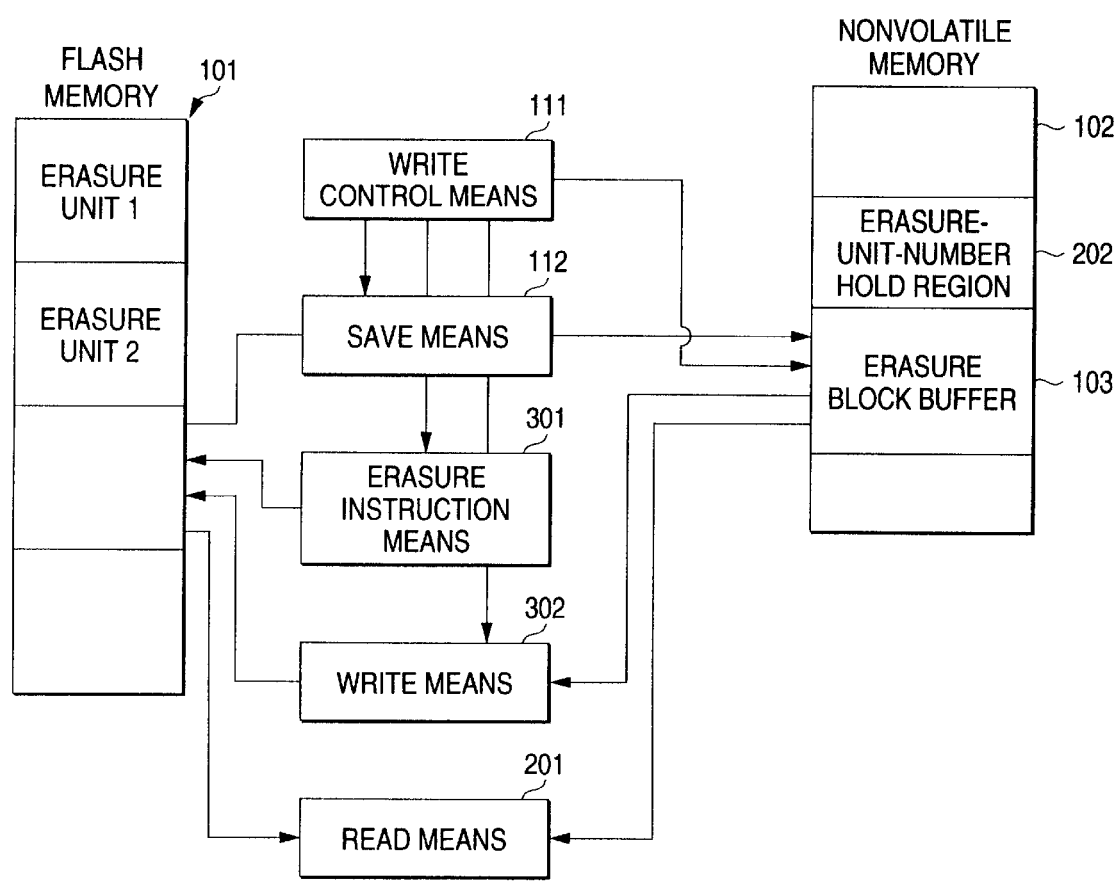
FIG. 4 is a block diagram showing a data processing device according to a second embodiment of the present invention.

FIG. 4 is a block diagram showing the outline of a data processing device according to a second embodiment of the present invention. In the drawing, reference numeral 201 designates read means for reading data from the flash memory 101 or the nonvolatile memory 102; and 202 designates an erasure-unit number hold means which is an area within the nonvolatile memory 102 and records an erasure unit number. In other respects, the data processing device is identical with or corresponds to that described by reference to FIG. 1, and hence repetition of explanation is omitted. The read means 201 is materialized by means of the processor 181 performing software.

In the second embodiment will be given an explanation of particularly the operation of the data processing device in a case where data are consecutively written into a single erasure-unit region.

In the second embodiment will be described the operation of the data processing device performed when data are written into memory. Here, the term "memory" designates a concept comprising both the flash memory 101 and the nonvolatile memory 102. Unless otherwise specified, the write control means 111 performs the following processing operations.

In step S201, the write control means 101 receives a request for writing data into the flash memory 101. The details of the data write request are the same as those of the data write request employed in the first embodiment.

In step S202, the write control means 101 seeks a number assigned to the erasure unit of the flash memory containing the write request region. The method of determining the number of the erasure unit is the same as that described in connection with the first embodiment.

By reference to the erasure-unit-number hold region 202, in step S203 a determination is made as to whether or not an erasure unit number is recorded in the erasure-unit number hold region 202.

If the erasure number is not recorded, write data are written into the erasure-block buffer 103 in step S204, in the same manner as in the first embodiment.

In step S205, the write control means 111 issues a save instruction to the save means 112. The details of the save instruction are the same as those of the save instruction employed in the first embodiment. The save means 112 writes into the erasure-block buffer 103 the non-changing data stored in the erasure unit of the flash memory 101, the number of the erasure unit being determined in step S202.

In step S206, the number of the erasure unit determined in step S202 is recorded in the erasure-unit-number hold region 202. Subsequently, writing of data into the memory is terminated without writing data into the flash memory 101.

In a case where in step S203 the erasure unit number is determined to be recorded in the erasure-unit-number hold region 202, in step S207 a determination is made as to whether or not the erasure unit number determined in step S202 matches the erasure unit number recorded in the erasure-unit-number hold region 202.

If no match is determined to exist, in step S208 the write control means 111 issues an erasure instruction to the erasure instruction means 301. The details of the erasure instruction are the same as those of the erasure instruction employed in the first embodiment. Upon receipt of the erasure instruction, the erasure instruction means 301 issues to the erasure means of the flash memory 101 an instruction for erasing data from an erasure unit in the flash memory 101, the erasure unit having a number corresponding to the erasure unit number. After the erasure means of the flash memory 101 has finished erasing data from the erasure unit, the write means 302 writes into the erasure-unit region of the flash memory 101 the data stored in the erasure-block buffer 103.

Processing pertaining to steps S204 to S206 are performed in the same manner as in the case where the erasure unit number is not recorded. Subsequently, there are performed writing of data into the erasure-block buffer, saving the data recorded in the flash memory, and recording of the erasure-unit number.

In a case where in step S207 a match is determined to exist between the erasure unit number determined in S202 and the erasure unit number recorded in the erasure-unit-number hold region 202, in step S209 the write request data are written into the erasure-block buffer 103.

As described above, in a case where the erasure unit number is not recorded, processing pertaining to steps S201 to S206 is performed. In a case where the erasure-unit-number is recorded, processing pertaining to steps S201 to S203, S207, S208, and S204 to S206 is performed in sequence given. Alternatively, processing pertaining to steps S201 to S203, S207, and S209 is performed in the sequence given. More specifically, in a case where the first request corresponds to a write request, processing pertaining to steps S3201 to S206 is performed in the sequence given. In response to a second or subsequent write request, processing pertaining to steps S201 to S203, S207, S208, and S204 to S206 are performed in sequence given. Alternatively, processing pertaining to steps S201 to S203, S207, and S209 are performed in the sequence given. These processing operations are performed every time a write request is issued.

The operation of the data processing device of the second embodiment performed at the time of reading data from the memory will now be described by reference to FIG. 6. Unless otherwise specified, the read means 201 performs the following processing operations.

In step S211, the read means 201 receives a read request. The read request contains an address of the flash memory 101 serving as a read request region and data pertaining to the size of data to be read.

In step S212, the number assigned to the erasure unit of the flash memory 101 containing the read request region is determined in the same manner as in the case where the data are written. Here, the term "read request region" used herein designates an area of the flash memory 101 into which are stored data to be read and specifies a relative position on the flash memory 101.

In step S213, a determination is made as to whether or not an erasure unit number is present and whether or not the erasure unit number is identical with that obtained in step S212, by reference to the erasure-unit-number hold region 202.

If a match exists between the erasure unit numbers, the data recorded in the read region are retained in the erasure-block buffer. Hence, in step S214, the data are read from the erasure-block buffer.

If the erasure unit number is not present in the erasure-unit-number hold region 202 or if no match exists between the erasure unit number recorded in the erasure-unit-number hold region 202 and the erasure unit number determined in step S212, the data recorded in the read region are not retained in the erasure-block buffer. Hence, in step S215, the data are read from the flash memory 101.

As mentioned above, in the second embodiment, in a case where data are written into a single erasure-unit region of the flash memory, after first write data have been written into the erasure-block buffer, second write data are written over the data that have already recorded in the erasure-block buffer, without writing into the flash memory the data recorded in the erasure-block buffer. In a case where data are continuously written into a single erasure-unit region, the foregoing processing operations are performed consecutively. By virtue of such operations of the data processing device, in addition to yielding the advantage achieved in the first embodiment, the present embodiment can yield an advantage of preventing deterioration of flash memory by collectively and consecutively writing data into a single erasure-unit region of the flash memory, to thereby diminish the number of times data are written in the flash memory.

Even in the second embodiment, recovery operation can be performed in the event of interruption of power supply, as in the first embodiment. In this case, the record of an erasure unit number may be used as a not-yet-completed flag. This flag can be embodied by nullification of an erasure unit number after data have been written into the flash memory.

In step S205, there is performed a saving operation so as to write into the erasure-block buffer 103 the non-changing data stored in the erasure-unit region of the flash memory 101. It is essential only that the saving operation be performed before the non-changing data are written into at least the flash memory 101. Further, it is essential only that writing of write request data into the erasure-block buffer in step S204 be performed before the next write request data are written into the erasure-block buffer.

Third Embodiment

A data processing device according to a third embodiment of the present invention will now be described. As shown in FIG. 4, the data processing device is identical with that of the second embodiment in terms of configuration and operation. In the present embodiment, after data have been saved from the erasure-unit region of the flash memory 101, the data are erased from the erasure-unit region.

Figure 7:
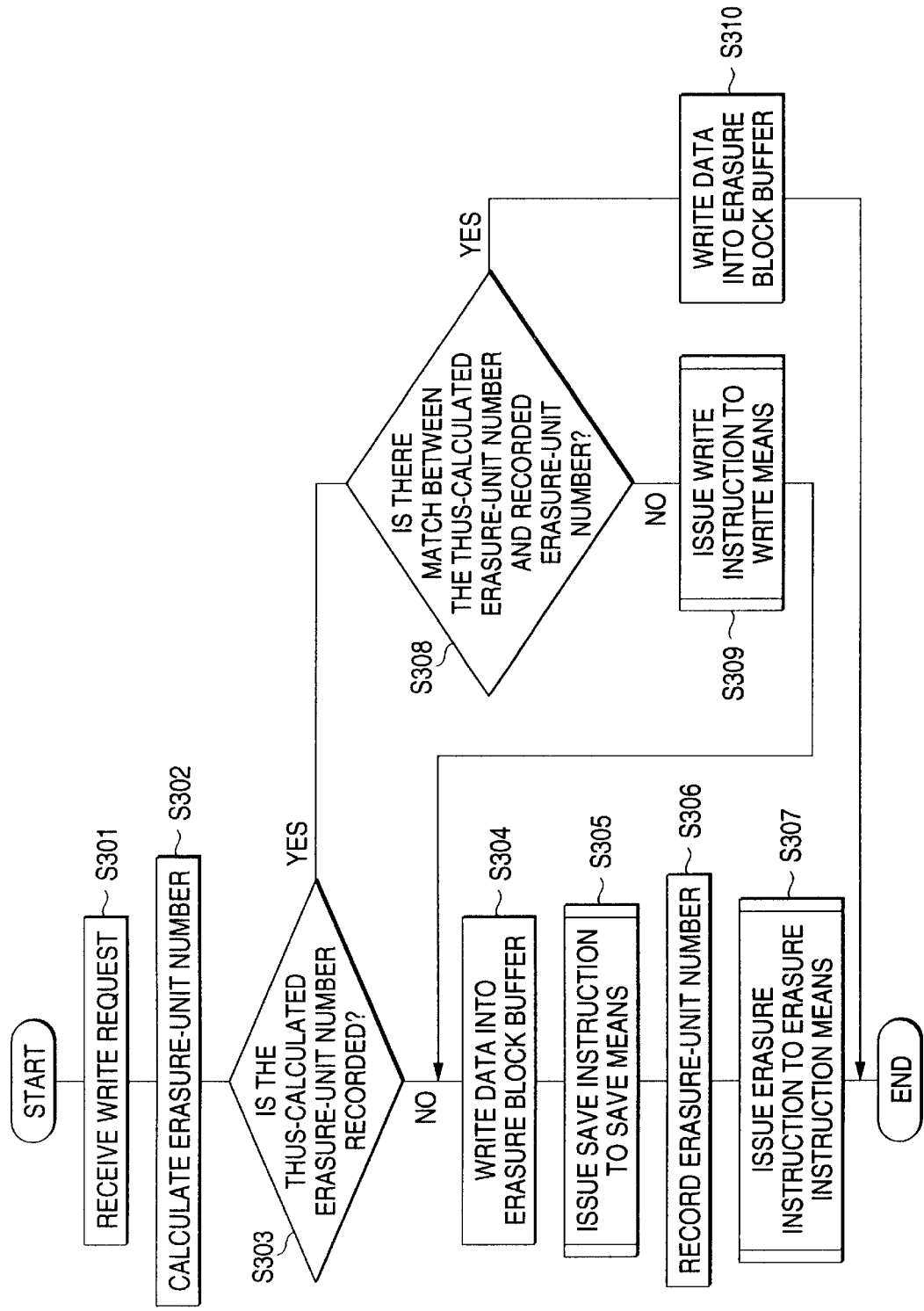
FIG. 7 is a flowchart showing the operation of a data processing device of a third embodiment for rewriting data stored in flash memory.

The operation of the data processing device of the third embodiment performed at the time of writing data into memory will now be described by reference to FIG. 7. Unless otherwise specified, the write control means 111 performs the following operation.

In step S301, the write control means 111 receives a data write request, and the details of the data write request are the same as those of the data write request of the first embodiment.

In step S302, a number assigned to the erasure-unit region of the flash memory 101 containing the write request region is determined. The method of determining the number assigned to the erasure-unit region is the same as that in the first embodiment.

In step S303, a determination is made as to whether or not the erasure unit number is recorded, by reference to the erasure-unit-number hold region 202.

If in step S303 the erasure unit number is determined not to be recorded in the erasure-unit-number hold region 202, in step S304 write request data are written into the erasure block buffer 103.

In step S305, the write control means 111 issues a save instruction to the save means 112, and the details of the save instruction are the same as those employed in the first embodiment. Upon receipt of the save instruction, the save instruction means 112 saves into the erasure block buffer 103 the non-changing data stored in the erasure-unit region.

In step S307, the write control means 111 issues an erasure instruction to the erasure instruction means 301. The erasure instruction contains information about the erasure unit number determined in step S301. Upon receipt of the erasure instruction, the erasure instruction means 301 issues an instruction for erasing the data from the erasure-unit region whose data have finished being saved into the erasure block buffer in step S305.

In a case where in step S303 an erasure unit number is determined to be recorded in the erasure-unit-number hold region 202, in step S308 a determination is made as to whether or not a match exists between the erasure unit number determined in step S302 and the erasure unit number recorded in the erasure-unit number hold means 302.

If no match is determined to exist between the erasure unit numbers, in step S309 a write instruction is issued to the write means 302. The write instruction contains information about the erasure unit number. Upon receipt of the write instruction, the write means 302 writes into the flash memory 101 the data pertaining to the current erasure block buffer 103. The data recorded in the erasure-unit region of the flash memory 101 have already been erased in the previous write operation (S307). Hence, the data recorded in the erasure block buffer 103 are written into the erasure unit region from which data have already been erased. In subsequent steps, processing pertaining to steps S304 and S307 are performed, as in the case where no erasure unit number is recorded.

If in step S308 a match is determined to exist between the erasure unit numbers, the data recorded in the unit erasure region into which the write request data are to be written have already been recorded in the erasure block buffer 103. Therefore, in step S310 the write request data are written into the erasure block buffer 103.

The operation of the data processing device of the third embodiment is the same as that of the data processing device of the second embodiment.

The foregoing processing is executed every time the write request is issued.

In the third embodiment, after having been saved, the data are erased from the flash memory. At the time of writing the data stored in the erasure block buffer into the flash memory, there is no necessity for performing a processing operation of erasing data from the flash memory. Since flash memory erases data, as if the erasure were performed by hardware, the processor can perform another processing operation in parallel. For instance, the processor writes data into the main storage device by way of the I/O interface or performs arithmetic processing in parallel.

In a case where data are erased from the flash memory at the time of writing data into the flash memory, the processor has already received the write request, and hence the processor must await erasure processing and cannot perform another processing operation in parallel.

As mentioned above, in the third embodiment, after having been saved, data are erased from the flash memory. Hence, there is eliminated a necessity for erasing data from flash memory at the time of writing data into the flash memory. In addition to yielding the advantage achieved in the second embodiment, the present embodiment can yield an advantage of shortening the time required for effecting write processing. Further, the processor can perform processing in parallel with erasure of data from the flash memory, thus improving the processing speed of the data processing device.

Fourth Embodiment

Figures 8, 9:
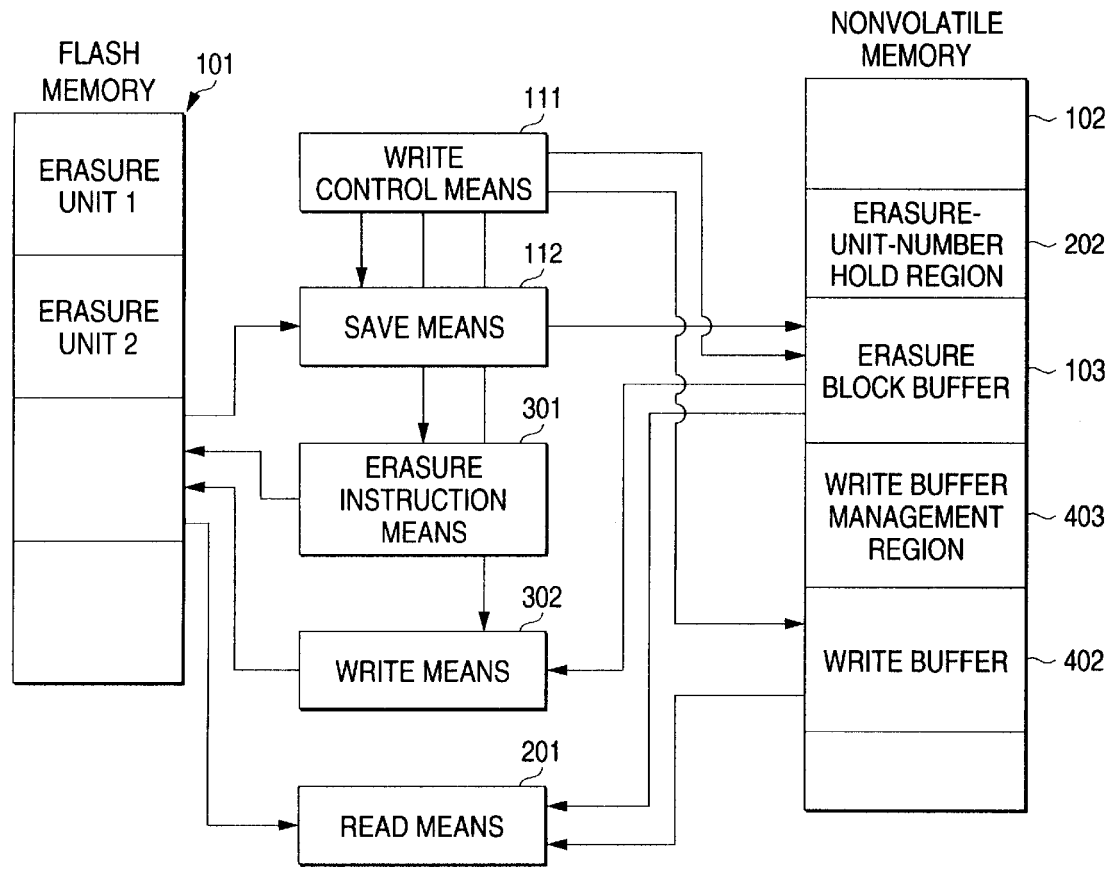
FIG. 8 is a block diagram showing a data processing device according to a fourth embodiment of the present invention.
FIG. 9 is a table showing the contents of data recorded in a write buffer management region.

FIG. 8 is a block diagram showing the configuration of a data processing device according to a fourth embodiment of the present invention. In the drawing, reference numeral 402 designates a write buffer which records write data and is formed in the nonvolatile memory 102 from which data can be read in arbitrary units or into which data can be written in arbitrary units. The write buffer 401 records write data and does not record non-changing data. Reference numeral 403 designates a write buffer management region. An erasure unit number, an offset value for specifying the position of a write region in the erasure unit region, and a data size are stored in the write buffer management region 403. In other respects, the data processing device is identical with or corresponds to that shown in FIG. 3 in terms of configuration, and hence repetition of its explanation is omitted here.

FIG. 9 is a table showing the details of the data recorded in the write buffer management region 403. The write buffer management region 403 retains a number assigned to the erasure unit region of the flash memory 101 into which the data retained in the write buffer 402 are to be written, an offset value for specifying the location of the write region in the erasure unit region, and data pertaining to the size of the write region. A value of −1 assigned to the erasure unit region signifies that no write data exist in the erasure unit region. Although in the present embodiment the write region has a uniform size, the size of the write region can be changed from one data set to another data set.

Figure 10:
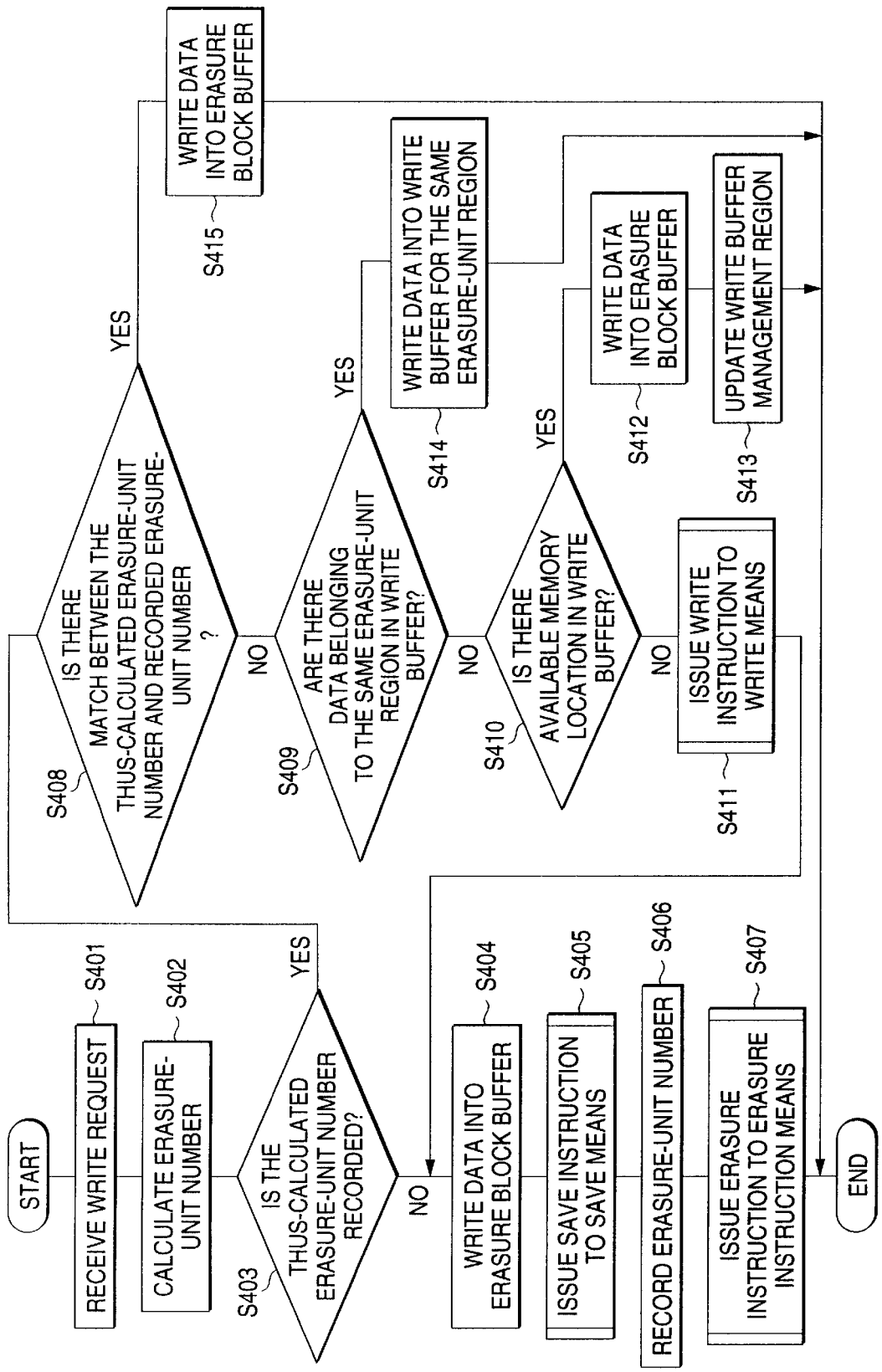
FIG. 10 is a flowchart showing the operation of a data processing device of a fourth embodiment for rewriting data stored in flash memory.

The operation of the data processing device of the fourth embodiment performed at the time of writing data into memory will now be described by reference to FIG. 10. Unless otherwise specified, the write control means 111 performs the following processing operations.

In step S401, the write control means 111 receives a data write request, and the details of the data write request are the same as those of the data write request employed in the first embodiment.

In step S402, there is determined a number assigned to the erasure-unit region of the flash memory containing the write request region. The operation of the data processing device required for determining the number is the same as in the first embodiment.

In step S403, a determination is made as to whether or not the number assigned to the erasure-unit region is recorded, by reference to the erasure-unit-number hold region 202.

If the number assigned to the erasure unit is not recorded, in step S404 the write control means 111 writes write request data into the erasure block buffer 103.

In step S405, the write control means 111 issues a save instruction to the save means 112. The details of the save instruction are the same as those of the save instruction employed in the first embodiment. Upon receipt of the save instruction, the save means 112 writes, into the erasure block buffer 103, the non-changing data recorded in the erasure-unit region specified by the erasure unit number calculated in step S402.

In step S406, the erasure unit number calculated in S402 is recorded in the erasure-unit-number hold region 202.

In step S407, the write control means 111 issues an erasure instruction to the erasure instruction means 301. The details of the erasure instruction are the same as those of the erasure instruction employed in the second embodiment. Upon receipt of the erasure instruction, the erasure instruction means 301 issues, to the flash memory 101, an instruction for erasing the data from the erasure unit region whose data have already finished being saved to the erasure block buffer 103.

In a case where in step S403 the erasure unit number is determined to be recorded in the erasure-unit-number hold region 202, in step S408 a determination is made as to whether or not the erasure unit number determined in step S402 matches the erasure unit number recorded in the erasure-unit-number hold region 202.

If in step S408 no match is determined to exist between the erasure unit numbers, in step S409 a determination is made as to whether or not the data to be written into an area identical with the write request region which are already present in the write buffer 402, on the basis of the data recorded in the write buffer management region 403. Such a determination can be ascertained on the basis of the erasure unit number, the offset value for specifying the position of a write region in the erasure unit region, and the data pertaining to the size of the write region, which are stored in the write buffer management region 403. In other words, in step S409 a determination is made as to whether or not the area specified by the write request region is contained in the write request region relating to the data that have already recorded in the write buffer 402. In either of the following two cases, the area specified by the write request region is determined to be contained in the write request region relating to the data which have already been recorded in the write buffer 402. In one case, the area specified by the write request region is completely identical with the write request region relating to the data which have already been stored in the write buffer 402. In another case, the area specified by the write request region is contained in the write request region relating to the data which have already been stored in the write buffer 402.

If in step S409 the data to be written into an area identical with the write request region are determined not to exist in the write buffer 402, in step S410 the write control means 111 checks available memory locations of the write buffer 402 as to whether or not the write buffer 402 has a memory location in which the write request data can be written. The presence of an available memory location can be ascertained on the basis of the data recorded in the write buffer management region 403. In the present embodiment, the presence of an available memory location can be recorded by assigning a value of −1 to the final erasure unit number. If the final erasure unit number assumes a value other than a value of −1, no available memory location is present in the write buffer 402. As a matter of course, a determination may be made as to whether or not the write buffer 402 has an available memory location, on the basis of the capacity of the write buffer 402 and the data pertaining to the size of write data contained in management data.

If the write buffer 402 has no available memory location, in step S411 the write control means 111 issues a write instruction to the write means 302. The details of the write instruction are the same as those of the write instruction employed in the first embodiment. Upon receipt of the write instruction, the write means 302 writes into the flash memory 101 the data currently recorded in the erasure block buffer 103.

In the subsequent steps, processing pertaining to steps S404 to S407 is performed in the same manner as in the case where the erasure unit number is not recorded.

If in step S410 the write buffer 402 is determined to have an available memory location, in step S412 write data are written into the write buffer 402.

In step S413, the management data pertaining to the write data which are written in step S412 are recorded in the write buffer management region 403. The number assigned to the erasure-unit region, the offset value for specifying a location in the erasure-unit region, and the size of write data are recorded as the management data. The management data stored in the write buffer management region 403 are associated with the write data stored in the write buffer 402 by recording the management data and the write data in such a way that the data are assigned the same sequence in the address of each area. Alternatively, addresses in the write buffer—in which write data are recorded—may be recorded into the write buffer management region 403, thus making the management data associated with the write data.

If in step S409 the data to be written into the area identical with the write request region are determined to already exists, in step S414 the write data are written into the area of the write buffer in which the data are recorded.

In a case where in step S408 the erasure unit number calculated in step S402 is determined to match the erasure unit number recorded in the erasure-unit-number hold region 202, in step S415 the write request data are written into the erasure block buffer. The operation of the data processing device of the fourth embodiment performed at the time of writing the write request data into the erasure block buffer is the same as in the first embodiment.

Figure 11:
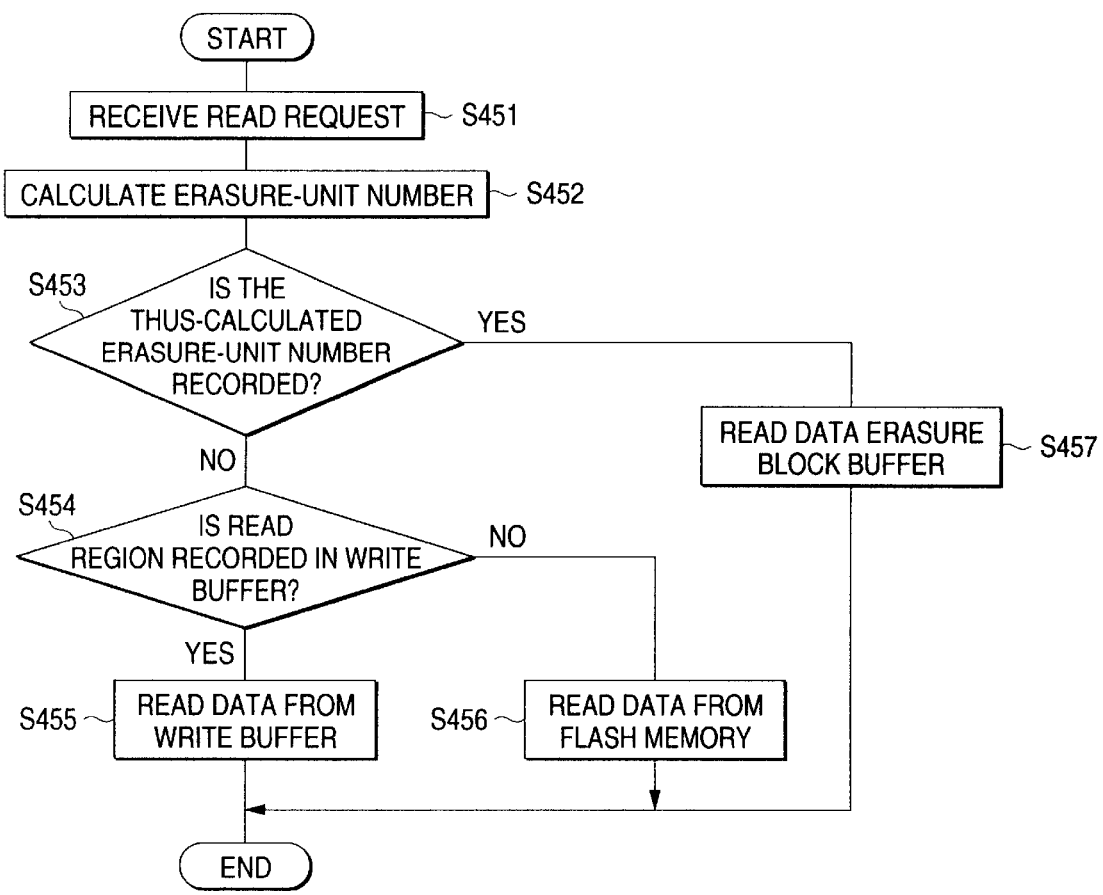
FIG. 11 is a flowchart showing the operation of the data processing device of the fourth embodiment for reading data from the memory.

The operation of the data processing device of the present embodiment performed at the time of reading data from memory will now be described by reference to FIG. 11. Unless otherwise specified, the read means 201 performs the following operations.

In step S451, the read means 201 receives a read request, and the details of the read request are the same as those of the read request employed in the second embodiment.

In step S452, the number assigned to the erasure-unit region of the flash memory containing the read request region is determined. The operation of the data processing device required for seeking the number assigned to the erasure unit region is the same as in the second embodiment.

In step S453, a determination is made as to whether or not the erasure unit number is recorded in the erasure-unit region number hold region 202, by reference to the erasure-unit-number hold region 202.

If the erasure unit number is not recorded, in step S454 a determination is made as to whether or not the data to be written into the area specified as the read request region have already been recorded in the write buffer 402, by reference to the management data stored in the write buffer management region 403.

If the data to be written into the area specified as the read request region are recorded in the write buffer 402, in step S455 the data are read from the write buffer 402.

In contrast, if the data to be written into the area specified as the read request region are not recorded in the write buffer 402, in step S456 the read data are read from the flash memory 101.

If in step S453 the erasure unit number is determined to be recorded in the erasure-unit-number hold region 202 and if in step S454 the erasure unit number is determined to match the erasure unit number calculated in step S452, the data stored in the read region are retained in the erasure block buffer 103, and hence in step S457 the read data are read from the erasure block buffer 103.

The foregoing processing operations are executed every time the write request is issued.

In the present embodiment, in addition to the erasure block buffer 103, the write buffer 402 for recording write data is provided in the nonvolatile memory 102. Hence, a plurality of write data sets can be recorded in different erasure-unit regions. In addition to yielding the advantage achieved in the third embodiment, the present embodiment yields an advantage of diminishing the number of times data are written in the flash memory 101, to thereby reduce deterioration of the flash memory 101. Particularly, since the cost of battery backup SRAM per recording capacity is expensive, a strong demand exists for efficient utilization of the battery backup SRAM. As in the case of the present embodiment, in addition to the erasure block buffer 103, the write buffer 402 is provided as an area for recording write data without recording non-changing data. Therefore, in contrast with a data processing device having a plurality of erasure block buffers, the data processing device of the present invention can greatly diminish deterioration of the flash memory, by efficiently utilizing the nonvolatile memory 102.

In the present embodiment, the write buffer 402 is an example of a write buffer for storing write data without involvement of storage of non-changing data. The write control means 111 is an example of data write means for writing first write data into the erasure block buffer in response to a first write request for requesting writing of the first write data into a first erasure unit region. The write control means 111 is an example of buffer write means for writing second write data into the write buffer in response to a second write request for requesting writing of the second write data into a second erasure unit region. In the fourth embodiment, the write control means 111 acts as both the data write means and the buffer write means. The save means 112 is an example of save means for writing into the erasure block buffer the non-changing data recorded in the first erasure unit region, in response to the first write request for requesting writing of first write data into the first erasure unit region.

Fifth Embodiment

Figure 12:
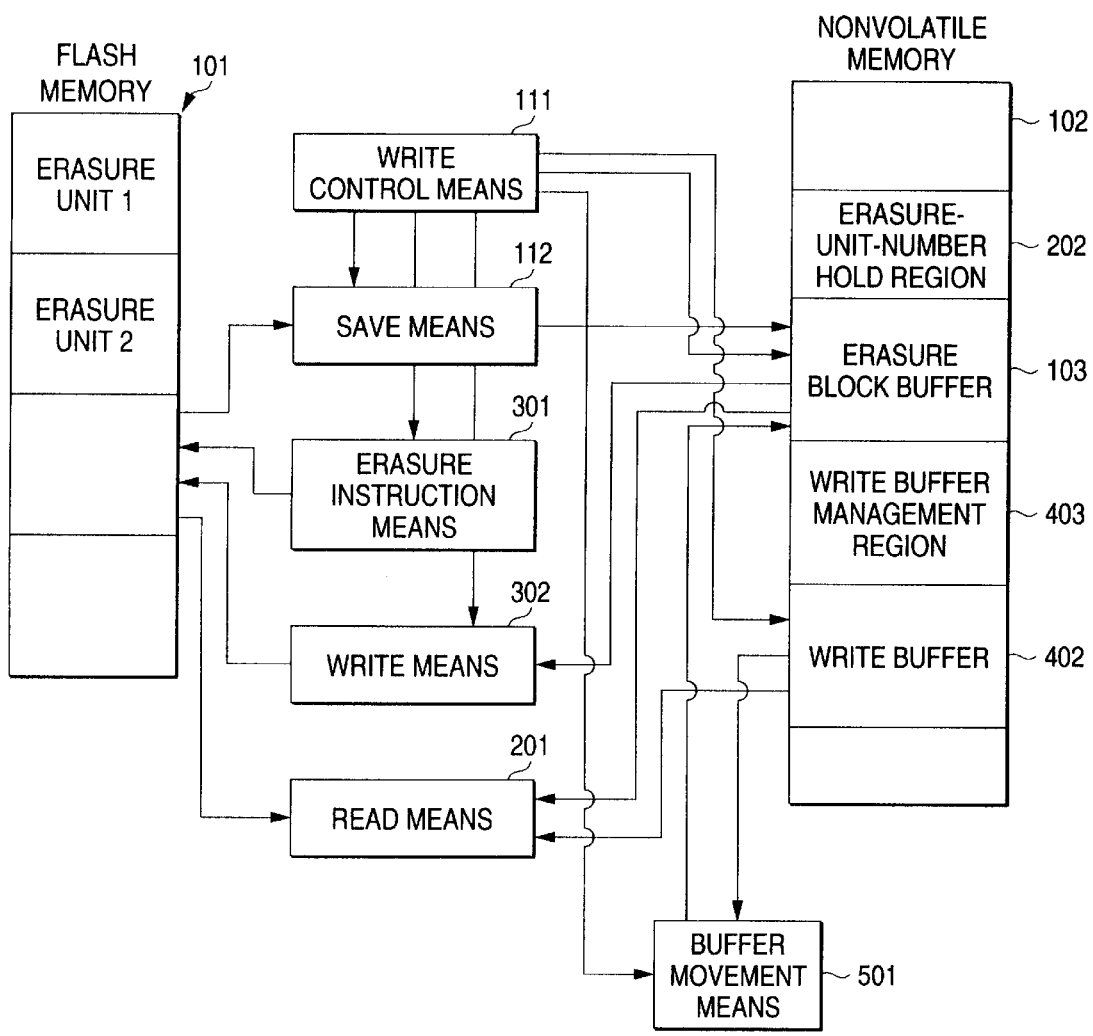
FIG. 12 is a block diagram showing a data processing device according to a fifth embodiment of the present invention.

FIG. 12 is a block diagram showing the configuration of a data processing device according to a fifth embodiment of the present invention. In the drawing, reference numeral 501 designates buffer-data movement means for moving the data recorded in the write buffer 402. In other respects, the data processing device is identical with or corresponds to that described in connection with the fourth embodiment, and hence repetition of explanation is omitted. The data processing device of the fifth embodiment is basically identical in operation with that described in connection with the fourth embodiment, but the processing devices differ from each other in that the buffer-data movement means 501 moves to the erasure block buffer 103 the data recorded in a single erasure-unit region within the write buffer 402.

The operation of the data processing device of the fifth embodiment performed at the time of writing data will now be described, by reference to FIGS. 13 and 14. Unless otherwise specified, the write control means 111 performs the following processing operations.

In step S501, the write control means 111 receives a data write request, and the details of the data write request are the same as those of the data write request employed in the first embodiment.

In step S502, there is determined a number assigned to the erasure-unit region of the flash memory containing the write request region. The operation of the data processing device required for determining the number is the same as in the first embodiment.

In step S503, a determination is made as to whether or not the number assigned to the erasure-unit region is recorded, by reference to the erasure-unit-number hold region 202.

If the number assigned to the erasure unit is not recorded, in step S504 the write control means 111 writes write data into the erasure block buffer 103.

In step S505, the write control means 111 issues a save instruction to the save means 112. The details of the save instruction are the same as those of the save instruction employed in the first embodiment. Upon receipt of the save instruction, the save means 112 writes non-changing data into the erasure block buffer 103 as a saving processing operation.

In step S506, the erasure unit number calculated in S502 is recorded in the erasure-unit-number hold region 202.

In step S508, the write control means 111 issues an erasure instruction to the erasure instruction means 301. The details of the erasure instruction are the same as those of the erasure instruction employed in the second embodiment. Upon receipt of the erasure instruction, the erasure instruction means 301 issues, to the flash memory 101, an instruction for erasing the data from the erasure unit region whose data have already finished being saved to the erasure block buffer 103.

In a case where in step S503 the erasure unit number is determined to be recorded in the erasure-unit-number hold region 202, in step S508 a determination is made as to whether or not the erasure unit number determined in step S502 matches the erasure unit number recorded in the erasure-unit-number hold region 202.

If in step S502 no match is determined to exist between the erasure unit numbers, in step S509 a determination is made as to whether or not the data to be written into an area identical with the write request region are already present in the write buffer 402, by reference to the write buffer management region 403.

If in step S509 the data to be written into an area identical with the write request region are determined not to exist in the write buffer 402, in step S510 a determination is made, as to whether or not the erasure unit number obtained in step S502 and the data assigned the same erasure unit number are present in the buffer 402, by reference to the write buffer management region 403.

If in step S510 the data assigned the same erasure unit number are determined to be recorded in the write buffer 402, buffer data movement processing is performed, which will be described later.

If in step S510 the data assigned the same erasure unit number are determined not to be recorded in the write buffer 402, in step S511 a determination is made as to whether or not the write buffer 402 has a memory location into which write request data can be written.

If in step S511 the write buffer 402 is determined to have no available memory location, in step S512 the write control means 111 issues a write instruction to the write means 302. Upon receipt of the write instruction, the write means 302 writes into the flash memory 101 the data currently recorded in the erasure block buffer 103.

In the subsequent processes, processing pertaining to steps S504 to S507 is performed in the same manner as in the case where the erasure unit number is not recorded.

If in step S511 the write buffer 402 is determined to have an available memory location, in step S513 the write control means 111 writes write data into the write buffer 402.

In step S514, the number assigned to the erasure-unit region, the offset value for specifying a location in the erasure-unit region, and the size of write data are recorded as management data in the write buffer management region 403.

If in step S509 the data to be written into the area identical with the write request region are determined to exist in the write buffer 402, in step S516 the write control means 111 overwrites the write request data in an area where there exist the data to be written into the area identical with the write request region.

If in step S508 the erasure unit number calculated in step S502 matches the erasure unit number recorded in the erasure-unit-number hold region 202, in step S517 the write request data are written over an area within the erasure block buffer 103 where there are stored the data assigned the same erasure unit number as that assigned to the write request data.

By reference to FIG. 14, next will be described the operation of the data processing device required for moving data from a buffer when in step S510 the data assigned the same erasure unit number are determined to be recorded in the write buffer 402. Unless otherwise specified, the write control means 111 performs the following operation.

In step S521, the data currently registered in the erasure block buffer 103 are written into the flash memory 101.

In step S522, the write request data are written into the erasure block buffer 103.

In step S523, the buffer-data movement means 501 moves to the erasure block buffer 103 all the write data recorded in the same erasure unit region where the write request data are recorded, from among the data recorded in the write buffer 402. If the write request region relating to the write request data differs from the write request region relating to the write data which have already been recorded in the write buffer 402, the write request data and the all the write data recorded in the write buffer 402 are stored in the erasure block buffer 103. If a partial overlap exists between the write request region relating to the write request data and the write request region relating to the write data which have already been stored in the write buffer 402, the write request data are written, in preference to the write data, into the erasure block 103 with regard to the overlap. With regard to a non-overlapping area between the write request regions, the write request data and the write data stored in the write buffer 402 are written into the erasure block buffer 103.

In step S524, the write control means 111 issues a save instruction to the save means 112. Upon receipt of the save instruction, the save means 112 saves, from the erasure unit region of the flash memory, non-changing data which are other than the data written into the erasure block buffer 103 in step S523.

In step S525 the erasure unit number is recorded into the erasure-unit-number hold region 202, and in step S526 the write buffer management region 403 is updated in association with movement of the data from the write buffer 402 to the erasure block buffer 103.

Finally, in step S527, an erasure instruction is issued to the erasure instruction means 301. Upon receipt of the erasure instruction, the erasure instruction means 301 issues to the flash memory 101 an instruction for erasing the data of the erasure-unit region saved into the erasure block buffer 103.

The foregoing processing operations are performed every time the write request is issued.

The operation of the data processing device of the fifth embodiment performed at the time of reading data from memory is the same as in the fourth embodiment.

The data processing device of the fifth embodiment collects, into the erasure block buffer 103, the write data and the write request data recorded in the write buffer 403 contained in the single erasure unit region of the flash memory 101, thus enabling efficient use of the write buffer 402. In addition to yielding the advantage achieved in the fourth embodiment, the present embodiment yields an advantage of diminishing the number of times data are written in the flash memory 101, to thereby reduce deterioration of the flash memory 101.

In the present embodiment, a plurality of write data sets stored in the write buffer 402 may be moved instead of the write request data, or the write data recorded in the erasure unit region identical with that in which the write request data are stored. More specifically, a plurality of write data sets which are recorded in the write buffer 402 and are contained in a single erasure unit region may be moved.

In this case, in step S510 the write control means 111 determines the erasure-unit region which has the largest number of write data sets recorded in the write buffer 402, by reference to the write buffer management region 403. This determination can be made by reference to the erasure unit number stored in the write buffer management region 403.

If in step S510 the write data contained in the single erasure-unit region are determined not to exist in the write buffer 402, processing proceeds to step S511.

If in step S510 the write data contained in the single erasure-unit region are determined to exist in the write buffer 402, in step S510 the erasure-unit region which has the largest number of write data sets is determined. In step S515, the plurality of write data sets recorded in the write buffer 402 are moved to the buffer.

Processing pertaining to steps S521 and S522 is not performed at the time of moving data from the write buffer 402. All the data sets to be written into the erasure unit region—which is determined to have the largest number of write data sets in step S510—are moved to the erasure block buffer 103 from the write buffer 402. If the write request regions of the write data differ from each other, all the data sets stored in the write buffer 402 are stored in the erasure block buffer 103. If a partial overlap exists between the write request regions relating to the write request data sets, new write data are written, in preference to the write data, into the erasure block 103 with regard to the overlap. After writing of data into the erase block buffer 103 has been completed, the data are erased from the area of the write buffer 402 in which were stored the data that have been moved.

Subsequently, the write request data are written into the write buffer 402 during a period between steps S525 and S526.

In step S526, the management data are updated on the basis of the new write data, and processing pertaining to step S527 is finally performed.

As mentioned above, the write data belonging to the erasure-unit region having the largest number of write data sets are moved to the erasure block buffer 103, thus enabling more efficient utilization of the nonvolatile memory 102.

Sixth Embodiment

A data processing device according to a sixth embodiment of the present invention is identical in configuration with that of the fifth embodiment. In the write buffer management region 403, there are recorded data pertaining to the frequency of use of the write buffer 402, as well as the data shown in FIG. 9. As shown in FIG. 15, serial numbers which are incremented by one every time data are written into the write buffer 402 and specify the order in which data are written, and the number of times data are written into the write buffer region 402 are recorded as an example of data pertaining to the frequency of use of the write buffer 402.

The data processing device of the present embodiment is basically identical in operation with that described in connection with the fifth embodiment. Particularly, written data are moved on the basis of frequency of use of the write buffer 402.

Figure 16:
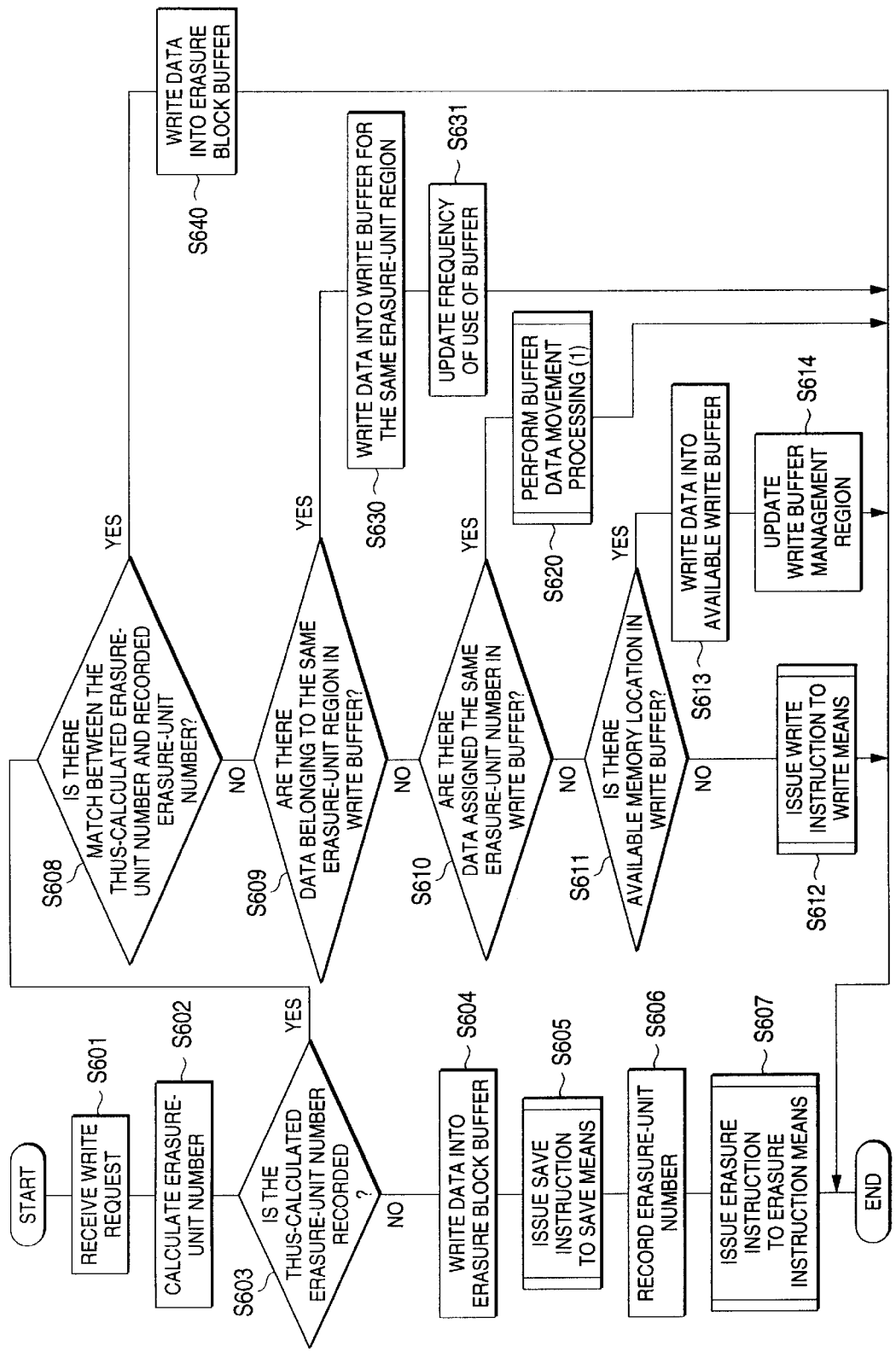
FIG. 16 is a flowchart showing the operation of a data processing device of a sixth embodiment for rewriting data stored in flash memory.
Figure 17:
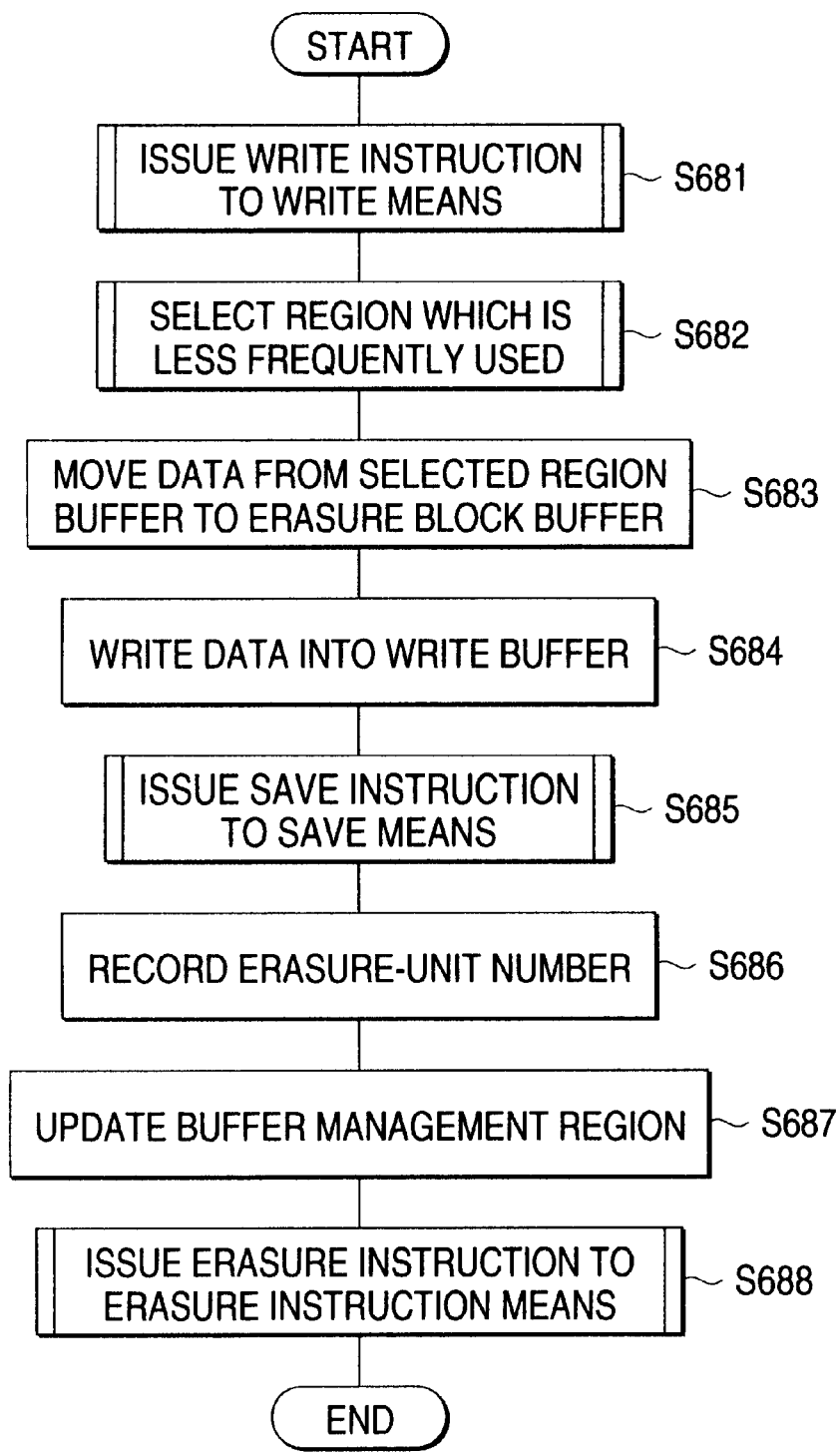
FIG. 17 is a flowchart showing the operation of the data processing device for performing buffer data movement processing pertaining to step S612.
Figure 18:
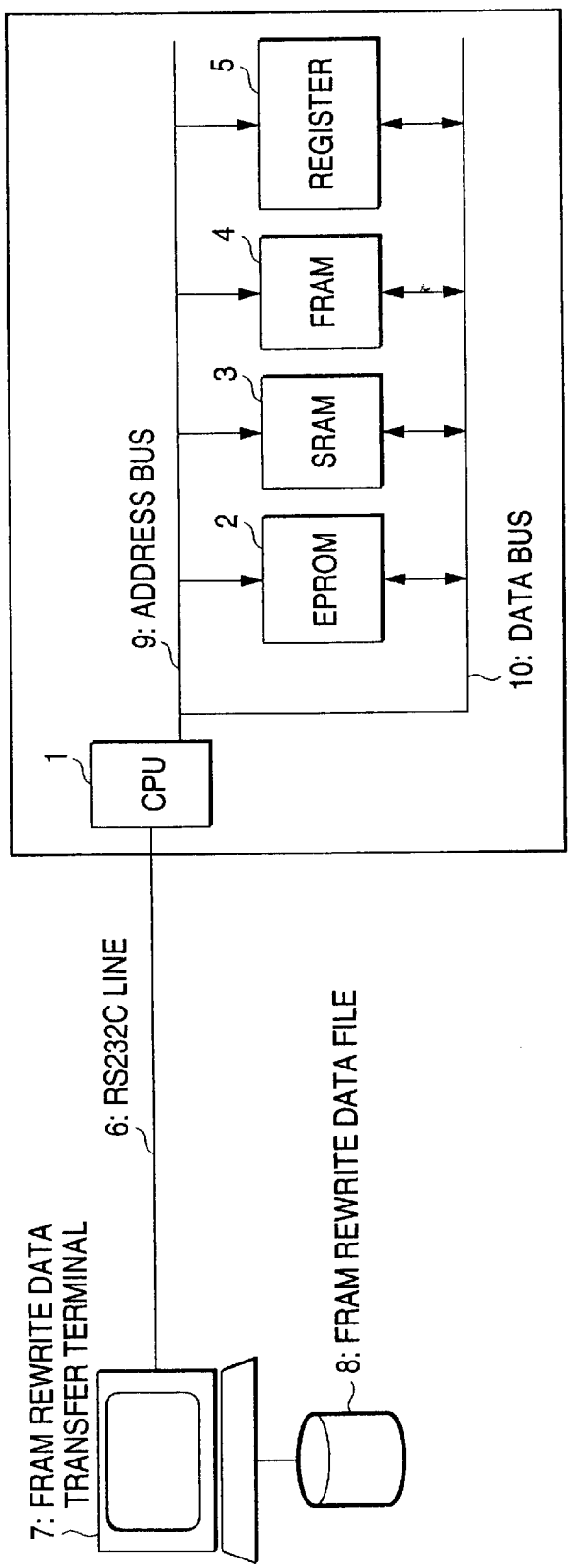
FIG. 18 is a block diagram showing the outline of circuitry of an existing data processing device.

The operation of the data processing device of the sixth embodiment performed at the time of writing of data will now be described by reference to FIGS. 16 and 17. Unless otherwise specified, the write control means 111 performs the following processing operations.

In step S601, the write control means 111 receives a data write request, and in step S602 there is obtained a number assigned to the erasure-unit region of the flash memory 101 containing the write request region. The details of the write request and the operation of the data processing device required for obtaining an erasure-unit number are the same as those described in connection with the first embodiment.

In step S603, a determination is made as to whether or not the erasure unit number is recorded, by reference to the erasure-unit-number hold region 202.

If the erasure unit number is not recorded, in step S604 the write request data are written into the erasure block buffer 103.

In step S605 a save instruction is issued to the save means 112. Upon receipt of the save instruction, the save means 112 saves into the erasure block buffer 103 the non-changing data stored in the erasure-unit region.

In step S606 the erasure unit number determined in step S602 is recorded in the erasure-unit-number hold region 202.

In step S607, an erasure instruction is issued to the erasure instruction means 301. Upon receipt of an erasure instruction, the erasure instruction means 301 issues, to the flash memory 101, an instruction for erasing in erasure units the data which have already been saved in the erasure block buffer 103. The details of the erasure instruction are the same as those of the erasure instruction employed in the first embodiment.

If in step S603 the erasure unit number is determined to be recorded, in step S608 a determination is made as to whether or not the erasure unit number obtained in step S602 matches the erasure unit number recorded in the erasure-unit-number hold region 302.

If in step S608 a determination is made that no match exists between the erasure unit numbers, in step S609 a determination is made as to whether or not the data belonging to an area identical with the write request region are recorded in the write buffer, by reference to the write buffer management region 403.

If in step S609 the data belonging to the area are determined not to be recorded, in step S610 a determination is made as to whether or not data belonging to the erasure-unit region—whose number is identical with the erasure unit number obtained in step S602 are recorded—by reference to the write buffer management region 403.

If in step S610 a determination is made that data belonging to the same erasure-unit region are recorded in the write buffer, in step S620 there is effected buffer data movement processing (1). The buffer data movement processing (1) is the same as that which is described in connection with the fifth embodiment and is shown in FIG. 14, and hence repetition of its explanation is omitted here.

If in step S610 the data belonging to the same erasure-unit region are determined not to be recorded in the write buffer 402, in step S611 the write control means 111 determines whether or not the write buffer 402 has an available memory location in which write request data can be written.

If in step S611 the write buffer 402 is determined not to have any available memory location, in step S612 there is performed buffer data movement processing (2), which will be described later.

If in step S611 the write buffer 402 is determined to have an available memory location, in step S613 the write control means 111 writes write request data into the write buffer 402.

Next, in step S614 an erasure unit number, an offset value for specifying the position of a write region in the erasure unit region, and a data size are recorded, as data representing a location on the flash memory, in a portion of the write buffer management region 403, which portion corresponds to the_buffer having the data written therein. Further, serial numbers representing a sequence in which data are written (hereinafter referred to simply as "write serial numbers") and a value of 1which is an initial value of the number of times data are written into the write buffer are recorded as data pertaining to the frequency of use of the write buffer.

If in step S609 the data belonging to an area identical with the write request region are determined to exist, in step S630 the write control means 111 writes write request data into the write buffer 402.

In step S631 the write serial numbers are recorded in the write buffer management region 403, as data pertaining to the frequency of use of a corresponding area of the write buffer region 402.

If in step S608 the erasure unit number calculated in step S602 is determined to match the erasure unit number recorded in the erasure-unit number hold means 302, in step S630 the write request data are written into the erasure block buffer 103.

The buffer data movement processing (2), which is effected when in step S611 the write buffer 402 is determined not to have any available memory location, will be described by reference to FIG. 17. Unless otherwise specified, the write control means 111 performs the following processing operations.

In step S681, the data currently stored in the erasure block buffer 103 are written into the flash memory 101.

In step S682, the write buffer management region 403 is retrieved, and the area of the write buffer 402 which is less frequently used is selected. The frequency of use of an area of the write buffer 402 is determined through use of the write serial numbers recorded in the write buffer management region 403, as well as the number of times data are written. If any area of the write buffer 402 is assigned the minimum serial number and the minimum number of times data are written, the area is selected. If no match exists between the area assigned the minimum serial number and the area assigned the minimum number of times data are written, the areas of the write buffer 402 are examined in terms of the number of times data are written, in ascending order of serial number, thereby selecting the area assigned the minimum number of times data are written.

In step S683, the data stored in the write buffer selected in step S682 are moved to the erasure block buffer 103.

In step S684, the write request data are written into the area of the write buffer 402 in which the data that have been moved to the erasure block buffer 103 had been recorded.

In step S685, the write control means 111 issues, to the save means 301, a save instruction for saving the data recorded in the erasure-unit region of the flash memory 101 containing the data that have been moved to the erasure block buffer 103. In pursuant to the save instruction, the save means 301 saves to the erasure block buffer 103 the non-changing data from the erasure-unit region of the flash memory 101.

In step S686, the number assigned to the erasure-unit region from which the data have been saved in step S685 is recorded in the erasure-unit-number hold region 202.

In step S687, the portion of the write buffer management region 403 corresponding to the area of the write buffer 402 from which the data have been moved to the erasure block buffer 103 is updated so as to correspond to the newly written data.

Finally, in step S688, an erasure instruction is issued to the erasure instruction means 301. Upon receipt of the erasure instruction, the erasure instruction means 301 issues, to the flash memory 101, an instruction for erasing in erasure units the data saved in the erasure block buffer 103.

The foregoing processing operations are executed every time a write request is issued.

The reading operation of the data processing device of the sixth embodiment is the same as that of the data processing device employed in the fourth embodiment.

As mentioned above, in the data processing device of the sixth embodiment, the data recorded in the areas of the write buffer 402, the areas being assigned low frequencies of use, are written into the flash memory 101 in preference to the data stored in the other areas of the write buffer 402, thereby enabling efficient use of the write buffer. Accordingly, in addition to yielding the advantage achieved in the fifth embodiment, the present embodiment can yield an advantage of diminishing the number of times data are written in flash memory, thus preventing deterioration of the flash memory.

Seventh Embodiment

Figure 19:
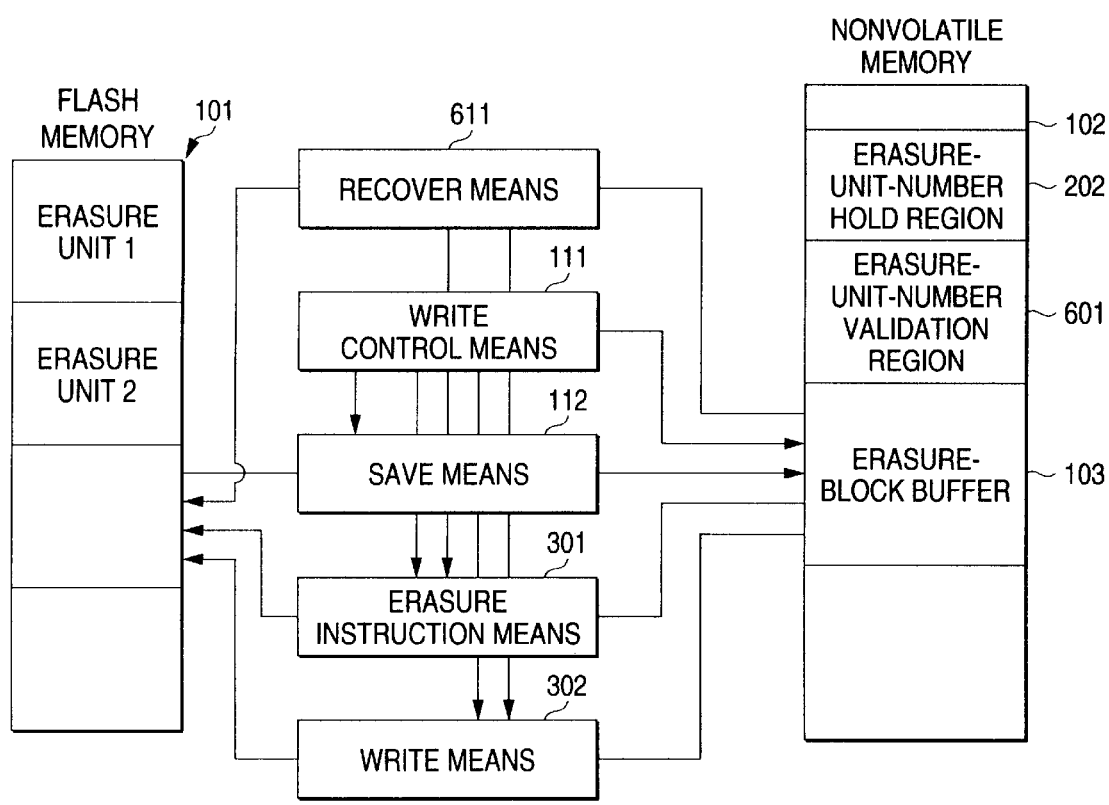
FIG. 19 is a block diagram showing the outline of a data processing device according to a seventh embodiment of the present invention.

FIG. 19 is a block diagram showing the outline of a data processing device according to a seventh embodiment of the present invention. In the drawing, reference numeral 601 designates an erasure-unit-number validation region which is provided within the nonvolatile memory 102 and records the same erasure-unit number as that stored in the erasure-unit-number region 202, and reference numeral 611 designates recovery means which is executed when the data processing device starts up. On the basis of the data stored in the erasure-unit-number region 202 and the data stored in the erasure-unit-number validation region 601, the recovery means 611 copies into the flash memory 101 the data stored in the erasure-block buffer 103. In other respects, the data processing device according to the seventh embodiment is identical in structure with or corresponds to that described in connection with FIG. 1. Hence, repeated explanation is omitted.

Figure 20:
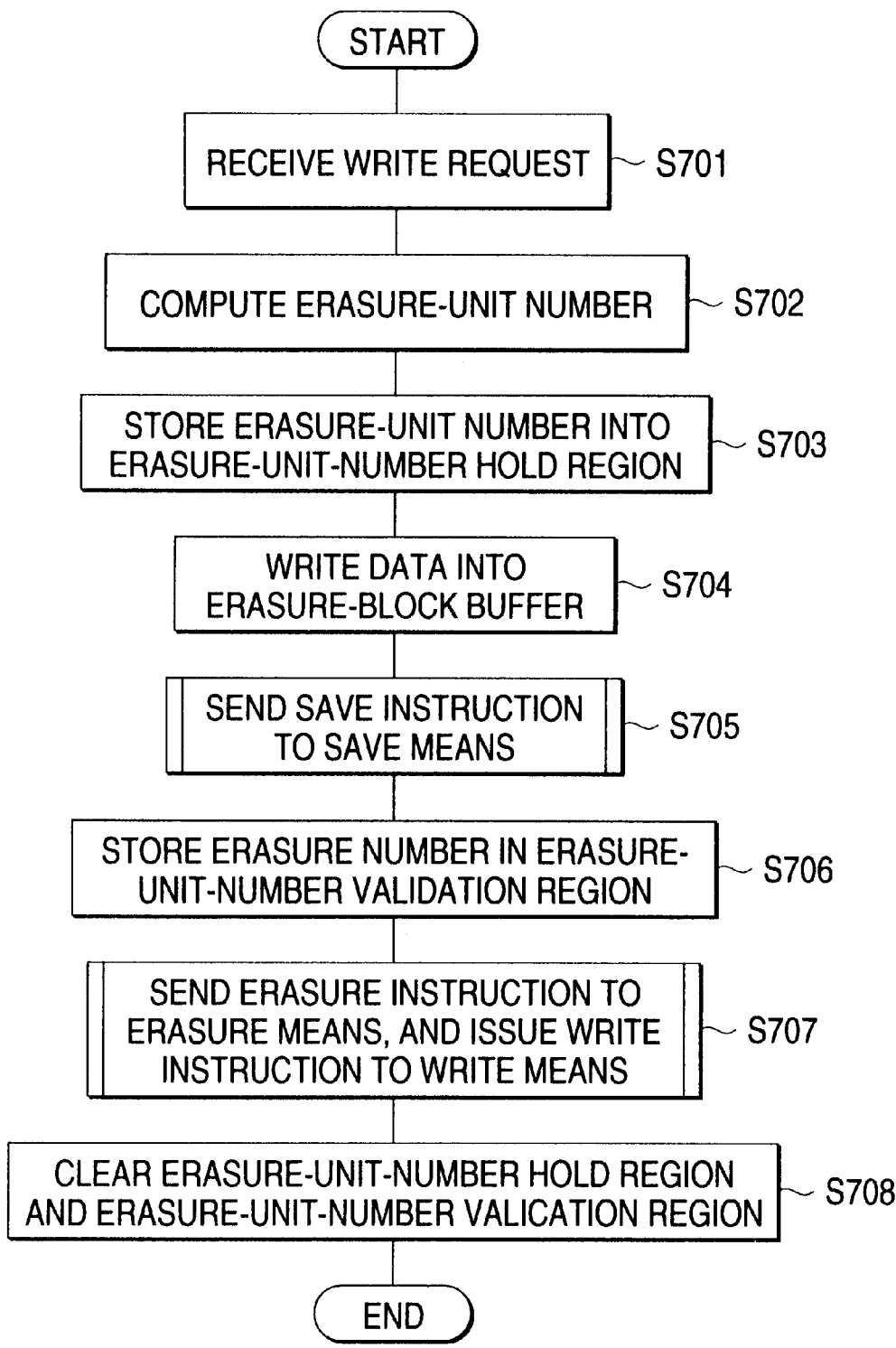
FIG. 20 is a flowchart showing the operation of the data processing device according to the seventh embodiment performed for rewriting the data stored in flash memory.

In connection with the seventh embodiment, there will next be described the operation of the data processing device performed when data are written into memory, by reference to FIG. 20. Unless otherwise specified, the write control means 111 performs the following processing operations. In FIG. 20, processing operations pertaining to steps S701, S702, S704, S705, and S707 are identical with those according employed in the first embodiment (i.e., processing operations pertaining to steps S101, S102, S103, S104, and S105 shown in FIG. 3), and repeated explanations are omitted.

The data processing device according to the seventh embodiment differs from that of the first embodiment in that processing operations pertaining to steps S703, S706, and S708 are provided. Explanation of primarily the differences will be given.

In step S701, the write control means 111 receives a write request. In step S702, the write control means 111 determines, through computation, an erasure-unit number allocated to the flash memory 101.

Subsequently, in step S703, the erasure-unit number determined in step S702 is written into the erasure-unit-number hold region 202.

In step S704, data pertaining to the write request (hereinafter referred to as "write request data") are written into the erasure-block buffer 103. In step S705, the write control means 111 issues a save instruction to the save means 112.

In step S706, the erasure-unit number determined in step S702 is written into the erasure-unit number validation region 601. In a case where the value of the erasure-unit-number hold region 202 is identical with that of the erasure-unit-number validation region 601, it is determined that writing of the write request data into the erasure block buffer 103 has been completed.

After having issued an erasure instruction to the erasure instruction means 301 in step S707, the write control means 111 issues a write instruction to the write means 302.

In step S708, the write control means 111 deletes the data from the erasure-unit-number hold region 202 and from the erasure-unit-number validation region 601. As a result, it is determined that no data remain in the erasure-block buffer 103.

The processing operations set forth are to be performed when data are written into memory.

Figure 21:
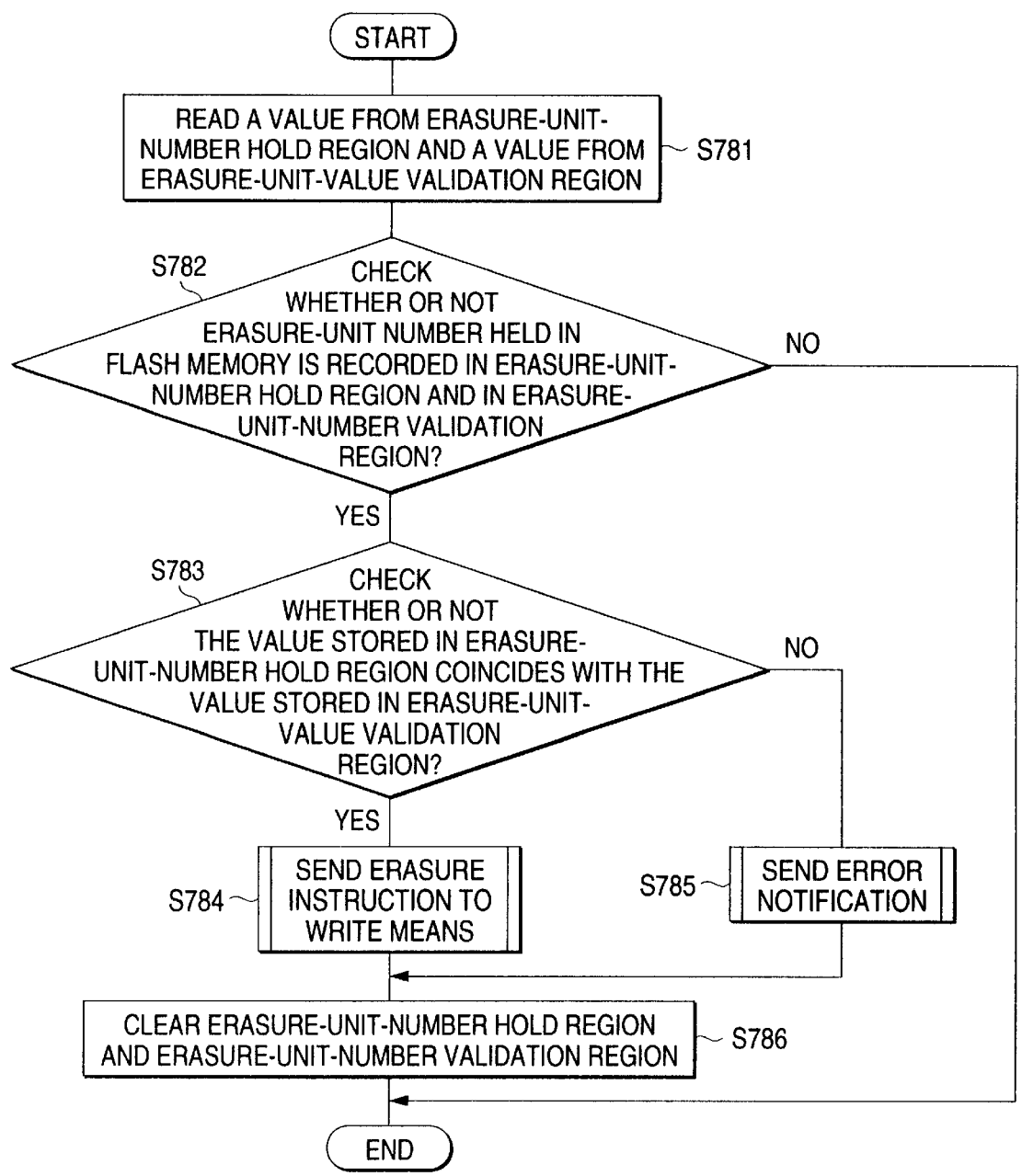
FIG. 21 is a flowchart showing the operation of recovery means 611.

The operation of the recovery means 611 performed at the startup of the data processing device will now be described by reference to FIG. 21.

In step S781, the recovery means 611 reads a value from the erasure-unit-number hold region 202 and a value from the erasure-unit-number validation region 601. In step S782, a determination is made as to whether or not any of the erasure-unit numbers stored in the flash memory 101 are present in both the erasure-unit-number hold region 202 and the erasure-unit-number validation region 601.

If either the erasure-unit-number hold region 202 or the erasure-unit-number validation region 601 lacks an erasure-unit number, the recovery means 611 determines that no data are stored in the erasure-block buffer 103, and terminates processing operations.

In contrast, in a case where in step S782 it is determined that the erasure-unit-number hold region 202 and the erasure-unit-number validation region 601 hold respective erasure-unit numbers, in step S783 the recovery means 611 determines whether or not the erasure-unit number stored in the erasure-unit-number hold region 202 is identical with that stored in the erasure-unit-number validation region 601.

If a match exists between the erasure-unit numbers, it is determined that power supply has been interrupted in the course of data being transferred from the erasure-block buffer 103 to the flash memory 101; that is, in the course of the processing pertaining to steps S706 to S708 shown in FIG. 20, and that the data processing device has been rebooted. In step S784, after having issued an erasure instruction to the erasure instruction means 301, the recovery means 611 issues a write instruction to the write means 302, to thereby transfer data from the erasure-block buffer 103 into the flash memory 101. The erasure and write instructions are the same as those issued in step S707 when data are written into the memory (FIG. 20).

In contrast, in a case where no match exists between the erasure-unit numbers, it is determined that power supply has been interrupted in the course of data being written into the erasure-block buffer 103; that is, in the course of processing pertaining to steps S702 through S705 shown in FIG. 20, and that the data processing device has been rebooted. Since the data have been incompletely stored in the erasure-block buffer 103, in step S785 the recovery means 611 sends error notification to the data processing device, wherewith the data processing device can detect interruption of power supply that has occurred during the course of processing.

After processing pertaining to step S784 or S785 has been completed, in step S786 the recovery means 611 effects clearing of the erasure-unit-number hold region 202 and clearing of the erasure-unit-number validation region 601. In a case where processing pertaining to step S786 is performed subsequent to processing pertaining to step S784, the processing pertaining to step S786 means that writing of data into the erasure-block buffer 103 has been completed. In contrast, in a case where processing pertaining to step S786 is performed subsequent to processing pertaining to step S785, an error of the erasure-block buffer 103 has been reported to the data processing device by means of error notification, and the recovery means 611 effects clearing of the erasure-unit-number hold region 202 and clearing of the erasure-unit-number validation region 601, in order to make the erasure-block buffer 103 usable again.

The processing operations set forth are to be performed by the recovery means 611.

As mentioned above, in the present embodiment, at the time of data being written into memory an erasure-unit number is written into the erasure-unit-number hold region 202 before data are written into the erasure-block buffer 103. After a save instruction has been sent to the save means 112, the erasure-unit number is stored in the erasure-unit-number validation region 601. As a result, the present invention can materialize a data processing device which can detect at the time of power restoration, interruption of power supply having arisen during the course of processing of a write request.

Further, in a case where nonvolatile memory retains data through use of a battery, even when contents of the non-volatile member become undefined as a result of a drop arising in the voltage of the battery after interruption of a power supply, the recovery means 611 checks an erasure-unit number stored in the erasure-unit-number hold region 202 and an erasure-unit number stored in the erasure-unit-number validation region 601, to thereby produce a data processing device capable of determining whether or not contents of the nonvolatile memory 102 have become unstable.

In the present embodiment, after issuance of error notification in step S785, processing pertaining to step S786 is performed. However, it is also feasible that the recovery means 611 is terminated after completion of processing pertaining to step S785, and that error notification is again issued after reboot of the data processing device. Further, although in the present embodiment a single value is to be written into the erasure-unit-number validation region 601 and into the erasure-unit-number hold region 202, there may be set a value which varies with the value stored in the erasure-unit-number hold region 202; for example, the opposite (hereinafter called a "NOT") of the value stored in the erasure-unit-number-hold region, and in step S783 the recovery means 611 may determine whether or not the value stored in the erasure-unit-number hold region 202 is equal to the NOT value of the value stored in the erasure-unit-number validation region 601.

Although it is described that the recovery means 611 performs an operation when the data processing device is rebooted, the recovery means 611 may perform an operation when the write control means 111 receives a write request.

Eighth Embodiment

Figure 22:
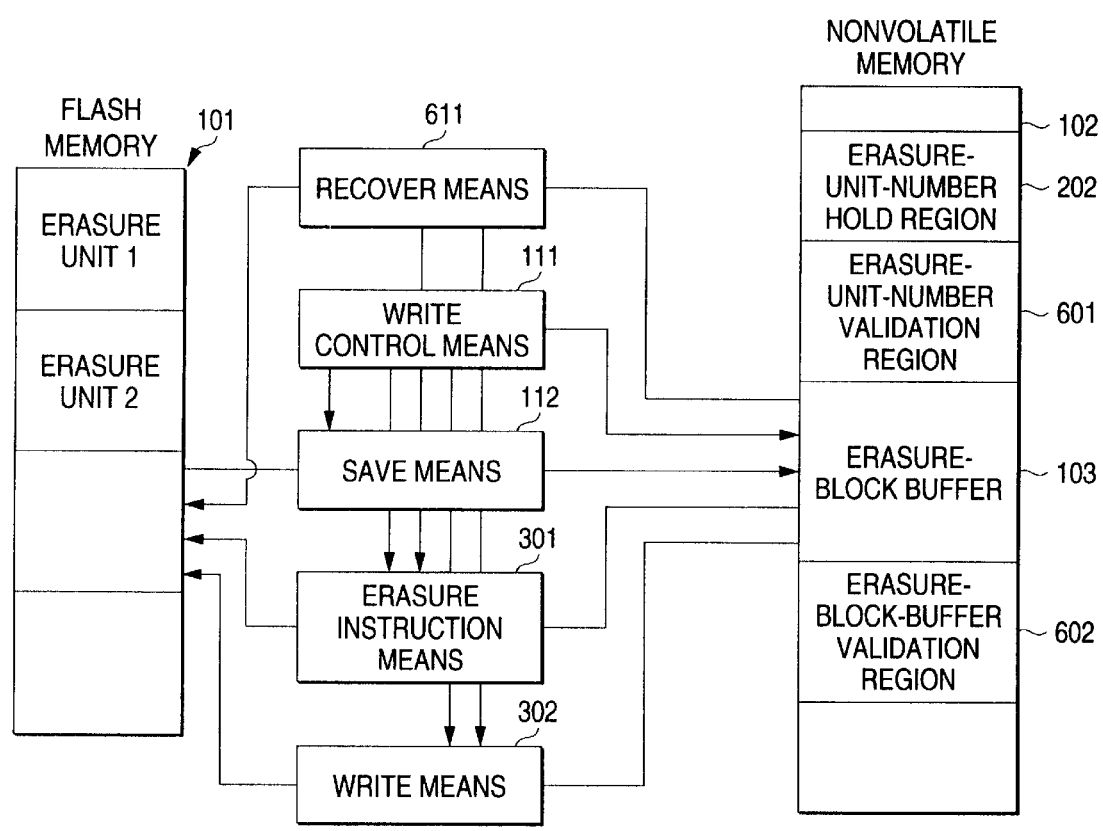
FIG. 22 is a block diagram showing the outline of a data processing device according to an eighth embodiment of the present invention.

FIG. 22 is a block diagram showing the outline of a data processing device according to an eighth embodiment of the present invention. In the drawing, reference numeral 602 designates an erasure-block-buffer validation region of the nonvolatile memory 102 for storing a check value which states that the data stored in the erasure-block buffer 103 are correct. In other respects, the data processing device according to the present embodiment is identical in configuration with or corresponds to that described by reference to FIG. 19, and hence repeated explanation is omitted here.

Figure 23:
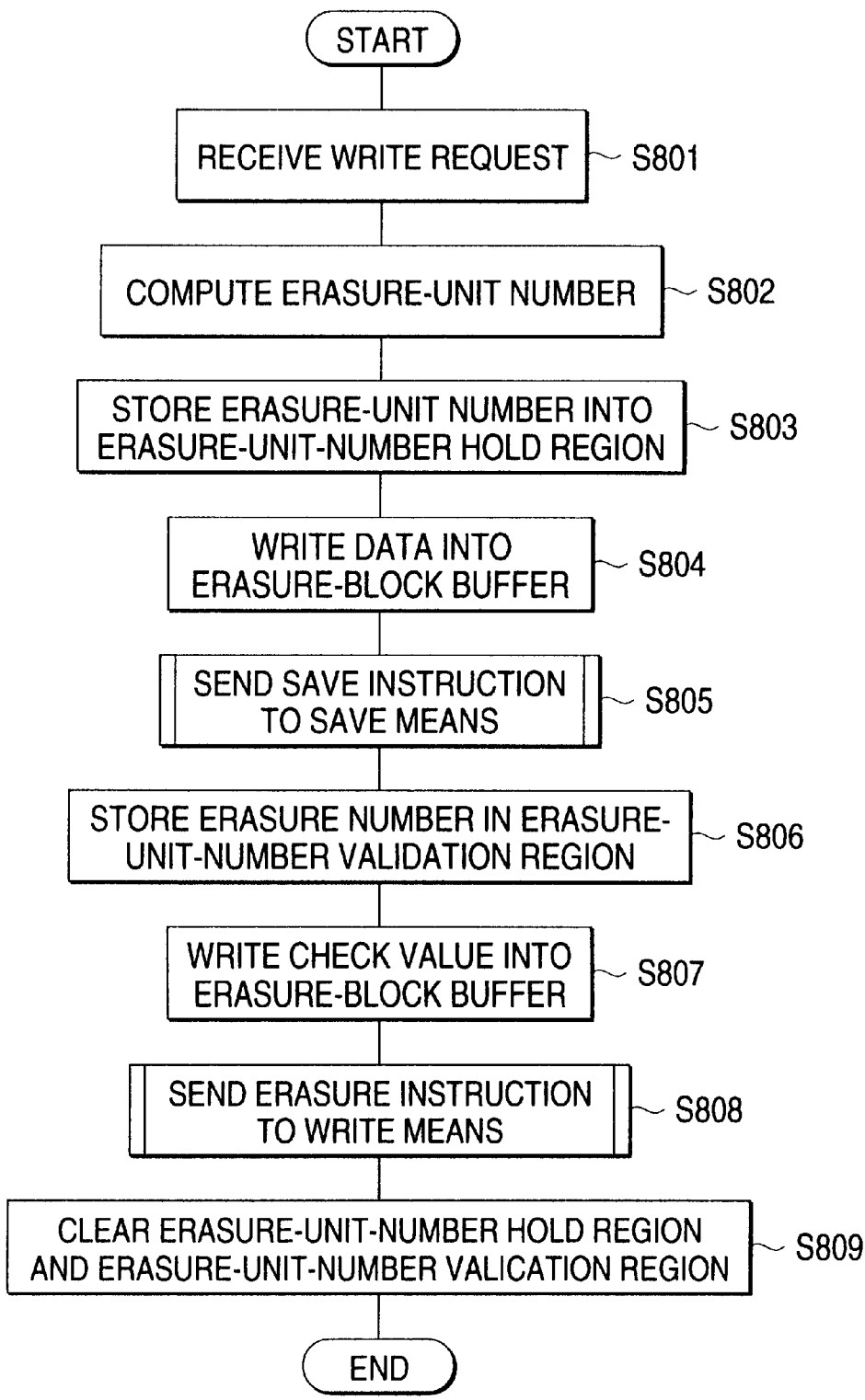
FIG. 23 is a flowchart showing the operation of the data processing device according to the eighth embodiment performed for rewriting the data stored in flash memory.

In connection with the eighth embodiment, there will next be described the operation of the data processing device performed when data are written into memory, by reference to FIG. 23. Unless otherwise specified, the write control means 111 performs the following processing operations. In FIG. 23, processing pertaining to steps S801 through S806 and S808 and S809 is identical with that employed in the seventh embodiment (i.e., processing pertaining to steps S701 through S706 and S707 and S708 shown in FIG. 20), and hence repeated explanation is omitted.

The processing employed in the eighth embodiment differs from that employed in the seventh embodiment in including processing pertaining to S807. Explanation of primarily the difference will now be given.

After completion of processing pertaining to steps S801 through S806, in step S807 a value to be used for checking whether or not the data stored in the erasure-block buffer 103 are effective is written into the erasure-block-buffer validation region 602. This value is to be used for checking whether or not the data written in the erasure-block buffer 103 are correct. A checksum value, which is the sum of all data sets stored in the erasure-block buffer 103, is used as the value.

Processing pertaining to steps S808 and S809 is performed after processing pertaining to step S807.

The foregoing processing operations are to be performed when data are written into memory.

Figure 24:
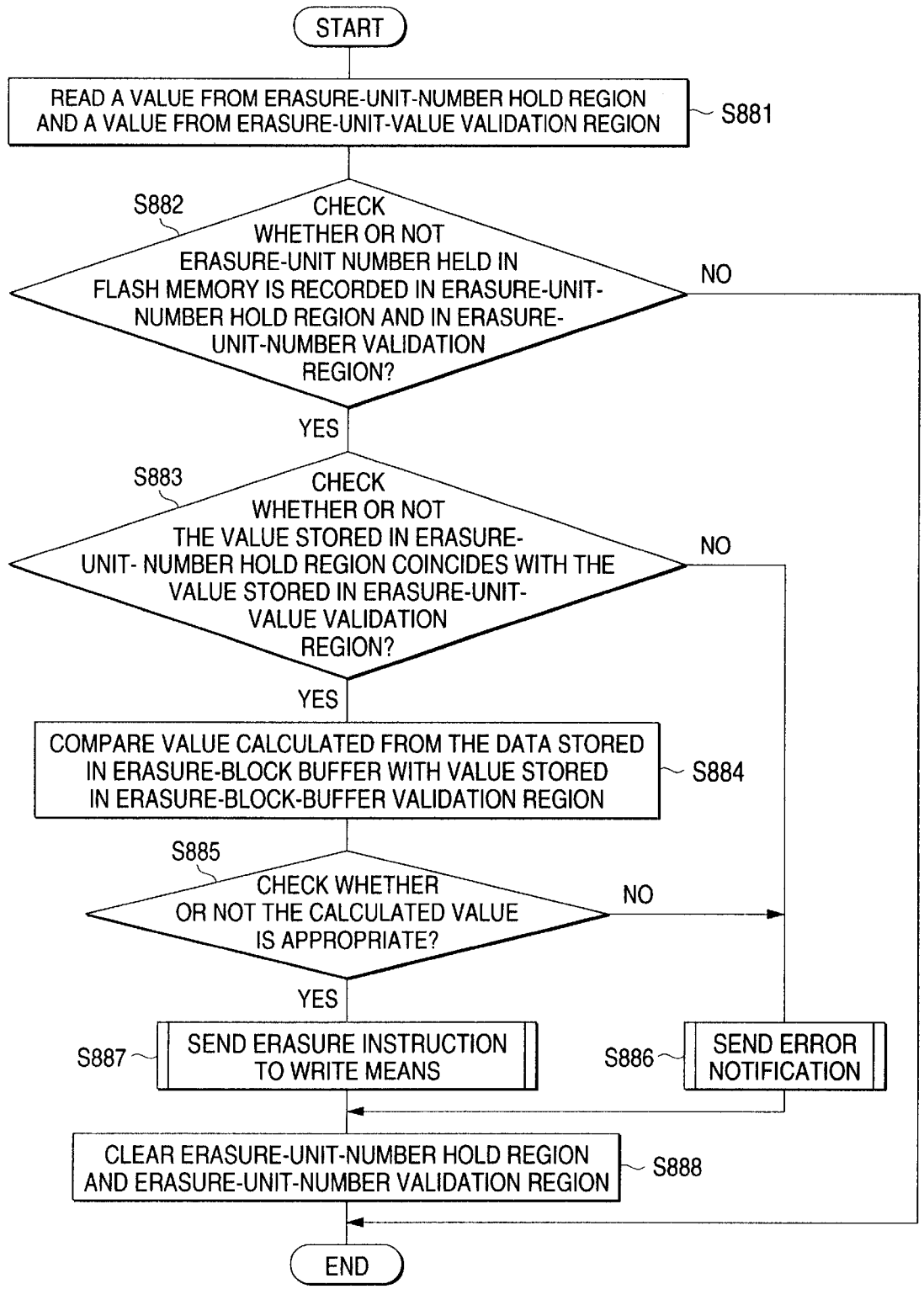
FIG. 24 is a flowchart showing the operation of recovery means 611.

Next will be described the operation of the recovery means 611 performed when the data processing device is started up, by reference to FIG. 24. In FIG. 24, processing pertaining to steps S881 through S883 and S886 through S888 is identical with that employed in the seventh embodiment (i.e., processing pertaining to steps S781 through S783 and S784 through S786 shown in FIG. 21), and hence repeated explanation is omitted.

The processing employed in the eighth embodiment differs from that employed in the seventh embodiment in including processing pertaining to steps S884 and S885. Explanation of primarily the difference will now be given.

Processing pertaining to steps S881 through S883 is performed. If in step S883 a match is found to exist between the value stored in the erasure-unit-number hold region 202 and the value stored in the erasure-unit-number validation region 601, processing proceeds to step S884.

In step S884, the data stored in the erasure-block buffer 103 are checked and are compared with the value stored in the erasure-block buffer validation region 602. More specifically, there is performed comparison between the value stored in the erasure-block buffer validation region 602 and a value obtained through computation of the data stored in the erasure-block buffer 103 in accordance with the same rule as that employed in processing pertaining to step S807 shown in FIG. 23. The data and the value usually become identical. However, the data and the value do not coincide with each other in a case where data are written into the erasure-block buffer 103 through operation of means other than that of the present invention or in the event of improper operation of the nonvolatile memory 102.

If in step S885 it is determined that the value is not appropriate, processing proceeds to step S886, where error notification is sent to the data processing device. In step S889, the data stored in the erasure-unit-number hold region 202 and the data stored in the erasure-unit-number validation region 601 are cleared. As a result, the erasure-block buffer 103 is made available.

If in step S885 it is determined that the value is appropriate, processing pertaining to steps S887 and S888 is performed.

The processing operations set forth are operations of the recovery means 611.

As mentioned above, in the present embodiment, the data processing device is equipped with the erasure-block-buffer validation region for storing the value stating that the data stored in the erasure-block buffer 103 are correct. As a result, even if failure arises in the nonvolatile memory 102 holding the erasure-block buffer 103, to thereby make the data stored in the erasure-block buffer 103 falsified, the data processing device can detect that the data stored in the erasure-block buffer 103 have become falsified.

Further, even if data are written into the erasure-block buffer 103 from another measure without authorization, the data processing device can detect the unauthorized writing of data.

Ninth Embodiment

Figure 25:
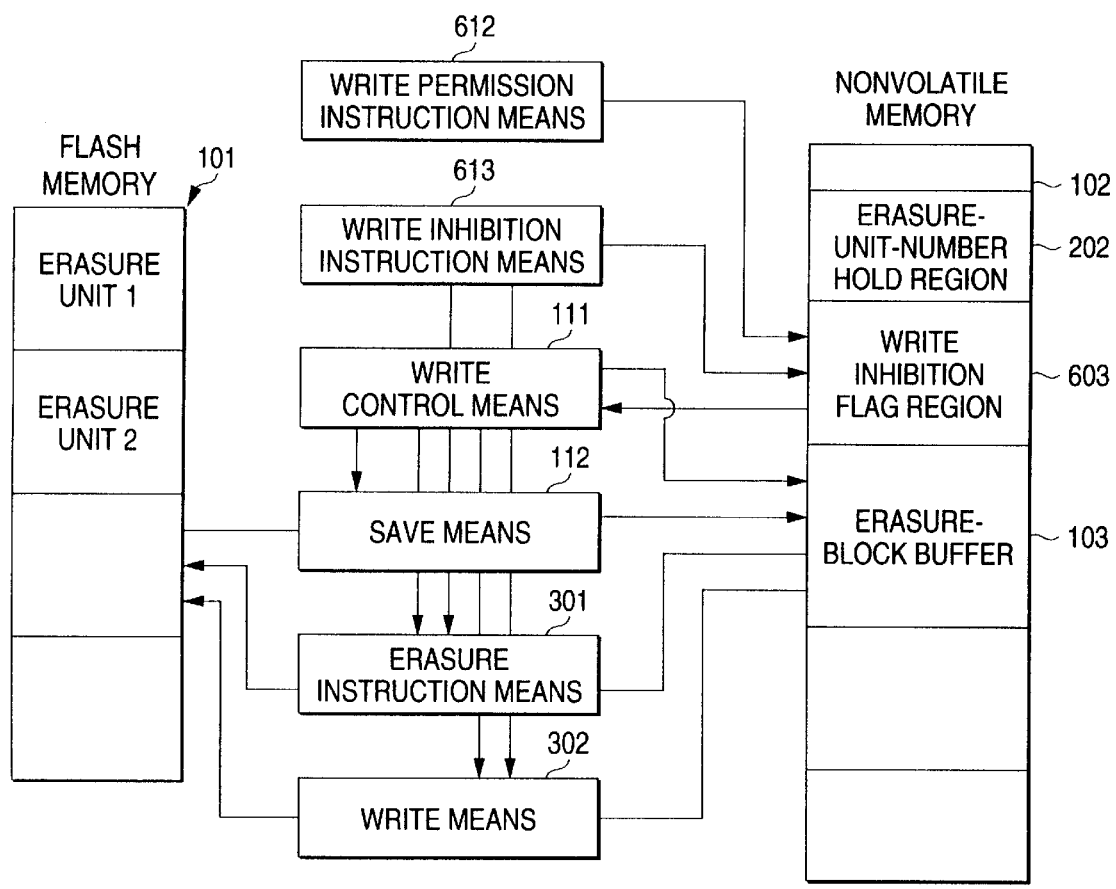
FIG. 25 is a block diagram showing the outline of a data processing device according to a ninth embodiment of the present invention.

FIG. 25 is a block diagram showing the outline of a data processing device according to a ninth embodiment of the present invention. In the drawing, reference numeral 603 designates a write inhibition flag region provided in the nonvolatile memory 102 for storing, into the erasure-block buffer 103, a value stating whether writing of data and the flash memory 101 is inhibited or enabled. Reference numeral 612 designates write permission instruction means to be used for writing into the write inhibition flag region 603 a value stating that writing is permitted. Reference numeral 613 designates write inhibition instruction means for writing into the write inhibition flag region 603 a value stating that writing is inhibited. In other respects, the data processing device according to the present embodiment is identical in structure with or corresponds to that described by reference to FIG. 4, and hence repeated explanation is omitted here.

Figure 5:
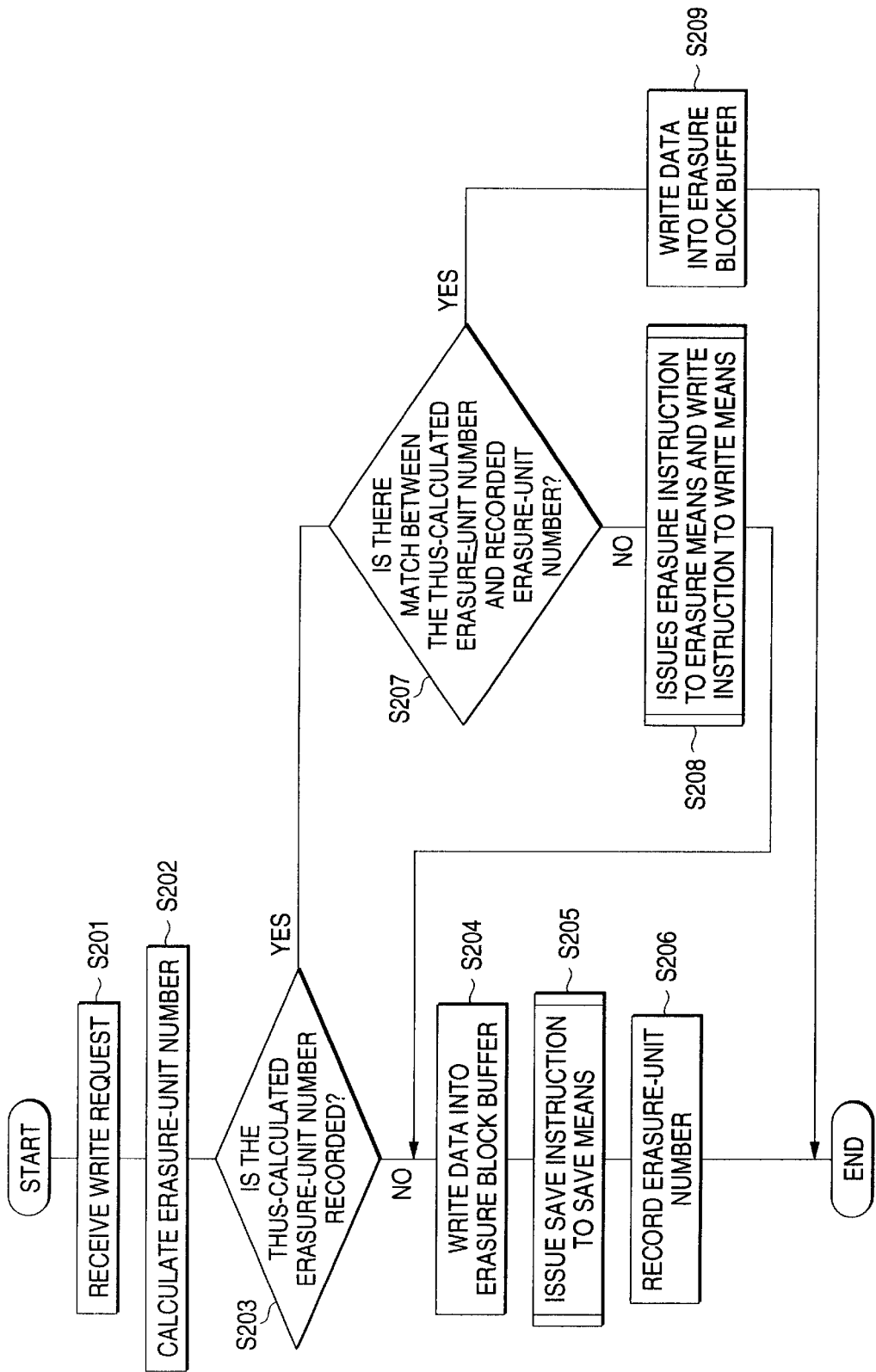
FIG. 5 is a flowchart showing the operation of the data processing device of the second embodiment for rewriting data stored in flash memory.
Figure 26:
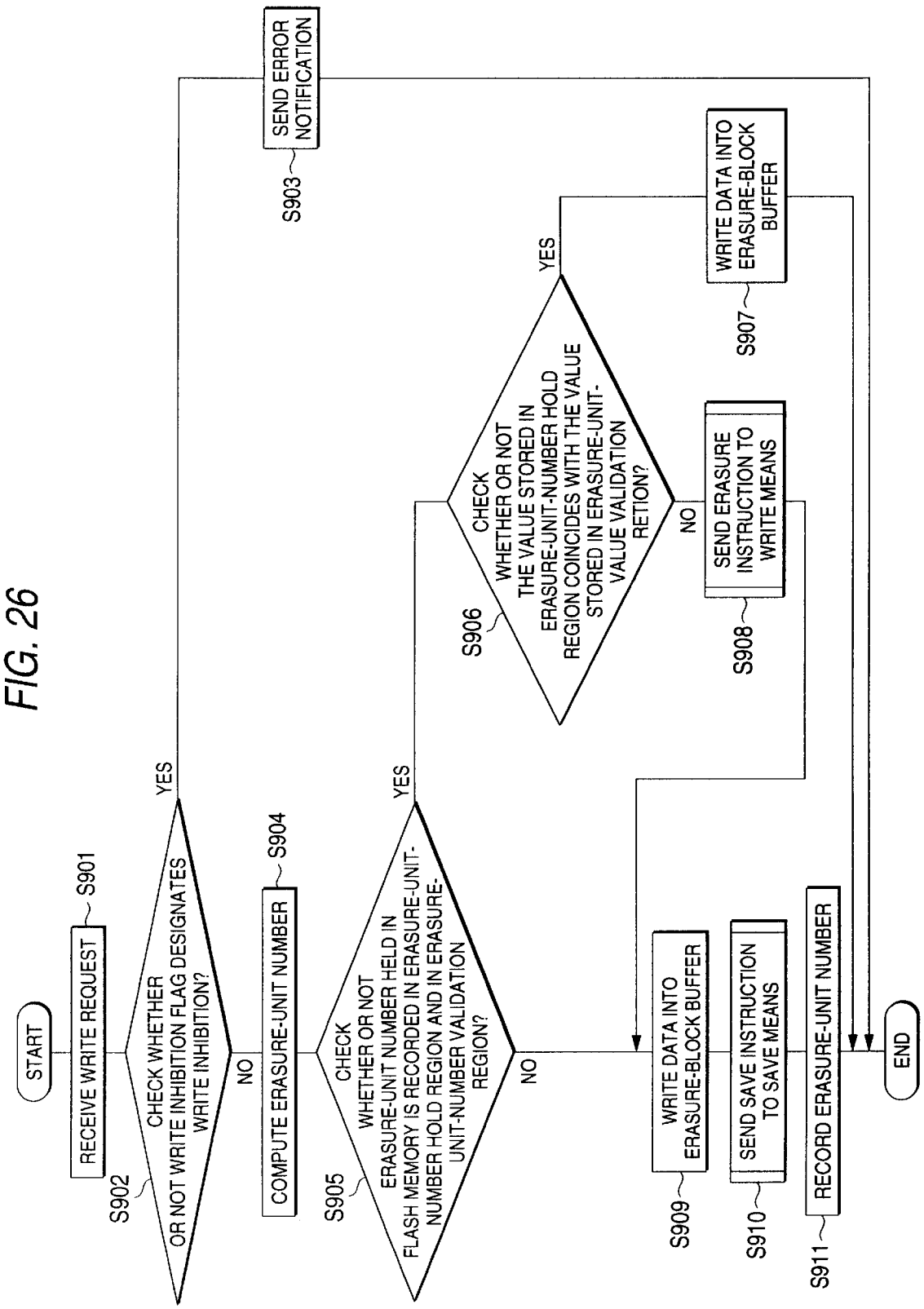
FIG. 26 is a flowchart showing the operation of the data processing device according to the ninth embodiment performed for rewriting the data stored in flash memory.

In connection with the present embodiment, there will next be described the operation of the data processing device performed when data are written into memory, by reference to FIG. 26. Unless otherwise specified, the write control means 111 performs the following processing operations. In FIG. 26, processing operations pertaining to steps S901, and S904 through S911 are identical with those according employed in the second embodiment (i.e., processing operations pertaining to steps S201, and S202 through S209 shown in FIG. 5), and repeated explanations are omitted here.

The data processing device according to the seventh embodiment differs from that of the first embodiment in that processing operations pertaining to steps S902 and S903 are provided. Explanation of primarily the difference will be given.

After having received a data write request in step S901, the write control means 111 checks the write inhibition flag region 603 in step S902, to thereby determine whether or not the value written in the write inhibition flag region 603 designates write inhibition. If the value states write inhibition, processing proceeds to step S903, where error notification is sent to the data processing device, to thereby terminate processing. So long as write inhibition is specified, data are not written into the erasure-block buffer 103 or the flash memory 101.

In contrast, if in step S902 it is determined that the value stored in the write inhibit flag region 603 does not signify write permission, processing proceeds to step S904. Processing operations that follow processing pertaining to step S904 are the same as those employed in the second embodiment.

The processing operations set forth are to be performed when data are written into memory.

Figure 27:
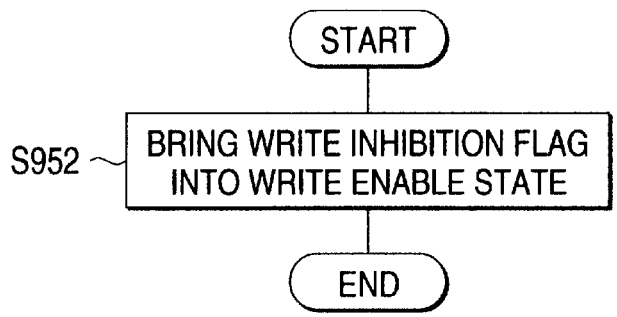
FIG. 27 is a flowchart showing the operation of write permission instruction means 612.

Next, the operation of the write permission instruction means 612 will be described by reference to FIG. 27.

Upon receipt of a write permission instruction, in step S952 the write permission instruction means 612 writes, into the write inhibition flag region 603, a value stating write permission, thereby terminating processing. As a result, data can be written into memory in subsequent steps.

The foregoing processing operations are to be performed by the write permission instruction means 612.

Figure 28:
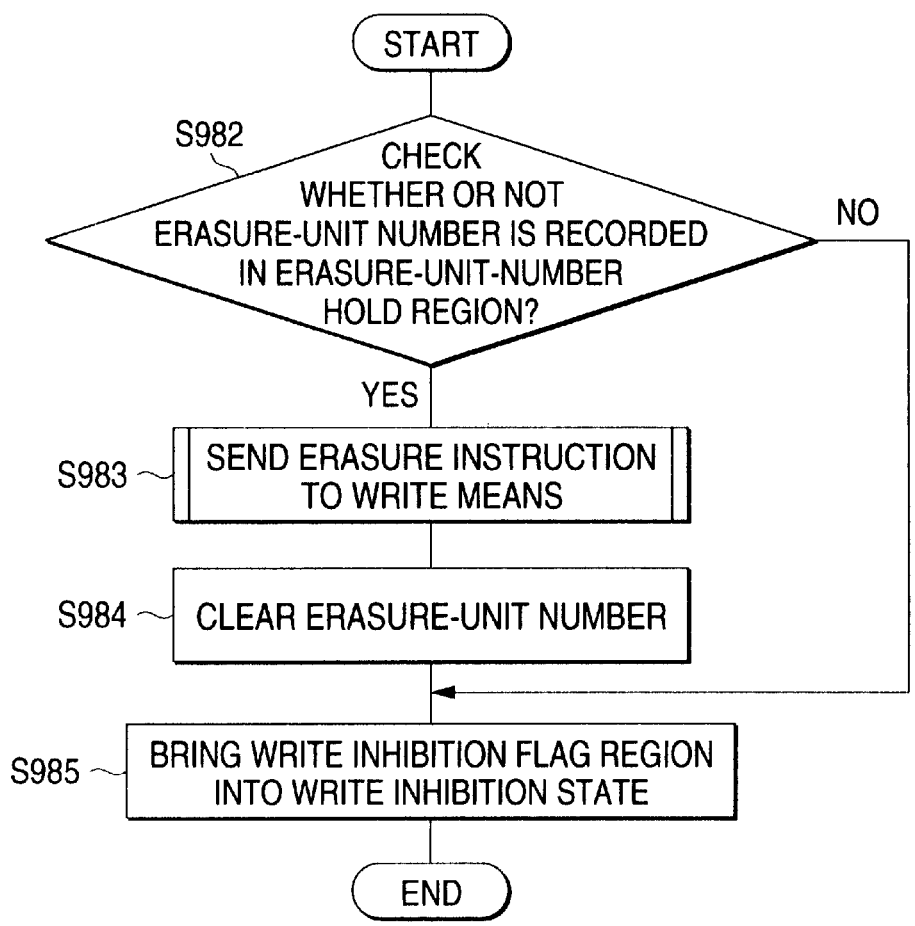
FIG. 28 is a flowchart showing the operation of write inhibition instruction means 613.

Next, the operation of the write inhibition instruction means 613 will be described by reference to FIG. 28.

In step S982, a determination is made as to whether or not an erasure-unit number is recorded in the erasure-unitnumber hold region 202. If it is determined that no erasure-unit number is recorded in the erasure-unit-number hold region 202, processing proceeds to step S985.

In S982, in a case where an erasure-unit number is recorded in the erasure-unit-number hold region 202, data still remain in the erasure-bloc buffer 103, and the data are transferred to the flash memory 101. First, after an erasure instruction has been issued to the erasure instruction means 301 in step S983, a write instruction is issued to the write means 302, and the data stored in the erasure-block buffer 103 are written into the flash memory 101. The erasure and write instructions are identical with those employed in the operation for writing data in the seventh embodiment (see FIG. 23). Subsequently, in step S984 the erasure-unit-number hold region 202 is cleared, thereby showing that no data are present in the erasure-block buffer 103.

As mentioned above, in step S985 a value stating write inhibition is written into the write inhibition flag region 603. As a result, writing of data can be inhibited in a subsequent step of writing data into memory.

The foregoing operations are to be performed by the write inhibition instruction means 613.

As mentioned above, in the present embodiment, the data processing device is equipped with the write inhibition flag region, and the write permission instruction means sets, into the write inhibition flag region, a value stating write permission. Write inhibition means sets a value stating write inhibition, and write control means performs a writing operation only when the value stored in the write inhibition region states write permission. Accordingly, the present invention can provide a data processing device which inhibits writing of data.

Further, in the case of a write inhibition instruction, the data stored in the erasure-block buffer 103 are written into the flash memory 101. In a write disable state, no data remain in the nonvolatile memory 102. Therefore, in a case where data are retained in nonvolatile memory through use of a battery, the data stored in the nonvolatile memory can be protected in the event of a drop arising in the voltage of the battery after interruption of a power supply.

Tenth Embodiment

Figure 29:
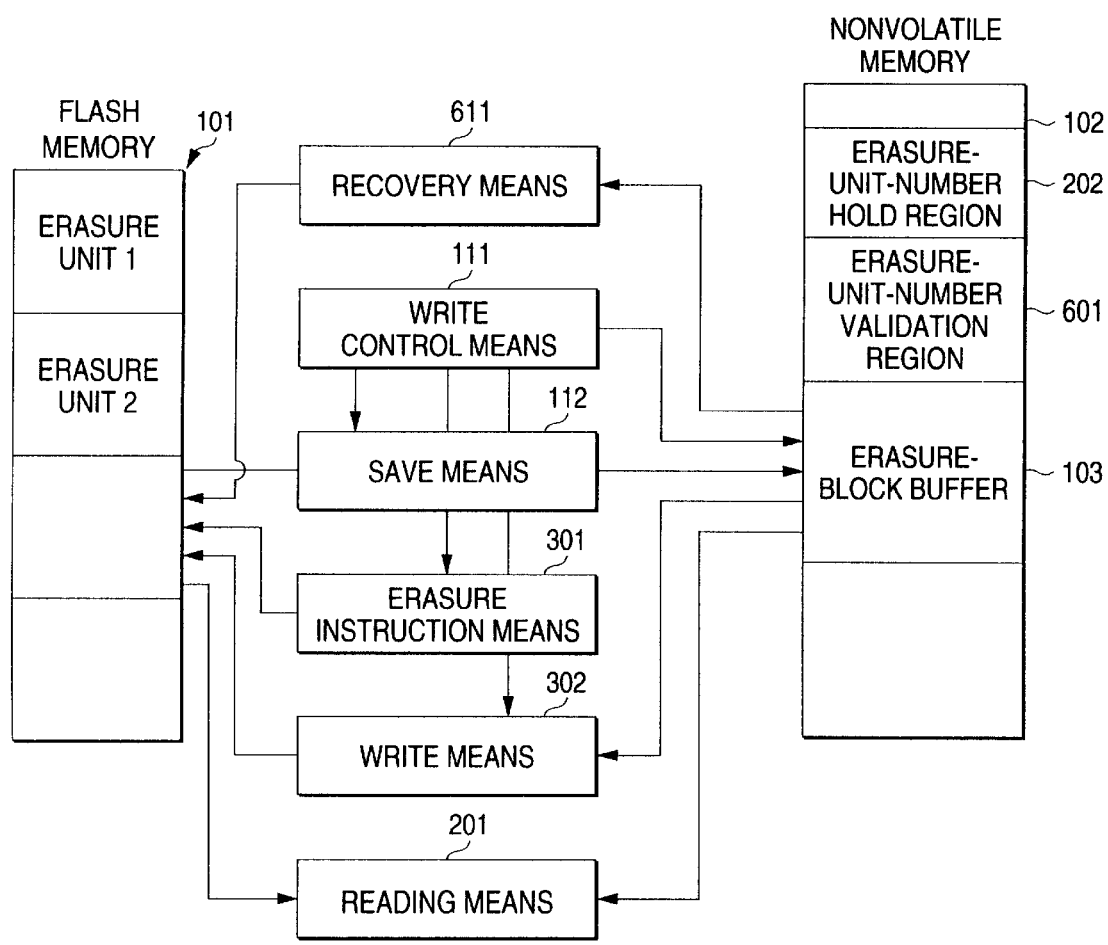
FIG. 29 is a block diagram showing the outline of a data processing device according to a tenth embodiment of the present invention.

FIG. 29 is a block diagram showing the outline of a data processing device according to a tenth embodiment of the present invention. In the drawing, reference numeral 601 designates an erasure-unit-number hold region which is provided within the nonvolatile memory 102 and records the same value as that stored in the erasure-unit-number hold region 202; and 611 designates recovery means which is executed when the data processing device starts up. On the basis of the data stored in the erasure-unit-number region 202 and the data stored in the erasure-unit-number validation region 601, the recovery means 611 copies into the flash memory 101 the data stored in the erasure-block buffer 103. In other respects, the data processing device according to the tenth embodiment is identical in structure with or corresponds to that described in connection with FIG. 4. Hence, repeated explanation is omitted.

Figure 30:
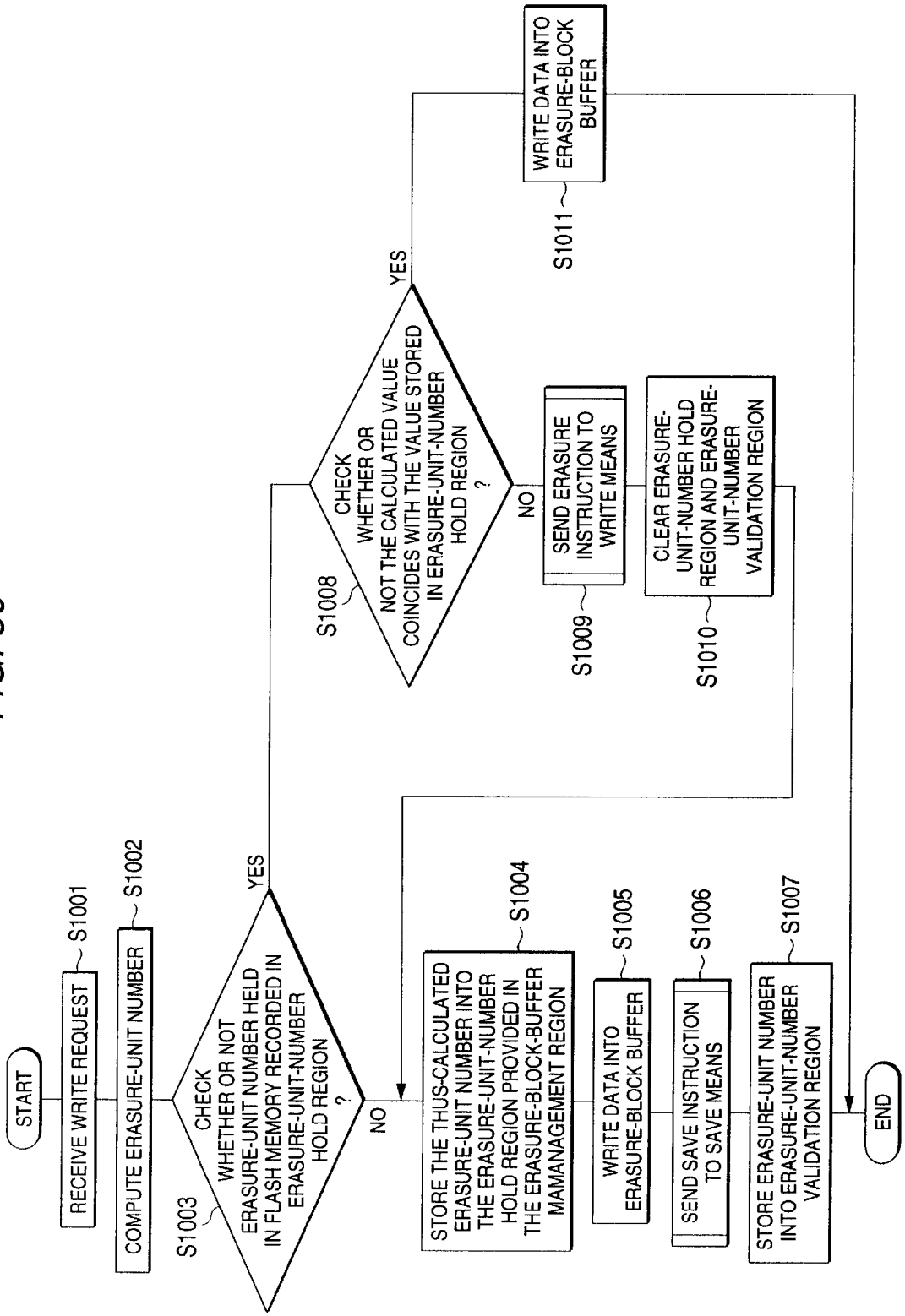
FIG. 30 is a flowchart showing the operation of the data processing device according to the tenth embodiment performed for rewriting the data stored in flash memory.

In connection with the tenth embodiment, there will next be described the operation of the data processing device performed when data are written into memory according to the seventh embodiment, by reference to FIG. 30. Unless otherwise specified, the write control means 111 performs the following processing operations. In FIG. 30, processing operations pertaining to steps S1001 through S1003, S1005, S1006, S1008, S1009, and S1011 are identical with those employed in the second embodiment (i.e., processing operations pertaining to steps S201 through S203, S204, S205, S207, S208, and S209 shown in FIG. 5), and their explanations are omitted here.

The data processing device according to the present embodiment differs from that of the second embodiment in that processing operations pertaining to steps S1004, S1007, and S1010 are provided. Explanation of primarily the differences will be given.

In step S1001, the write control means 111 receives a write request. In step S1002, the write control means 111 determines an erasure-unit number allocated to the flash memory 101, through computation. Subsequently, in step S1003, a determination is made as to whether or not the erasure-unit number is recorded in the erasure-unit-number hold region 202 by reference by the erasure-unit-number hold region 202.

If it is determined that no erasure-unit number is recorded in the erasure-unit-number-hold region 202, in step S1004 an erasure-unit number desired in S1002 is written into the erasure-unit-number hold region 202. Subsequently, in step S1005 data are written into the erasure-block buffer 103. In step S1006, a save instruction is issued to the save means 112. The save means 112 transfers to the erasure-block buffer 103 non-changing data from the erasure-unit region on the flash memory 101, the erasure-unit region being addressed by the number obtained in step S1002.

In step S1007, the erasure-unit number determined in step S1002 is written into the erasure-unit-number validation region 601. In a case where the value of the erasure-unit-number hold region 202 is identical with that of the erasure-unit-number validation region 601, it is determined that writing of the write request data into the erasure block buffer 103 has been completed. After completion of processing pertaining to step S1007, the write control means 111 terminates an operation for writing data into memory without involvement of writing data into the flash memory 101.

In a case where in step S1003 an erasure-unit number is recorded in the erasure-unit-number hold region 202, in steps S1008 and S1009 the data stored in the erasure-block buffer 103 are written into the flash memory 101. In step S1010, clearing of the data stored in the erasure-unit-number hold region 202 and clearing of the erasure-unit-number validation region 601 are effected. More specifically, the cleared state of the erasure-unit-number hold region 202 and the cleared state of the erasure-unit-number validation region 601 show that no data remain in the erasure-block buffer 103.

Subsequently, the write control means 111 performs processing pertaining to steps S1004 through S1007, as in a case where no erasure-unit number is recorded in the erasure unit-number hold region 202, to thereby effect setting of an erasure-unit number into the erasure-unit-number hold region 202, writing of data into the erasure-block buffer 103, saving of data from the flash memory 101, and setting of the erasure-unit number into the erasure-unit-number validation region 601.

If in step S1008 it is determined that a match exists between the erasure-unit number obtained in step S1002 and the value stored in the erasure-unit-number hold region 202, in step S1011 the write request data are written into the erasure-block buffer 103.

The above-described processing operations are to be performed when data are written into memory.

Figure 31:
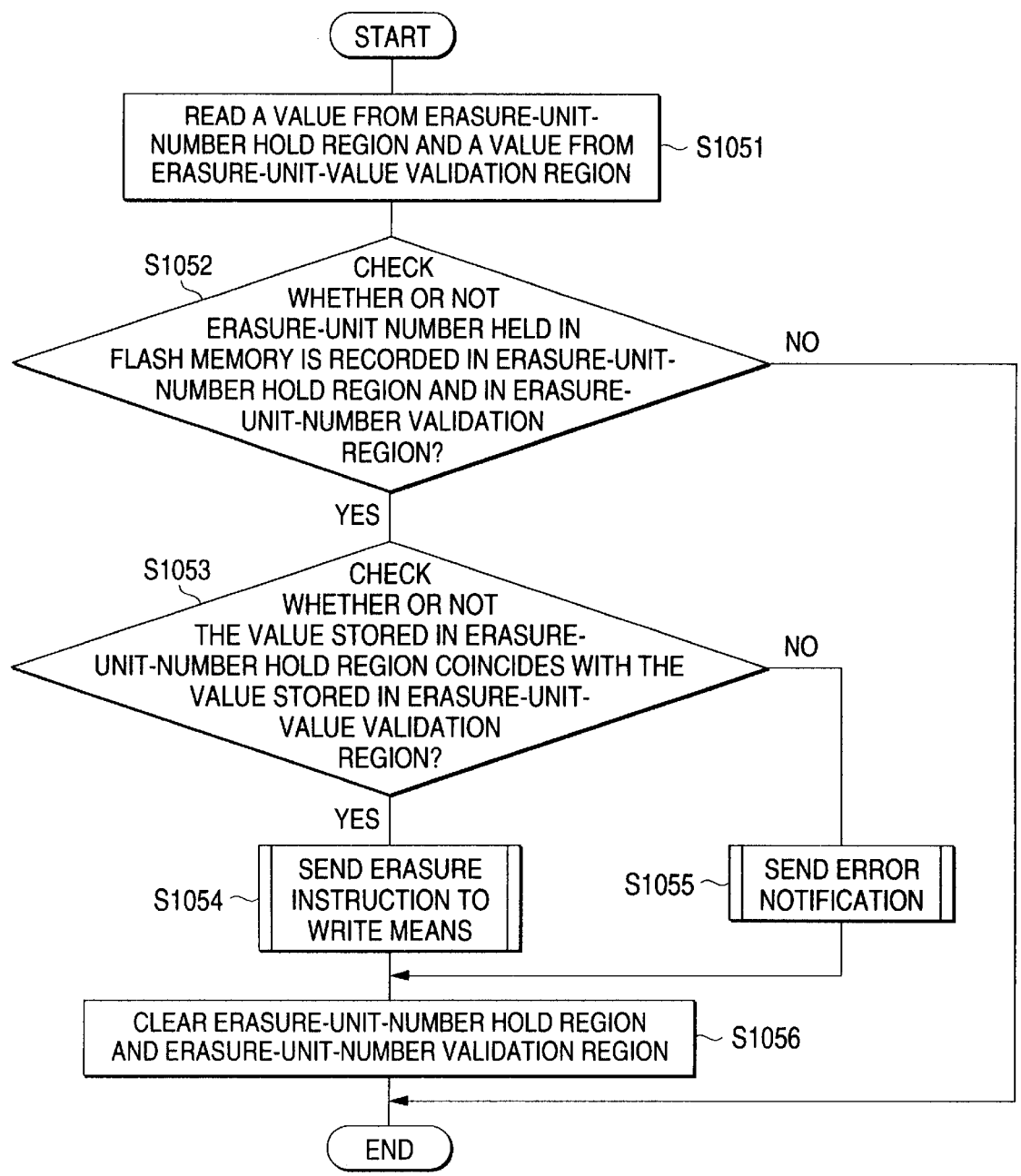
FIG. 31 is a flowchart showing the operation of recovery means 611.

Next will be described the operation of the recovery means 611 to be performed at the time of startup of the data processing device, by reference to FIG. 31.

In step S1051, the recovery means 611 reads a value from the erasure-unit-number hold region 202 and a value from the erasure-unit-number validation region 601. In step S1052, a determination is made as to whether or not any of the erasure-unit numbers stored in the flash memory 101 is present in both the erasure-unit-number hold region 202 and in the erasure-unit-number validation region 601.

If either the erasure-unit-number hold region 202 or the erasure-unit-number validation region 601 lacks an erasure-unit number, the recovery means 611 determines that no data are stored in the erasure-block buffer 103, and terminates processing operations.

In contrast, in a case where in step S1052 it is determined that the erasure-unit-number hold region 202 and the erasure-unit-number validation region 601 hold respective erasure-unit numbers, in step S1053 the recovery means 611 determines whether or not the erasure-unit number stored in the erasure-unit-number hold region 202 is identical with that stored in the erasure-unit-number validation region 601.

If a match exists between the erasure-unit numbers, it is determined that data still remain in the erasure-block buffer 103. In step S1054, after having issued an erasure instruction to the erasure instruction means 301, the recovery means 611 issues a write instruction to the write means 302, to thereby transfer data from the erasure-block buffer 103 into the flash memory 101. The erasure and write instructions are the same as those issued in step S808 in the seventh embodiment when data are written into the memory (FIG. 23).

In contrast, in a case where no match exists between the erasure-unit numbers, it is determined that incomplete data are recorded in the erasure-block buffer 103; that is, power supply has been interrupted in the course of processing pertaining to steps S1005 through S1007 shown in FIG. 30 and the data processing device has been rebooted, wherewith data are written into the erasure-block buffer 103 incompletely. In step S1055, the recovery means 611 sends an error notification to the data processing device, wherewith the data processing device can detect interruption of power supply that has occurred during the course of writing data.

After processing pertaining to step S1054 or S1055 has been completed, in step S1056 the recovery means 611 effects clearing of the erasure-unit-number hold region 202 and clearing of the erasure-unit-number validation region 601. In a case where processing pertaining to step S1056 is subsequent to processing pertaining to step S1054, the processing pertaining to step S1056 means that writing of data into the erasure-block buffer 103 has been completed. In contrast, in a case where processing pertaining to step S1056 is subsequent to processing pertaining to step S1055, an error of the erasure-block buffer 103 has been reported to the data processing device by means of error notification, and the recovery means 611 effects clearing of the erasure-unit-number hold region 202 and clearing of the erasure-unit-number validation region 601, in order to make the erasure-block buffer 103 usable again.

The processing operations set forth are to be performed by the recovery means 611.

As mentioned above in the present embodiment, at the time of data being written into memory an erasure-unit number is written into the erasure-unit-number hold region 202 before data are written into the erasure-block buffer 103. After a save instruction has been sent to the save means 112, the erasure-unit number is stored in the erasure-unit-number validation region 601. As a result, the present invention can materialize a data processing device which can detect at the time of power restoration, interruption of power supply having arisen during the course of processing of a write request.

Further, the data stored in the erasure-block buffer 103 are copied to the flash memory 101 at the time of restoration, and all the data remain in the flash memory 101 unless data are written into the flash memory 101 after restoration. In a case where battery-powered nonvolatile memory is used as the erasure-block buffer 103, there can be prevented data corruption, which would otherwise be caused when the data stored in the nonvolatile memory 102 become falsified as a result of a drop in supply voltage after interruption of power.

Eleventh Embodiment

A data processing device according to an eleventh embodiment of the present invention will now be described. As shown in FIG. 29, the data processing device according to the present embodiment is identical in structure with that described in connection with the tenth embodiment. The data processing device according to the present embodiment in principle operates in the same manner as does the data processing device according to the tenth embodiment, with the exception of operation of the recovery means 611.

Figure 32:
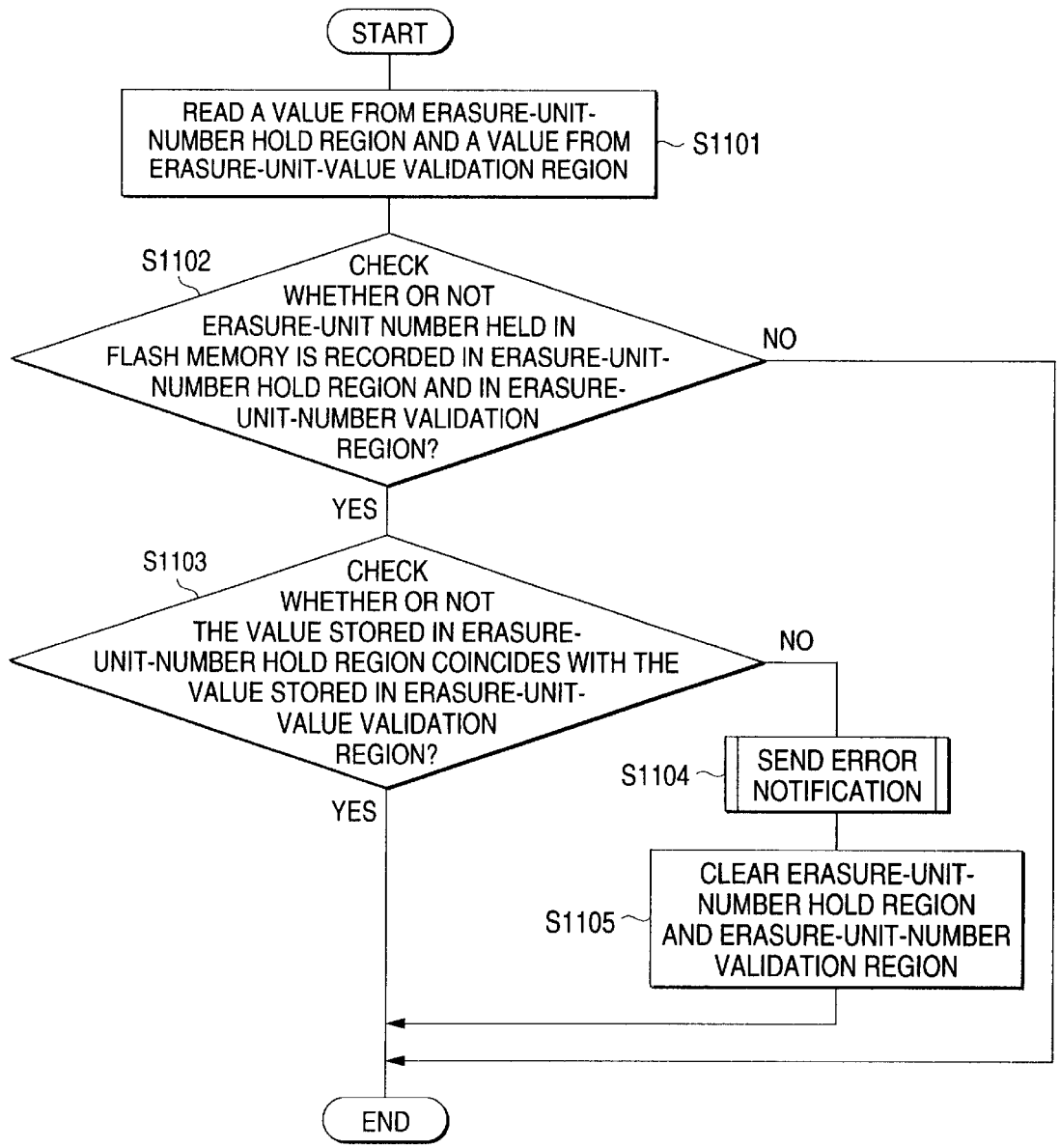
FIG. 32 is a flowchart showing the operation of the recovery means 611 of the data processing device according to an eleventh embodiment.

The operation of the recovery means 611 according to the present embodiment will now be described by reference to FIG. 32.

In step S1101, the recovery means 611 reads a value from the erasure-unit-number hold region 202 and a value from the erasure-unit-number validation region 601. In step S1102, a determination is made as to whether or not any of the erasure-unit numbers stored in the flash memory 101 is present in both the erasure-unit-number hold region 202 and the erasure-unit-number validation region 601.

If either the erasure-unit-number hold region 202 or the erasure-unit-number validation region 601 lacks an erasure-unit number, the recovery means 611 determines that no data are stored in the erasure-block buffer 103, and terminates processing operations.

In contrast, in a case where in step S1102 it is determined that the erasure-unit-number hold region 202 and the erasure-unit-number validation region 601 holds respective erasure-unit numbers, in step S1103 the recovery means 611 determines whether or not the erasure-unit number stored in the erasure-unit-number hold region 202 is identical with that stored in the erasure-unit-number validation region 601. If a match exists between the erasure-unit numbers, it is determined that data still remain in the erasure-block buffer 103, and the processing operation is terminated.

In contrast, in a case where no match exists between the erasure-unit numbers, it is determined that incomplete data are recorded in the erasure-block buffer 103. In step S1104, the recovery means 611 sends error notification to the data processing device, wherewith the data processing device can detect interruption of power supply that has occurred during the course of writing of data. In step S1105, in order to make the erasure-block buffer 103 available again, the recovery means 611 effects clearing of the erasure-unit-number hold region 202 and clearing of the erasure-unit-number validation region 601.

The foregoing operations are to be performed by the recovery means 611.

As mentioned above, in the present embodiment, in a case where a match exists between the value stored in the erasure-unit-number hold region 202 and the value stored in the erasure-unit-number validation region 601 at the time of restoration, no operation is performed. Only in a case where a match does not exists, there are effected issuance of error notification, clearing of the erasure-unit-number hold region 202, and clearing of the erasure-unit-number validation region 601. Accordingly, even in a case where data remain in the erasure-block buffer 103, the data can be restored quickly.

Twelfth Embodiment

Figures 33, 34:
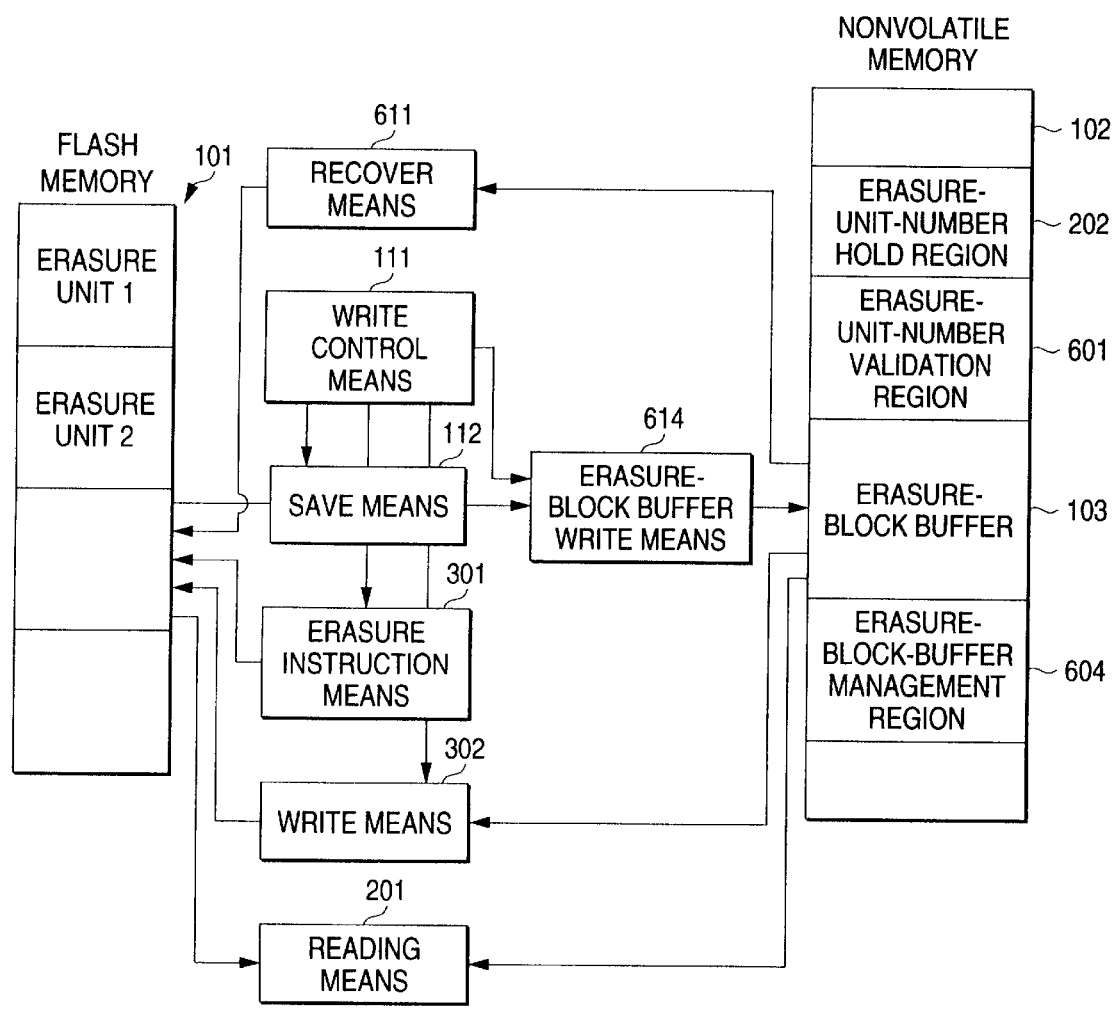
FIG. 33 is a block diagram showing the outline of a data processing device according to a twelfth embodiment of the present invention.
FIG. 34 is a table showing an erasure-block-buffer management region 604.

FIG. 33 is a block diagram showing the outline of a data processing device according to a twelfth embodiment of the present invention. In the drawing, reference numeral 601 designates an erasure-unit-number hold region which is provided within the nonvolatile memory 102 and records the same value as that stored in the erasure-unit-number hold region 202; and 604 designates an erasure-block-buffer management region in which are stored checksum values stating that data stored in respective regions are correct, the regions being formed by means of separating the erasure-block buffer 103 into sub-regions of predetermined sizes.

Further, in the drawing, reference numeral 611 designates recovery means which is executed when the data processing device starts up. On the basis of the data stored in the erasure-unit-number region 202, the data stored in the erasure-unit-number validation region 601, and the data stored in the erasure-block-buffer management region 604, the recovery means 611 copies into the flash memory 101 the data stored in the erasure-block buffer 103. Reference numeral 614 designates erasure-block-buffer write means. Upon receipt of a write instruction from the write control means 111 or the save instruction means 112, the erasure-block-buffer write means 614 writes data into the erasure-block buffer 103 and writes, into the erasure-block-buffer management region 604, a checksum value assigned to the region into which the data have been written. In other respects, the data processing device according to the present invention is identical in structure with that shown in FIG. 4.

The structure of the erasure-block-buffer management region 604 will now be described by reference to FIG. 34. The erasure-block buffer 103 is separated into sub-regions of given sizes; for example, in units of 4 K bytes, to thereby produce sub-divided regions. A checksum value is prepared by summation of all values used for checking the data stored in the subdivided regions; for example, data sets stored in the sub-divided regions. The checksum value is to be stored in the erasure-block-buffer management region 604.

In the example illustrated in FIG. 34, a data check value (i.e., a checksum value) assigned to a write region 1 is "0x 1234567"; a data check value (a checksum value) assigned to a write region 2 is "0x 789a123"; and a data check value (a checksum value) assigned to a write region 3 is "0xa1b8901," where 0x denotes a hexadecimal digit. The write regions 1, 2, and 3 correspond to regions of predetermined sizes defined within the erasure-block buffer 103.

In a case where data are written into the write region 1, the erasure-block-buffer write means 614 write data into the erasure-block buffer 103. Further, the erasure-block-buffer write means 614 writes a data checksum value relating to the write region 1 into the region assigned to the write region 1 of the erasure-block-buffer management region 604; that is, the region in which "0x 12345678" shown in FIG. 34 is stored.

Figure 35:
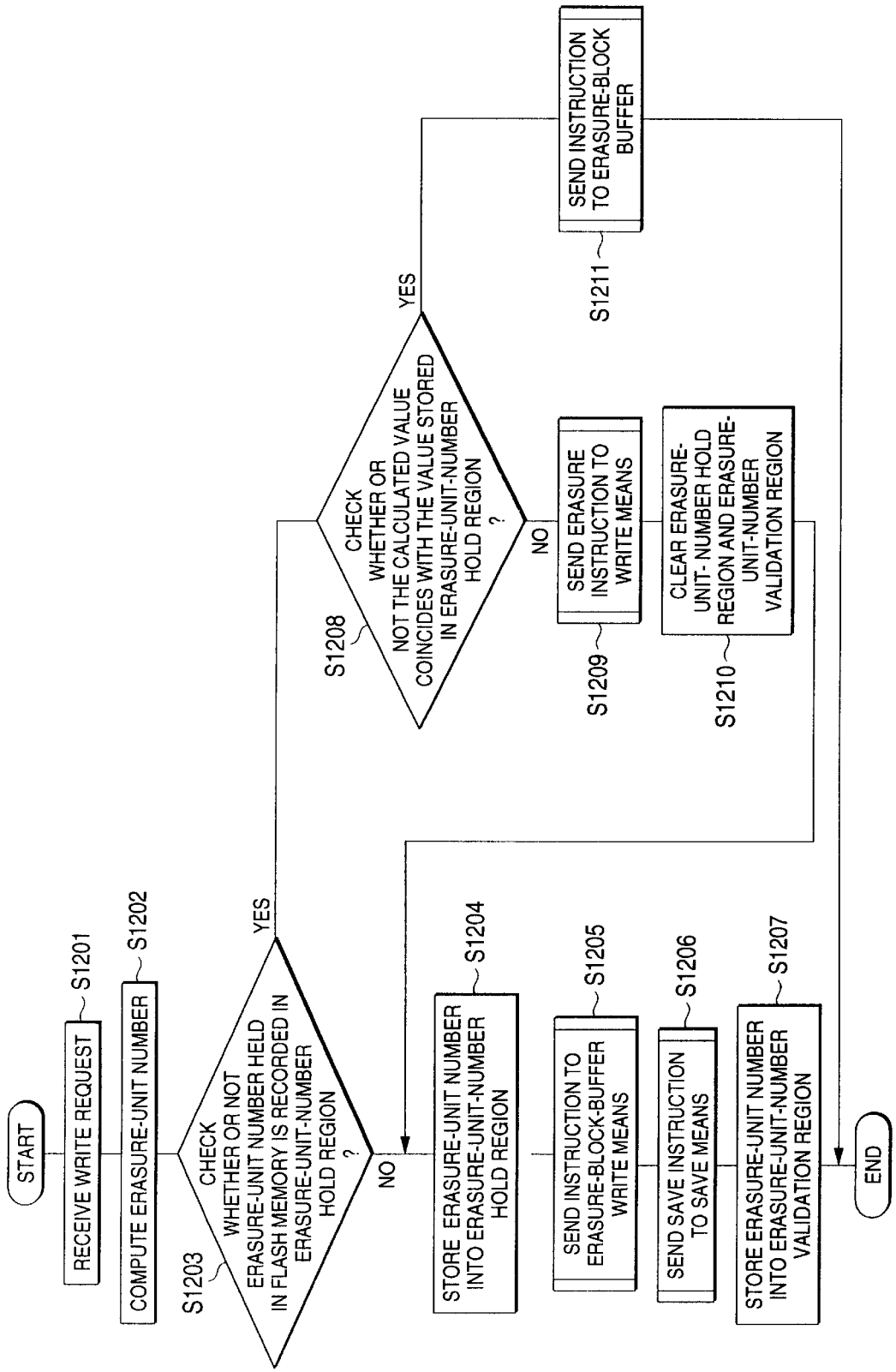
FIG. 35 is a flowchart showing the operation of the data processing device according to the twelfth embodiment performed for rewriting the data stored in flash memory.

In connection with the present embodiment, there will next be described an operation required for writing data into memory, by reference to FIG. 35. Unless otherwise specified, the write control means 111 performs the following processing operations. In FIG. 35, processing operations pertaining to steps S1201 through S1203, S1204, and S1207 through S1210 are identical with those according employed in the tenth embodiment (i.e., processing operations pertaining to steps S1001 through S1003, S1004, and S1007 through S1010 shown in FIG. 29), and repeated explanations are omitted here.

The data processing device according to the present embodiment differs from that of the second embodiment in that processing operations pertaining to steps S1205, S1206, and S1211 are provided. Explanation of primarily the difference will be given.

The write control means 111 performs processing pertaining to steps S1201 through S1204 in the same manner as in the tenth embodiment.

After having performed processing pertaining to step S1204, in step S1205 the write control means 111 sends an instruction to the erasure-block-buffer write means 614 tin order to write data into the erasure-block buffer 103. The instruction comprises data pertaining to the location of the write data in the erasure-block buffer 103 as well as to the size of the write data. Processing to be performed by the erasure-block-buffer write means 614 will be described in more detail.

In step S1206, a save instruction is sent to the save means 112. Processing to be performed by the save means 112 will be described in detail later.

Subsequently, in step S1207 the erasure-unit number determined in step S1202 is written into the erasure-unit-number validation region 601. After completion of processing pertaining to step S1207, the write control means 111 terminates the operation for writing data into memory, without involvement of writing of data into the flash memory 101.

In a case where in step S1208 it is determined that the erasure-unit number determined in step S1201 is recorded in the erasure-unit-number hold region 202, in step S1211 an instruction is sent to the erasure-block-buffer write means 614, to thereby write the write request data into the erasure-block buffer 103. The instruction comprises data pertaining to the location of the write data in the erasure-block buffer 103 as well as to the size of the write data. Processing to be performed by the erasure-block-buffer write means 614 will be described in more detail later.

The foregoing processing operations are to be performed when data are written into memory.

Figure 36:
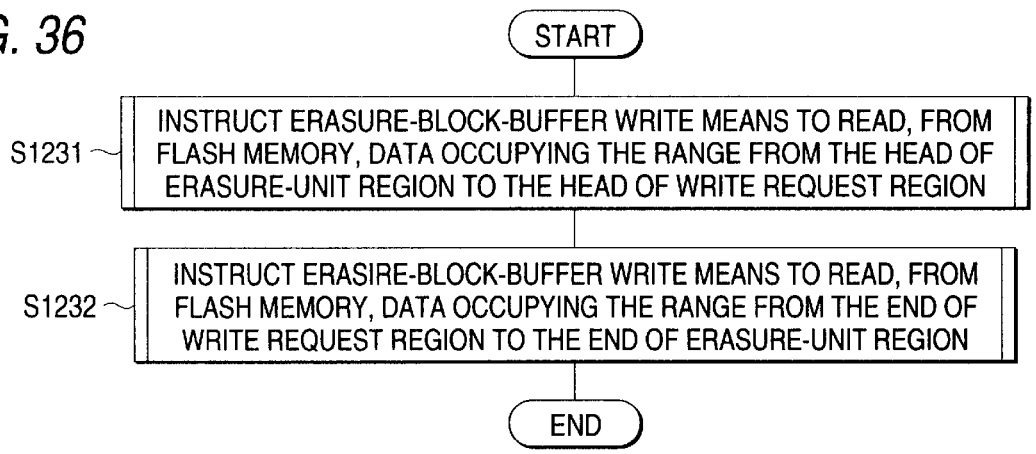
FIG. 36 is a flowchart showing the operation of save means 112.

Next will be described the operation of the save means 112 which copies into the erasure-block buffer 103 the non-changing data stored in the flash memory 101 by reference to FIG. 36.

In step S1231, the save means 112 instructs the erasure-block-buffer write means 614 to read, from the flash memory 101, data occupying the range from the head of the erasure-unit region of the flash memory 101—in which the write request data are stored—to the head of a write request region which records the write request data. The thus-read data are written into the erasure-block buffer 103. The instruction issued to the erasure-block-buffer write means 614 at this time comprises the head address of the erasure-unit region, the size of the data occupying the offset from the head address of the erasure-unit region to the head of the write request region, and the data read from the flash memory 101.

In step S1232, the save means 112 instructs the erasure-block-buffer write means 614 to read, from the flash memory 101, the data occupying the offset range from the end of the write request region in the erasure-unit number region stored in the flash memory 101—the write request region recording the write request data—to the end of the erasure-unit region. The thus-read data are written into the erasure-block buffer

103. At this time, the instruction sent to the erasure-block-buffer write means 614 includes the rearmost end address of the write request region in the erasure-unit region, the size of data occupying the offset range from the rearmost address of the write region in the erasure-unit region to the rearmost address of the erasure-unit region, and the data read from the flash memory 101.

The foregoing operations are to be performed by the save means 112, whereby non-changing data located in the erasure-unit region are written into the erasure-block buffer 103.

Figure 37:
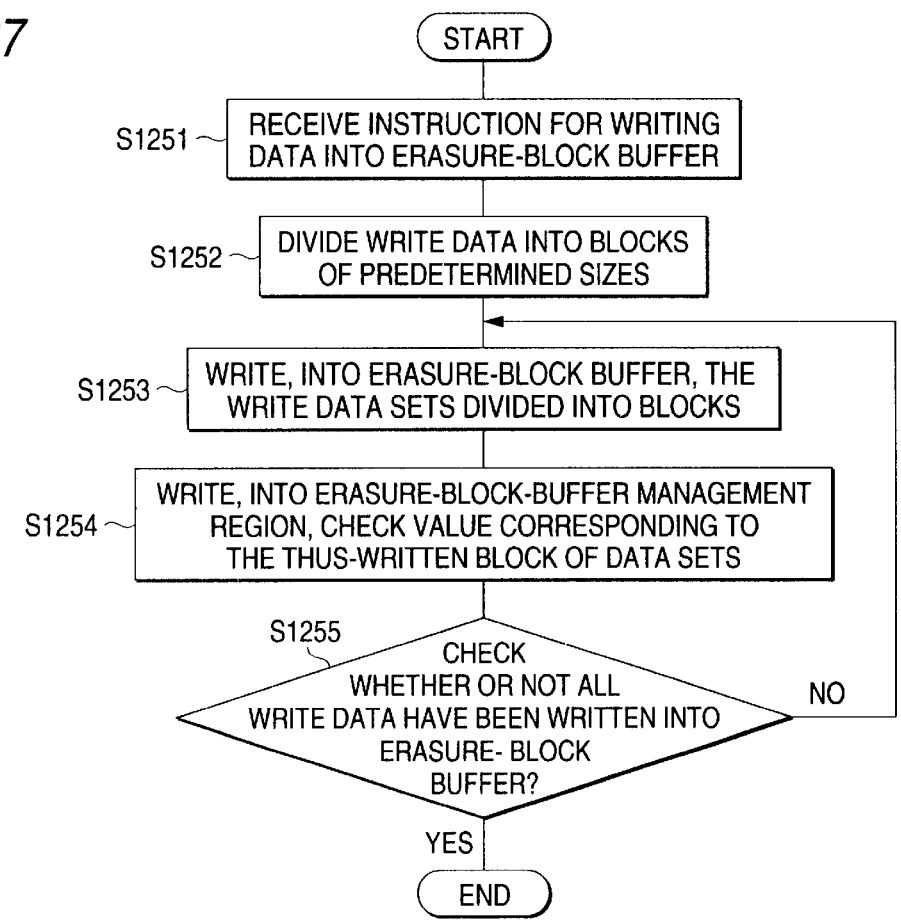
FIG. 37 is a flowchart showing the operation of erasure-block-buffer write means 614.

The operation of the erasure-block-buffer write means 614 performed when data are written into the erasure-block buffer 103 will be described by reference to FIG. 37.

In step S1251, the erasure-block-buffer write means 614 receives a request for writing data into the erasure-block buffer 103. The write request includes write request data which serve as data to be written, a write request region for specifying the address on the erasure-block buffer 103 into which data are to be written, and information about the size of the write request data.

In step S1252, the write request data are divided into sub-regions of sizes, the sizes being managed by the erasure-block-buffer management region 604. For example, in a case where write request data are managed in units of 1000 bytes and where write request data correspond to the offset range beginning on the head of an erasure block buffer and occupies 100 to 2099, the write request data correspond to the offset range beginning on the head of the erasure block buffer and are divided into three offset ranges; 100 to 999, 1000 to 1999, and 2000 to 2099. From the viewpoint of a write request region, these three offset ranges assume a value of 0 to 899; a value of 900 through 1899, and a value of 1900 to 1999, respectively. These offset ranges are sequentially processed from the head; namely, the offset range from 100 to 999; the offset range from 1000 to 1999; and the offset range from 2000 to 2099.

In step S1253, the thus-separated write request data are written into the erasure-block buffer 103. In a case where data corresponding o an offset range other than the write request data; for example, the offset range from 100 to 999, data corresponding to the offset range from 0 to 99 are not written.

In step S1254, a check sum value corresponding to the region into which data have been written is determined, and the checksum value is written into a corresponding checksum value region in the erasure-block-buffer management region 604. For example, in a case where data corresponding to the offset range from 100 to 999 are written in step S1253, in step S1254 a data check value corresponding to the offset range from 0 to 999 of the erasure-block buffer 103 is written into a data check value of the write region 1 shown in FIG. 34. The data check value is used as a reference value for checking whether or not data stored in a corresponding region are correct. A checksum value which is a total of values pertaining to all the data sets provided in the region is used as the data check value.

In step S1255, a check is made as to whether or not all the write request data have been written into the erasure-block buffer 103. If in step S1255 it is determined that not all the write request data have been written, the next write request region is subjected to processing pertaining to steps S1253 and S1254. In a case where data pertaining to the offset range from 100 to 999 have not yet been written, data pertaining to the next offset range from 1000 to 1999 are subjected to processing pertaining to steps S1253 and S1254.

The foregoing processing operations are to be performed by the erasure-block-buffer write means 614.

Figure 38:
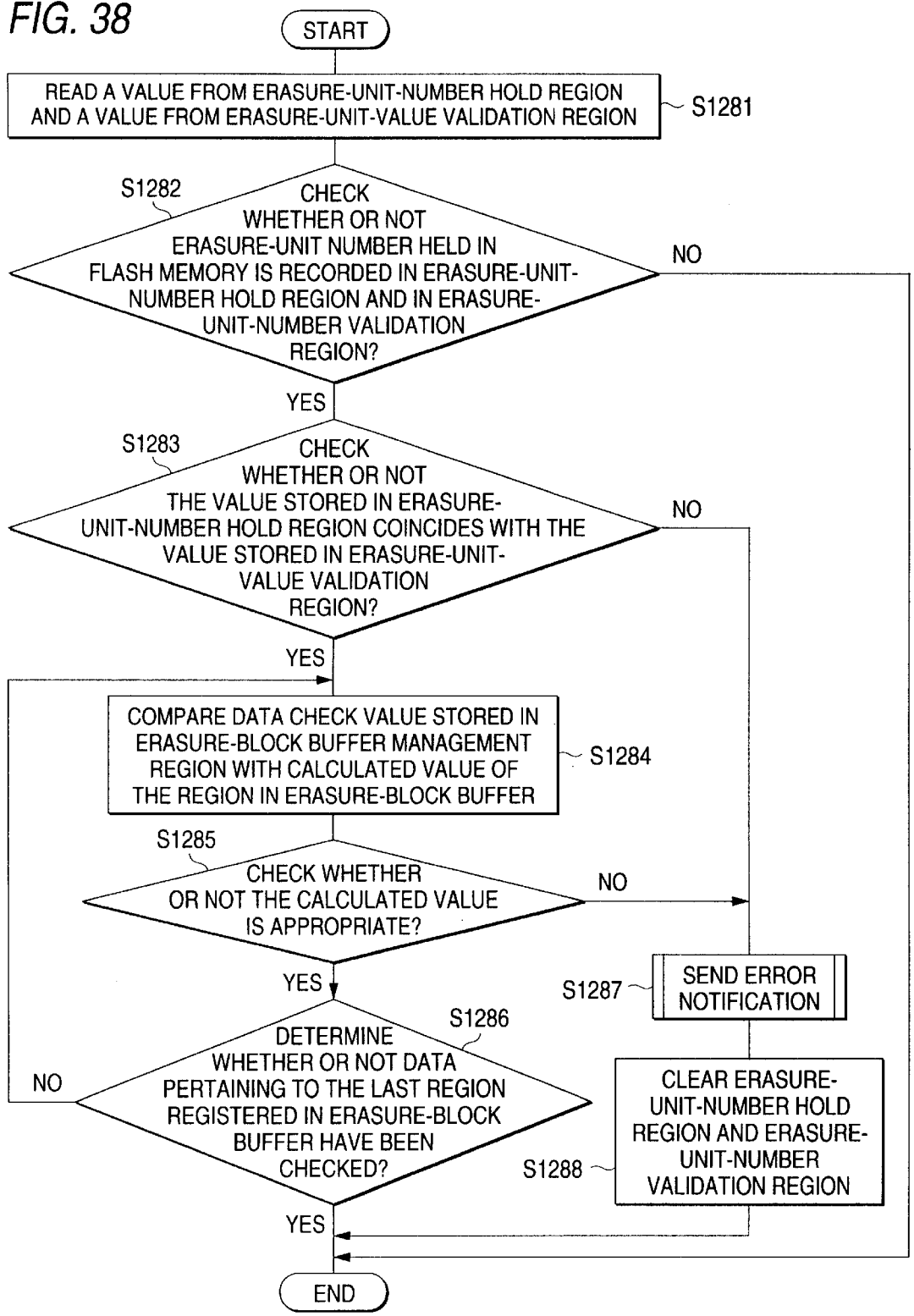
FIG. 38 is a flowchart showing the operation of recovery means 611.

The operation of the recovery means 611 to be performed when the data processing device is started up will be described by reference to FIG. 38.

In step S1281, the recovery means 611 reads the value stored in the erasure-unit-number hold region 202 and the value stored in the erasure-unit-number validation region 601. In step S1282, a check is made as to whether or not a value is stored in the erasure-unit-number hold region 202, as well as to whether or not an erasure-unit number assigned to the flash memory 101 is recorded in the erasure-unit-number validation region 601.

If in step S1281 it is determined that no erasure-unit number is recorded in the erasure-unit-number validation region 601, it is found that no data are recorded in the erasure-block buffer 103, and hence the processing performed by the recovery means 611 is terminated.

In contrast, if in step S1282 it is determined that an erasure-unit number is recorded in the erasure-unit-number validation region 601, a check is made, in step S1283, as to whether or not a match exists between the erasure-unit-number hold region 202 and the erasure-unit-number validation region 601.

If in step S1283 it is determined that no match exists between the erasure-unit-number hold region 202 and the erasure-unit-number validation region 601, processing proceeds to step S1287, in which error notification is sent to the data processing device. As a result, the data processing device can detect interruption of power which has arisen in the course of data being written into the data processing device. Subsequently, clearing of the erasure-unit-number hold region 202 and clearing of the erasure-unit-number validation region 601 are effected in step S1288, thereby rendering the erasure-block buffer 103 available.

If it is determined in step S1283 that a match exists between the value stored in the erasure-unit-number hold region 202 and the value stored in the erasure-unit-number validation region 601, processing proceeds to step S1284.

In step S1284, a data check value is read from each of the write regions provided in the erasure-block-buffer management region 604. Further, there is calculated a value stored in a corresponding region within the erasure-block buffer 103 (the calculation is effected in the same manner as in a case where a data check value of the write region is calculated. For example, if the data check value corresponds to a checksum value, a total of data sets is calculated). The data check value of each of the write regions in the erasure-block-buffer management region 604 is compared with the thus-calculated value of the region in the erasure-block buffer 103.

If a match exists between the data check value and the calculated value, the data stored in the erasure-block buffer 103 are determined to be correct. In contrast, if the data stored in the erasure-block buffer 103 are determined to be incorrect, processing proceeds to step S1287, where error notification is sent to the data processing device. As a result, there can be detected an error; for example, data being written into the erasure-block buffer 103 by means of an operation performed by means other than the means described by the present invention or a failure arising in the nonvolatile memory 102 used by the erasure-block buffer 103. In step S1288, clearing of the erasure-unit-number hold region 220 and clearing of the erasure-unit-number validation region 601 are effected, thereby rendering the erasure-block buffer 103 available.

If in step S1285 it is determined that the value stored in the erasure-block-buffer management region 604 is appropriate, processing proceeds to step S1286. In step S1286, a determination is made as to whether or not data pertaining to the last region registered in the erasure-block buffer 103 have been checked. If the data have not yet been checked, data pertaining to the next region are continuously processed through processing pertaining to steps S1284 through S1286.

If in step S1286 it is determined that the data pertaining to the last region stored in the erasure-block buffer 103 have been checked, processing is terminated. As a result, it is understood that the data stored in the erasure-block buffer 103 after recovery are correct.

As mentioned above, in the present embodiment, the erasure-block buffer 103 is separated into sub-regions of given sizes, and the data processing device is provided with the erasure-block-buffer management region 604 for storing data check values corresponding to the respective sub-regions. Even if a failure arises in the nonvolatile memory 102 retaining the erasure-block buffer 103, to thereby render the data stored in the erasure-block buffer 103 falsified, the data processing device can detect occurrence of the failure and its result.

Further, the erasure-block buffer 103 is divided into sub-regions of given sizes. In a case where there arises a write request for writing data into the erasure-unit region identical with that stored in the erasure-block buffer 103, the only requirement is that a data check value pertaining to a region accompanied by the write request region be updated. As a result, a necessity for re-calculating a data check value pertaining to the overall erasure-block buffer 103 can be eliminated, so that the processing speed at which the data processing device writes data into memory is increased.

Thirteenth Embodiment

A data processing device according to a thirteenth embodiment of the present invention will now be described. The data processing device according to the present embodiment is identical in configuration with that described in connection with the twelfth embodiment. FIG. 33 shows the data processing device according to the present embodiment. The data processing device is identical with that employed in the twelfth embodiment, with the exception of the configuration of the erasure-block-buffer management region 604, the operation of the erasure-block-buffer write means 614, and the operation of the recovery means 611.

FIG. 39 shows the configuration of the erasure-block-buffer management region 604 employed in the present embodiment. In the present embodiment, in order to manage an erasure block buffer in the form of a region of arbitrary size, three data values are retained in the erasure-block-buffer management region 604 as information for representing a region; that is, an offset value stored in the erasure-block buffer 103; the size of a region; and a data check value. In the drawing, reference numeral "−1" designates that information about a region is not stored.

The operation of the erasure-block-buffer write means 614 employed in the present embodiment will be described by reference to FIG. 40.

In step S1301, the erasure-block-buffer write means 614 receives a request for writing data into the erasure-block buffer 103. The write request includes information about write request data used as data to be written, a write request region for specifying an address on the erasure-block buffer 103 into which the write request data are to be written, and the size of the write request data.

In step S1302, the write request data are written into the erasure-block buffer 103.

Next, in step S1303, a region is retrieved from the erasure-block-buffer management region 604.

In step S1304, a determination is made as to whether or not the write request region assigned to the write request received in step S1301 is identical with the region registered in the erasure-block-buffer management region 604. In a case where the write request region is identical with the registered region, processing proceeds to step S1305, in which the data check value that has already been stored in the erasure-block-buffer management region 604 is updated to a data check value pertaining to the write request data. Thereafter, processing is terminated.

If in step S1304 it is determined that the write request region assigned to the write request received in step S1301 is determined to not be identical with the region registered in the erasure-block-buffer management region 604, a determination is made in step S1306 as to whether or not the write request region is included in the region in which the erasure-block-buffer management region 604 has already been registered (for example, whether or not data corresponding to the offset range from 200 to 400 are written when the data corresponding to the offset range from 0 to 1000 have already been registered). If the write request region is included in the region, in step S1307 data pertaining to the region that has already been registered in the erasure-block-buffer management region 604 (i.e., an offset value on the erasure-block-buffer 103, the size of a write request region, and a data check value) are deleted.

A region occupying the range from the head of the registered region to the head of the write request data are newly registered (step S1308), and a write request region is newly registered (S1309). Finally, a region occupying the range from the end of the write request data to the end of the registered region is newly registered (S1310), and processing is terminated. An offset on the erasure-block buffer 103, the size of a write request region, and a data check value are written at the time of a registration operation performed in each of steps S1308 and S1309.

If in step S1306 it is determined that the region registered in the erasure-block-buffer management region 604 does not include a write request region, a determination is made, in step S1311, as to whether or not the write request region spreads across any of the regions registered in the erasure-block-buffer management region 604.

If the write request region spreads across some of the regions registered in the erasure-block-buffer management region 604, all the regions across which the write request region extends are deleted from the erasure-block-buffer management region 604. Subsequently, a check value of the region from the head of the first of the regions across which the write request region spreads to the head of the writ request region is newly registered in the erasure-block-buffer management region 604 (S1313). Further, a check value regarding the write request region is newly registered in the erasure-block-buffer management region 604 (S1314). Subsequently, a check value of the region from the end of the write request region to the end of the last of the regions across which the write request region spreads is newly registered (S1315). Thus, processing is terminated. An offset on the erasure-block-buffer 103, the size of a write request region, and a data check value are written at the time of a registration operation performed in each of steps S1313 and S1314.

In contrast, if in step S1311 it is determined that the write request region does not spread across any of the regions registered in the erasure-block-buffer management region 604, information about the write request region is not stored in the erasure-block-buffer management region 604. In step S1316, a check value of the write request region is newly registered in the erasure-block-buffer management region 604. At this time, the position of the write request region (i.e., an offset) on the erasure-block buffer 103, the size of the write request region, and a check value stating that the write request data are correct are stored in the erasure-block-buffer management region 604.

The foregoing operations are to be performed by the erasure-block-buffer write means 614.

The manner in which data are processed in the erasure-block-buffer management region 604 will next be described by reference to an example shown in FIG. 41. FIG. 41 shows the data processing performed by the erasure-block buffer 103 when the data processing device has received an instruction for writing, into memory, data having an offset value 0x 2000 (0x represents a hexadecimal digit), a size of 0x 2000, and a data check value of 0x fedca123.

Example 1 pertains to a case where a write request region is identical with that registered in the erasure-block-buffer management region 604. In this example, the region—which has an offset value of 0x 2000 and a size of 0x 2000—has already been registered in the erasure-block-buffer management region 604. This region is the same region in which the write request data are registered.

In this case, the erasure-block-buffer write means 614 performs processing pertaining to step S1305 shown in FIG. 40; that is, updating of a check value corresponding to the registered region to another check value corresponding to the write request data. As a result, after writing of data into memory, check values written in hatched portions of Example 1 shown in FIG. 41 are updated.

Example 2 pertains to a case where the write request region is included in the regions registered in the erasure-block-buffer management region 604. In this example, a region having an offset value of 0x 1000 and a size of 0x 4000 is registered in the erasure-block-buffer management region 604, and the write request region is included in this region. In this case, the erasure-block-buffer write means 614 performs processing pertaining to steps S1307 to S1310 shown in FIG. 40.

First, data pertaining to the registered region; that is, the region having an offset value of 0x 1000 and a size of 0x 4000, are deleted (in step S1307 shown in FIG. 40). A check value regarding a region extending from the head of the registered region to the head of the write request region (i.e., a region having an offset value of 0x 1000 and a size of 0x 1000) is newly registered (in step S1308 shown in FIG. 40). Next, a check value regarding the write request region (having an offset value of 0x 2000 and a size of 0x 2000) is newly registered (in step S1309 shown in FIG. 40). Finally, a check value regarding a region (having an offset value of 0x 4000 and a size of 0x 1000) extending from the end of the write request data to the end of the registered region is newly registered (in step S1310 shown in FIG. 40). Thus, after writing of data into memory, check values written in hatched portions of Example 2 shown in FIG. 41 are updated.

Example 3 pertains to a case where a write request region spreads across the region registered in the erasure-block-buffer management region 604. In this example, the write request region spreads across two regions registered in the erasure-block-buffer management region 604 (i.e., a region having an offset value of 0x 0000 and a size of 0x 3000 and another region having an offset value of 0x 3000 and a size of 0x 2000). In this case, the erasure-block-buffer write means 614 performs processing pertaining to steps S1312 to S1315 shown in FIG. 40.

First, the registered regions; i.e., a region having an offset value of 0x 0000 and a size of 0x 3000 and a region having an offset value of 0x 3000 and a size of 0x 2000, are deleted (in step S1312 shown in FIG. 40). A check value regarding a region (having an offset value of 0x 0000 and a size of 0x 2000) extending from the head of the first region (having an offset value of 0x 0000 and a size of 0x 3000) of the registered regions to the head of the write request region is newly registered (in step S1313 shown in FIG. 40). Next, a check value regarding the write request region (having an offset value of 0x 2000 and a size of 0x 2000) is newly registered (in step S1314 shown in FIG. 40). Finally, a check value regarding a region (having an offset value of 0x 4000 and a size of 0x 1000) extending from the end of the write request region to the end of the last region across which the write request region spreads is newly registered (in step S1315 shown in FIG. 40). Thus, after writing of data intomemory, check values written in hatched portions of Example 3 shown in FIG. 41 are updated.

The last example (i.e., Example 4) pertains to a case where the write request region is not registered in the erasure-block-buffer management region 604. In this example, only a region having an offset value of 0x 4000 and a size of 0x c000 is registered in the erasure-block-buffer management region 604, and a write request region (having an offset value of 0x 2000 and a size of 0x 2000) is not registered.

In this case, the erasure-block-buffer write means 614 performs processing pertaining to step S1316 shown in FIG. 40. Namely, a check value regarding a write request region (having an offset value of 0x 2000 and a size of 0x 1000) is newly registered in the erasure-block-buffer write means 614. Thus, after writing of data into memory, check values written in hatched portions of Example 2 shown in FIG. 41 are updated.

Figure 42:
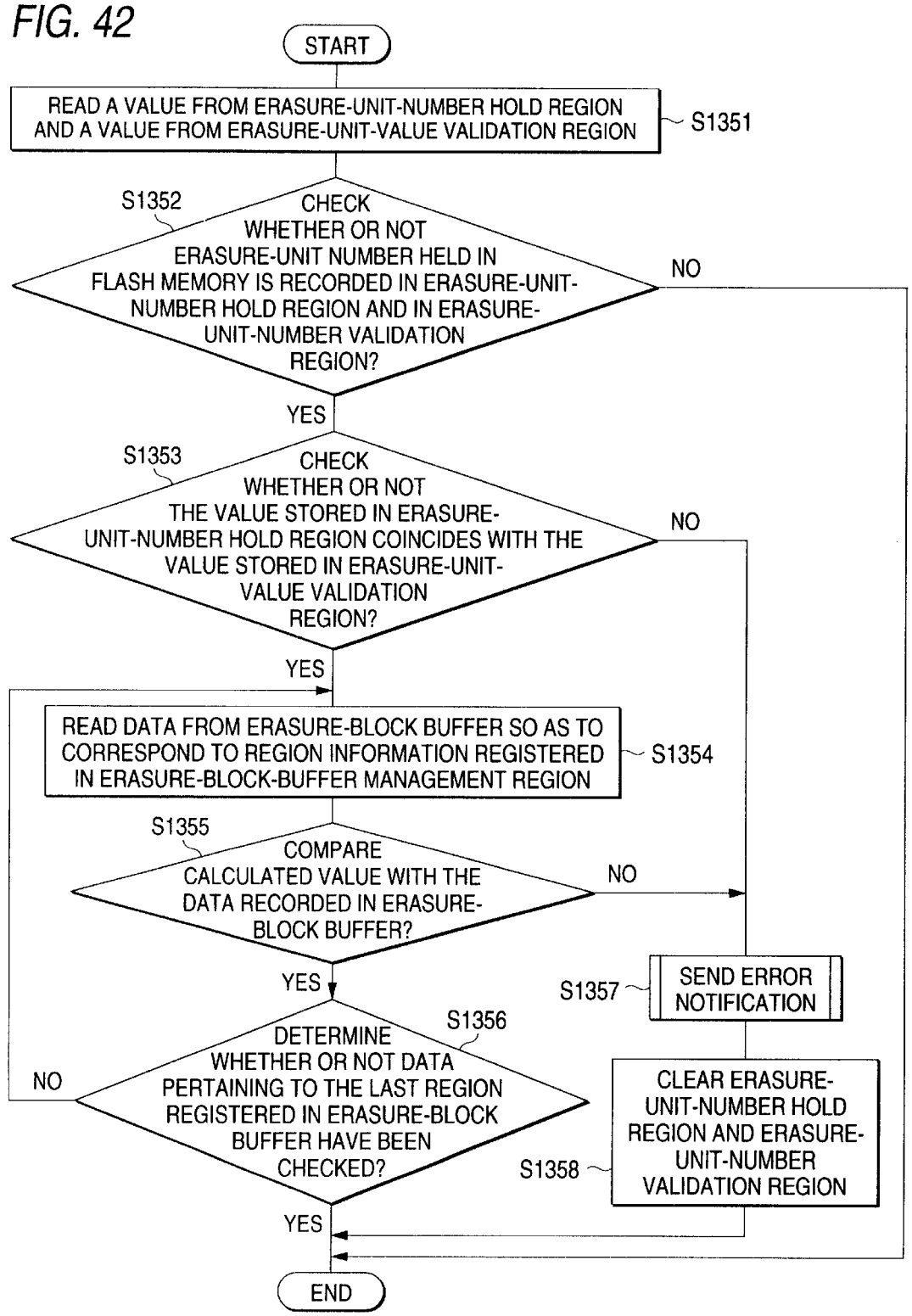
FIG. 42 is a flowchart showing the operation of recovery means 611.

The operation of recovery means 611 according to the present embodiment will be described by reference to FIG. 42.

In step S1351, the recovery means 611 reads the value stored in the erasure-unit-number hold region 202 and the value stored in the erasure-unit-number validation region 601. In step S1352, a check is made as to whether or not a value is stored in the erasure-unit-number hold region 202 as well as to whether or not an erasure-unit number assigned to the flash memory 101 is recorded in the erasure-unit-number validation region 601.

If in step S1351 it is determined that no erasure-unit number is recorded in the erasure-unit-number validation region 601, it is found that no data are recorded in the erasure-block buffer 103, and hence the processing performed by the recovery means 611 is terminated.

In contrast, if in step S1352 it is determined that an erasure-unit number is recorded in the erasure-unit-number validation region 601, a check is made, in step S1353, as to whether or not a match exists between the erasure-unit-number hold region 202 and the erasure-unit-number validation region 601.

If in step S1353 it is determined that no match exists between the erasure-unit-number hold region 202 and the erasure-unit-number validation region 601, processing proceeds to step S1357, in which error notification is sent to the data processing device. As a result, the data processing device can detect interruption of power which has arisen in the course of data being written into the data processing device. Subsequently, clearing of the erasure-unit-number hold region 202 and clearing of the erasure-unit-number validation region 601 are effected in step S1358, thereby rendering the erasure-block buffer 103 available.

If it is determined in step S1353 that a match exists between the value stored in the erasure-unit-number hold region 202 and the value stored in the erasure-unit-number validation region 601, processing proceeds to step S1354. In step S1354, data are read from the erasure-block buffer 103 in response to information about the region registered in the erasure-block-buffer management region 604. Further, still in step S1354 there is calculated a value stored in a corresponding region within the erasure-block buffer 103 (the calculation is effected in the same manner as in a case where a data check value of the write region is calculated. For example, if the data check value corresponds to a checksum value, a total of data sets is calculated).

Subsequently, in step S1355 a check is made as to whether or not a match exists between the value calculated in step S1354 and a data check value included in the information about the regions registered in the erasure-block-buffer management region 604.

If a match exists between the data check value and the calculated value, the data stored in the erasure-block buffer 103 are determined to be correct.

In contrast, if the data stored in the erasure-block buffer 103 are determined to be inappropriate; namely, the data are not correct, processing proceeds to step S1357, where error notification is sent to the data processing device. As a result, it can be detected that data are written into the erasure-block buffer 103 by means of an operation performed by means other than the means described by the present invention or that a failure has arisen in the nonvolatile memory 102 used by the erasure-block buffer 103. In step S1358, clearing of the erasure-unit-number hold region 220 and clearing of the erasure-unit-number validation region 601 are effected, thereby rendering the erasure-block buffer 103 available.

If in step S1355 it is determined that the value stored in the erasure-block-buffer management region 604 is appropriate, processing proceeds to step S1356. In step S1356, a determination is made as to whether or not data pertaining to the last region registered in the erasure-block-buffer management region 604 have been checked. If the data have not yet been checked, data pertaining to the next region are continuously processed through processing pertaining to steps S1354 through S1356.

If in step S1356 it is determined that the data pertaining to the last region registered in the erasure-block-buffer management region 604 have been checked, processing is terminated. As a result, only the correct data remain in the erasure-block buffer 103 after recovery.

As mentioned above, in the present embodiment, regions to be registered in the erasure-block-buffer management region 604 are made variable in size, and hence there is obviated a necessity for dividing a write request region through use of the erasure-block-buffer write means 614 at the time of writing of data into the erasure-block buffer 103. Consequently, writing of data into memory can be effected at high speed.

Fourteenth Embodiment

A data processing device according to a fourteenth embodiment of the present invention will now be described. The data processing device according to the present embodiment is identical in configuration with that described in connection with the twelfth embodiment. As shown in FIG. 33, the data processing device according to the present embodiment is identical with that described in connection with the twelfth embodiment, with the exception of operation of reading means.

The operation of reading means 201 according to the present embodiment will be described by reference to FIG. 43.

Figure 6:
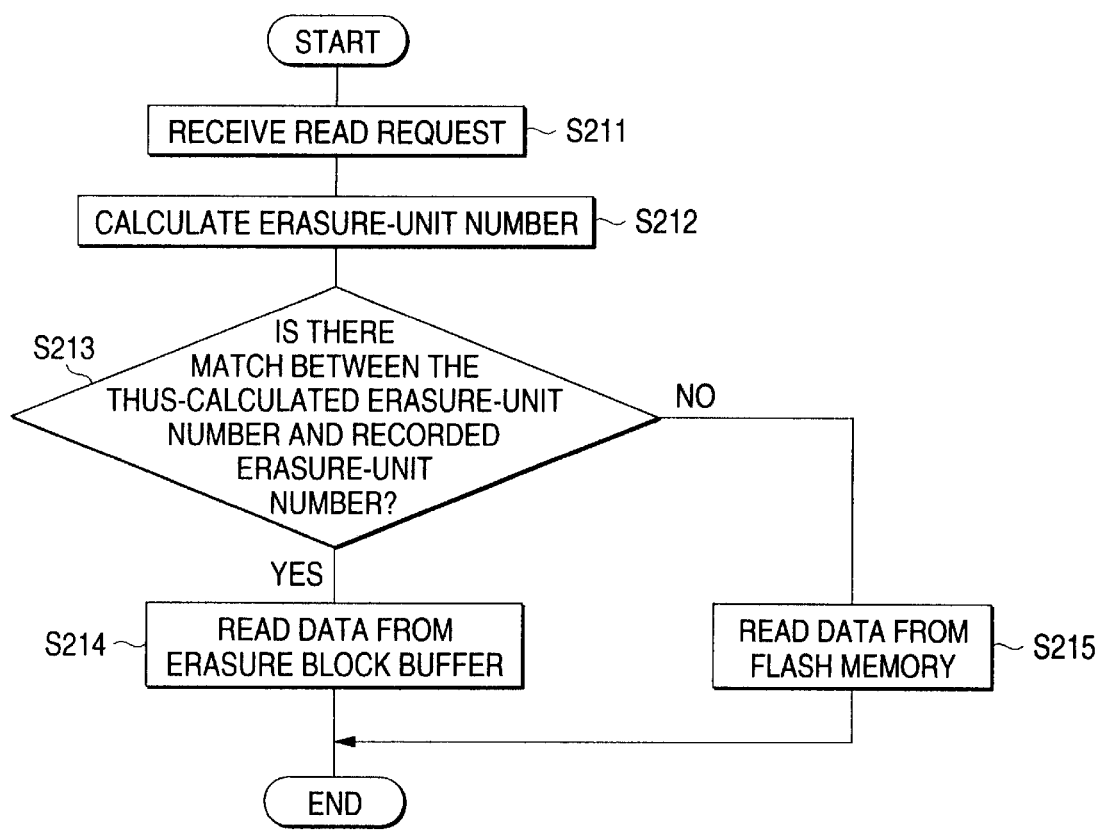
FIG. 6 is a flowchart showing the operation of the data processing device of the second embodiment for reading data from the memory.
Figure 43:
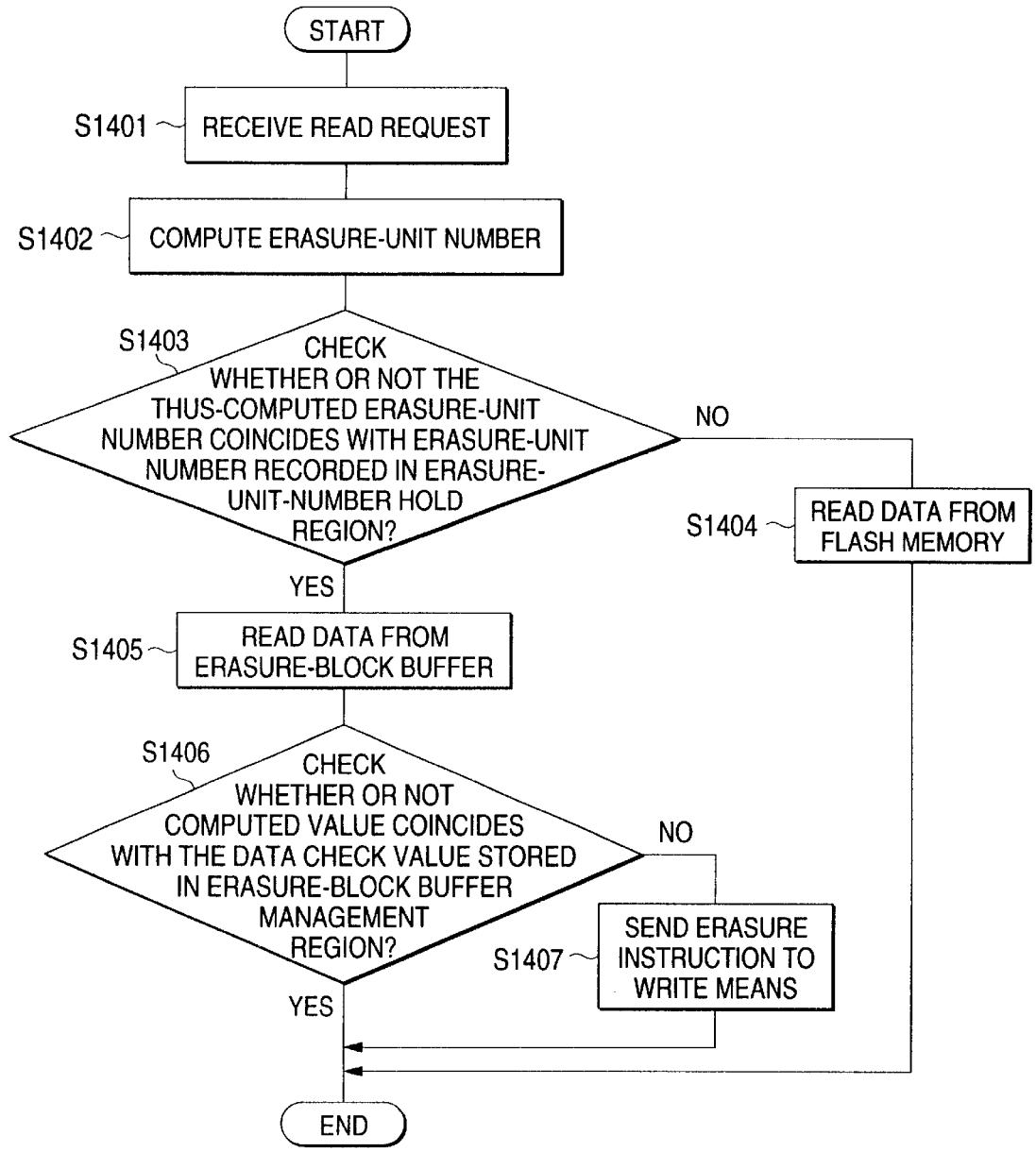
FIG. 43 is a flowchart showing the operation of the data processing device according to a fourteenth embodiment of the present embodiment performed when data are read.

In FIG. 43, processing pertaining to steps S1401 through S1403 and S1404 is identical with that employed in the second embodiment (processing pertaining to steps S211 through S213 and S215 shown in FIG. 6), and hence repeated explanations are omitted.

The data processing device according to the present embodiment differs from that of the second embodiment in that processing pertaining to steps S1405, S1406, and S1407 is provided. Explanation of primarily the differences will be given.

Upon receipt of a read request in step S1401, in step S1402 the reading means 201 determines the number of an erasure unit in the flash memory 101 including read request regions. In step S1403, a determination is made as to whether or not a match exists between a record on the erasure-unit-number hold region 202 and the number of the erasure unit determined in step S1402.

In a case where an erasure-unit number is not recorded in the erasure-unit-number hold region 202 or where the recorded erasure-unit number does not match that determined in step S1402, data pertaining to a read region are not retained in the erasure-block buffer 103. Hence, in step S1404, the reading means 120 reads data from the flash memory 101.

In a case where a match exists between the recorded erasure-unit number and that determined in step S1402, processing proceeds to step S1405, in which data pertaining to a read request region are read from the erasure-block buffer 103.

In step S1406, a determination is made as to whether or not the thus-read data are corrected, through use of the data check value stored in the erasure-block-buffer management region 604 corresponding to the region of the erasure-block buffer 103 from which the data have been read. In step S1405, a value is calculated from the data read from the erasure-block buffer 103 (the calculation is effected in the same manner as in a case where a data check value of the erasure-block-buffer management region 604 is calculated). Subsequently, a check is made as to whether or not a match exists between the calculated value and a data check value of the erasure-block-buffer management region 604 corresponding to the region from which the data have been read.

If a match exists between the calculated value and the data check value, the data read from the erasure-block buffer 103 are determined to be correct.

In contrast, if the data read from the erasure-block buffer 103 are determined to be inappropriate in step S1406, error notification is sent to the data processing device in step S1407. In a case where in step S1406 it is determined that the data are appropriate, the thus-read data assume a correct value. Hence, processing is terminated.

As mentioned above, in the present embodiment, the data check value recorded in the erasure-block-buffer management region 604 is utilized for checking data at the time of reading of data. Hence, in the event of data being written into the erasure-block buffer 103 through use of means other than that according to the present invention or a failure having arisen in the nonvolatile memory 102, such an occurrence or a failure can be detected as an error at the time of a reading operation.

Fifteenth Embodiment

A data processing device according to a fifteenth embodiment of the present invention will now be described. The data processing device according to the present embodiment is identical in configuration with that described in connection with the twelfth embodiment. As shown in FIG. 33, the data processing device according to the present embodiment is identical with that described in connection with the twelfth embodiment, with the exception of operation of the reading means 201.

The operation of reading means 201 according to the present embodiment will be described by reference to FIG. 44.

Figure 44:
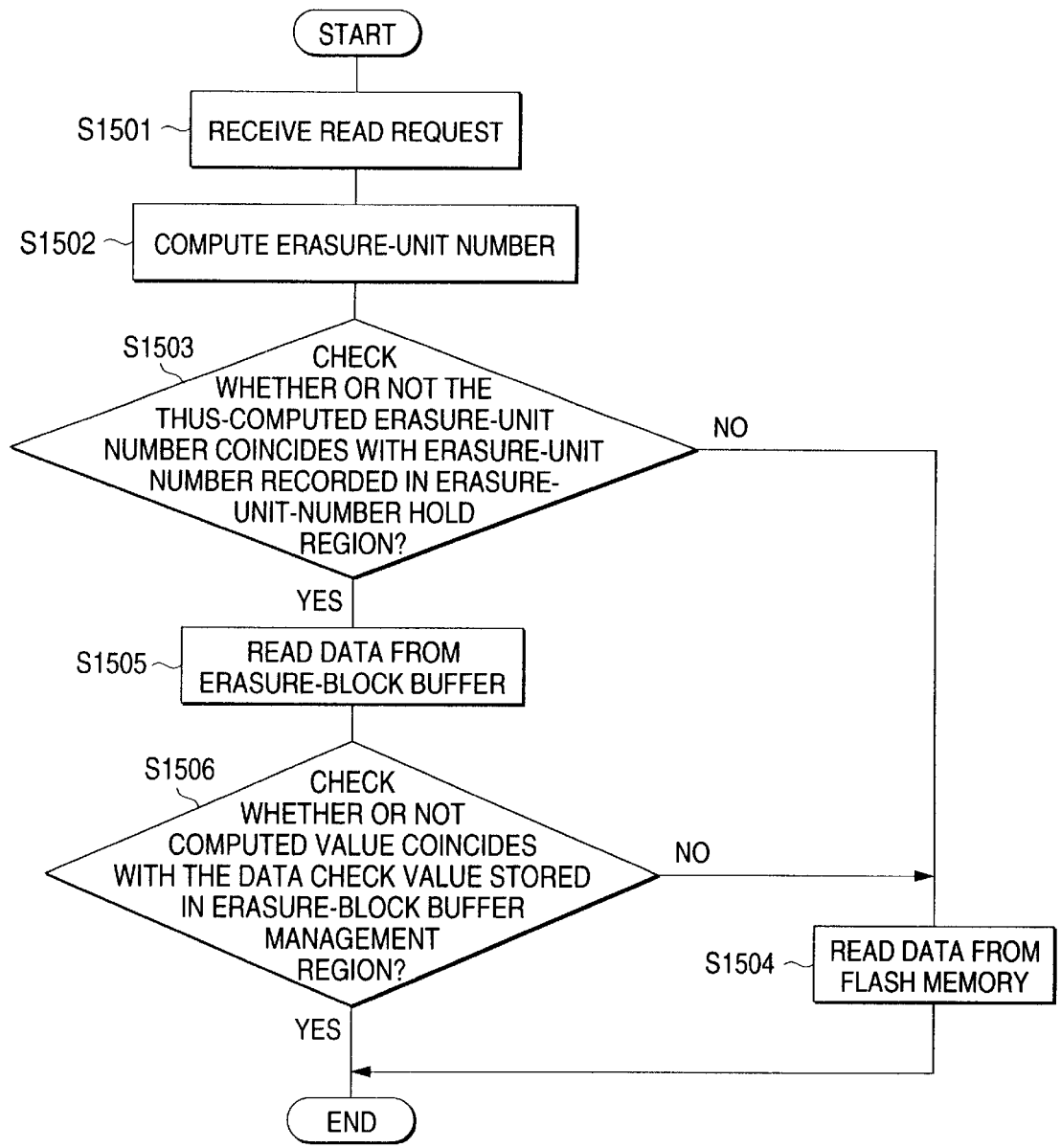
FIG. 44 is a flowchart showing the operation of the data processing device according to a fifteenth embodiment of the present embodiment performed when data are read.

In FIG. 44, processing pertaining to steps S1501 through S1506 is identical with that employed in the fourteenth embodiment (processing pertaining to steps S1401 through S1406 shown in FIG. 43), and hence repeated explanations are omitted.

In the present embodiment, processing pertaining to step S1504, in which data are read from the flash memory 101, is performed even when in step S1506 a determination is made as to whether or not the data read from the erasure-block buffer 103 are appropriate. In step S1504, data are read from a region on the flash memory 101 corresponding to the read request region, and processing is to be terminated later.

Processing pertaining to step S1504 is performed even when an erasure-unit number is not recorded in the erasure-unit-number hold region 202 or when the recorded erasure-unit number does not match that determined in step S1502.

In the present embodiment, in a case where data read from the erasure-block buffer 103 are not correct, another data set is read from a region on the flash memory 101 corresponding to the erasure-block buffer 103. The operation of the data processing device can be continued through use of the data that had been stored before writing.

Sixteenth Embodiment

Figure 45:
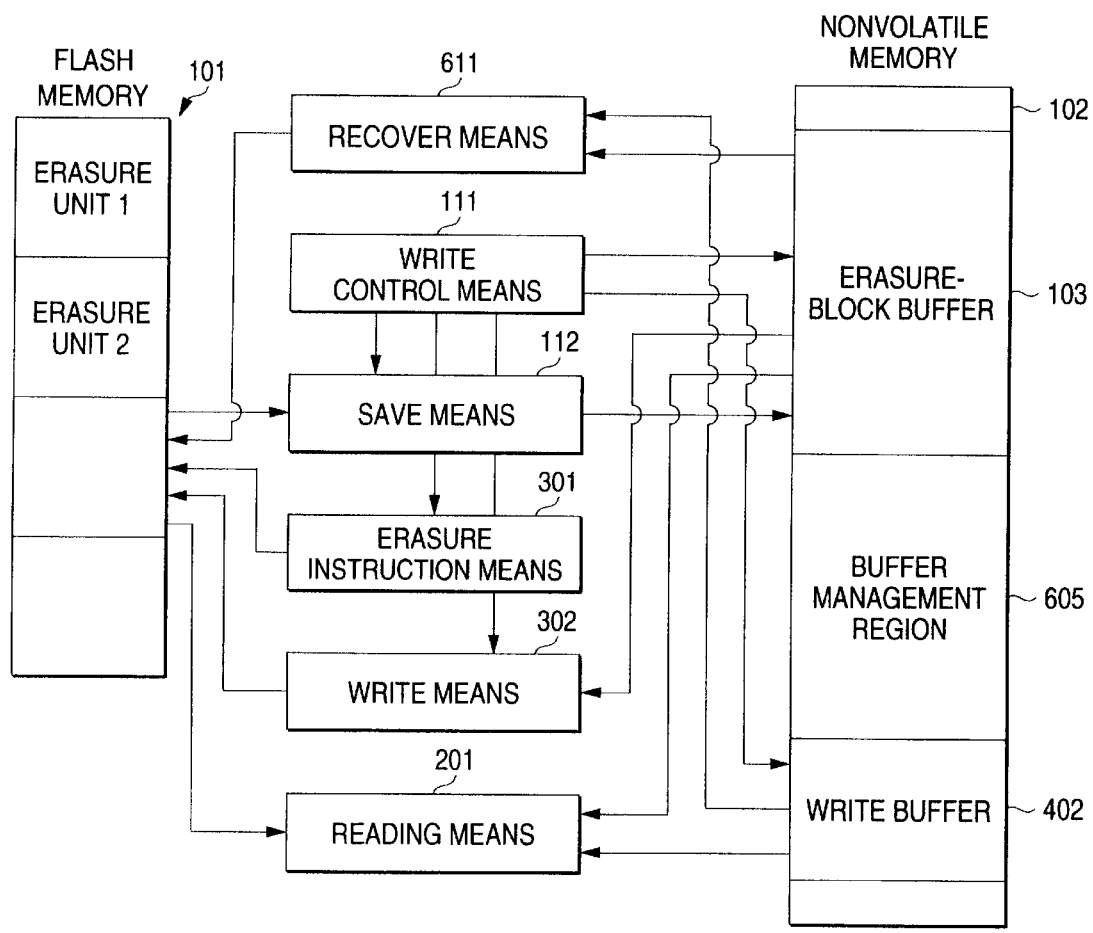
FIG. 45 is a block diagram showing the outline of a data processing device according to a sixteenth embodiment of the present invention.

FIG. 45 shows the configuration of a data processing device according to a sixteenth embodiment of the present invention. In the drawing, reference numeral 605 designates a buffer management region in which are stored information about an erasure-unit number of the erasure-block buffer 103 (hereinafter referred to as "erasure-unit number information") and information about an erasure-unit number of a write buffer. Reference numeral 611 designates recovery means which is executed at the time of startup of the data information processing and which recovers the data stored in the information-block buffer 103 and the data stored in the write buffer 402 in accordance with the information recorded in the buffer management region 605. In other respects, the data processing device according to the present embodiment is identical in structure with or corresponds to that shown in FIG. 8, and repeated explanation is omitted. The erasure-unit-number hold region 202 shown in FIG. 8 is set within the buffer management region 605 shown in FIG. 45.

FIG. 46 shows contents of the data recorded in the buffer management region 605. The buffer management region 605 comprises an erasure-block-buffer management region 6051 for storing information pertaining to an erasure block buffer, and a write buffer management region 6052 for storing information pertaining to the write buffer 402.

The erasure-block-buffer management region 6051 of the buffer management region 605 includes an erasure-unit-number hold region for recording an erasure-unit number on the flash memory 101 corresponding to the data stored in the erasure-block buffer 103; an erasure-unit-number validation region for holding the same value as that stored in the erasure-unit-number hold region; and a data check value region for holding a data check value to be used for checking whether or not the data stored in the erasure-block buffer are correct.

A write buffer management region 6052 of the buffer management region 605 retains an erasure-unit number on the flash memory 101 into which the data reserved in the write buffer 402 are to be written; an offset range for specifying the location of a write region in the erasure-unit region; a size representing the size of the write region; a data check value to be used for checking whether or not the data stored in a corresponding region in the write buffer 402 are correct; and a management region check value to be used for checking whether or not data pertaining to the information region (i.e., an erasure-unit-number region, an offset range within an erasure unit, a size, and a data check value) are correct. An erasure-unit number of "−1" signifies that there are no write data other than the write data.

Figure 47:
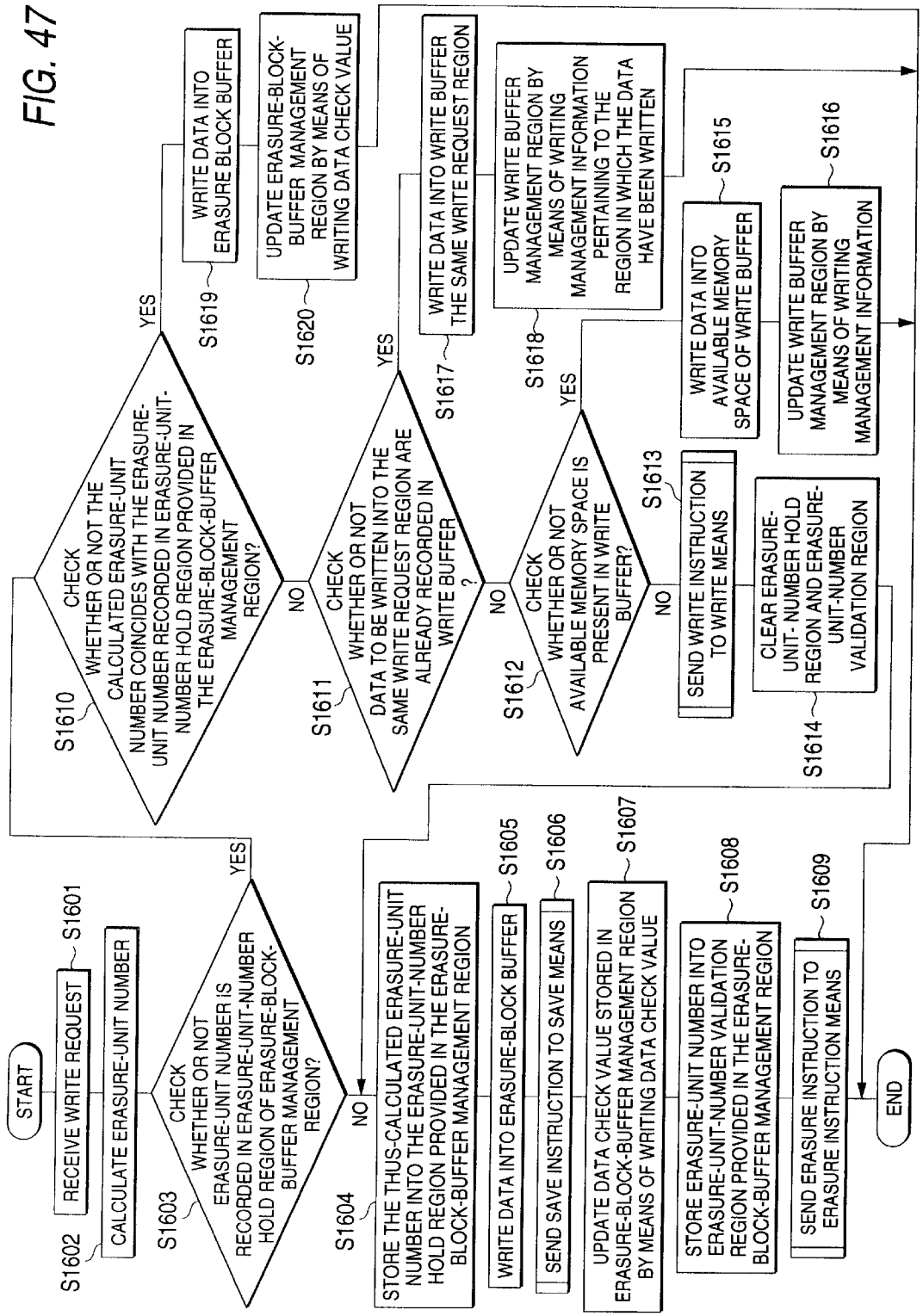
FIG. 47 is a flowchart showing the operation of the data processing device according to the sixteenth embodiment performed for rewriting the data stored in flash memory.

The operation of the data processing device according to the present embodiment performed when data are written into memory will now be described by reference to FIG. 47. Unless otherwise specified, the write control means 111 performs the following processing operations.

In step S1601, the write control means 111 receives a write request. In step S1602, the write control means 111 determines an erasure-unit number allocated to the flash memory 101, through computation. These operations are the same as those performed in the first and fourth embodiments.

Subsequently, in step S1603, a determination is made as to whether or not the erasure-unit number is recorded in the erasure-unit-number hold region within the erasure-block-buffer management region 6051.

If it is determined that no erasure-unit number is recorded in the erasure-unit-number-hold region, in step S1604 the write control means 111 stores the erasure-unit number determined in step S1602 in the erasure-unit-number hold region within the erasure-block-buffer management region 6051.

Subsequently, in step S1605 the control means 111 writes write request data into the erasure-block buffer 103. In step S1606, the control means 111 issues a save instruction to the save means 112. Details of the save instruction and the operation of the save means 112 are the same as those in the first and fourth embodiments.

In step S1607, the data check value is written into the erasure-block-buffer management region 6051. The data check value is to be used for checking whether or not the data written in the erasure-block buffer 103 are correct. A value capable of being used for checking whether or not data are correct; such as a checksum value which is a total of all the data sets stored in the erasure-block buffer 103, is used as the data check value.

In step S1608, the erasure-unit number determined in step S1602 is stored in the erasure-unit-number hold region provided within the erasure-block-buffer management region 6051. In a case where the value stored in the erasure-unit-number hold region is identical with that stored in the erasure-unit-number validation region, it is determined that writing of all the write request data into the erasure block buffer 103 has been completed.

In step S1609, an erasure instruction is sent to the erasure instruction means 301. Details of the erasure instruction and the operation of the erasure instruction means 301 are the same as in the fourth embodiment.

In a case where in step S1603 it is determined that an erasure-unit number is recorded in the erasure-unit-number hold region provided within the erasure-block-buffer management region 6051, in step S1610 a determination is made as to whether or not a match exists between the erasure-unit number determined in step S1602 and the erasure-unit number recorded in the erasure-unit-number hold region within the erasure-block-buffer management region 605.

In a case where in step S1610 it is determined that the erasure-unit numbers do not coincide, in step S1611 a determination is made as to whether or not data to be written into the same write request region are already recorded in the write buffer 402, on the basis of the information recorded in the write buffer management region 6052 and by reference to the write buffer management region 6052. The determination is the same as that performed in the fourth embodiment.

If in step S1611 it is determined that data to be written into the same write request region are not recorded in the write buffer 402, in step S1612 the write control means 111 checks an available memory space of the write buffer 402. The checking operation to be performed in step S1612 is the same as that performed in the fourth embodiment.

If no available memory space is present in the write buffer 402, in step S1613 the write control means 111 sends a write instruction to the write means 301. Details of the erasure instruction and the operation of the erasure instruction means 301 are the same as in the first embodiment.

In step S1614, clearing of the erasure-unit-number hold region provided in the erasure-block-buffer management region 6051 and clearing of the erasure-unit-number validation region provided in the erasure-block-buffer management region 6051 are effected in step S1614. As a result, it is seen that no data remain in the erasure-block buffer 601.

Processing pertaining to steps S1604 through S1609 is performed in the same manner as in the case where no erasure-unit number is recorded.

In a case where in step S1612 it is determined that an available memory space is present in the write buffer 402, write data are written into the available memory space in the write buffer 402 in step S1615.

In step S1616, management information about the write data is recorded in the write buffer management region 6052. As management information, there are recorded an erasure-unit number, an offset for specifying the position of write data within the region indicated by the erasure-unit number, the size of write data, a data check value to be used for checking whether or not write data are correct, and a management region check value to be used for checking whether or not the foregoing four data elements are correct. The management information recorded in the write buffer management region 6052 is associated with the write data written in the write buffer 402, by means of recording the management information and the write data such that they are addressed in respective areas in the same sequence.

In a case where in step S1611 it is determined that the data to be written into the same write request region are already recorded in the write buffer 402, in step S1617 the write data are written into an area on the write buffer 402 in which the data are already recorded.

In step S1618, the management information pertaining to the region into which the write data have been written in step S1617, the information being stored in the write management region 6052, is updated. The information to be updated at this time comprises a data check value and a management region check value.

In a case where in step S1610 it is determined that the erasure-unit number calculated in step S1602 coincides with the erasure-unit number recorded in the erasure-unit-number holder region provided within the erasure-block-buffer management region 6051, in step S1619 write request data are written into the erasure-block buffer 103.

In step S1620, a data check value determined from the updated data stored in the erasure-block buffer 103 is written into a data check value region in the erasure-block-buffer management region 6051.

The foregoing operations are to be performed when data are written into memory.

The operation of the data processing device performed when data are read from memory will now be described by reference to FIG. 48. Unless otherwise specified, the reading means 201 performs the following processing operations.

In step S1651, the reading means 201 receives a read request. Details of the read request are the same as in the fourth embodiment.

In step S1652, the reading means 201 determines an erasure-unit number on the flash memory 101 including a read request region in the same manner as in the fourth embodiment.

In step S1653, a determination is made as to whether or not an erasure-unit number is recorded in the erasure-unit-number hold region provided within the erasure-block-buffer management region 6051.

If an erasure-unit number is not recorded, in step S1657 a determination is made whether or not data to be written into the region which is specified as a read request region are recorded in the write buffer 402, by reference to the management information stored in the write buffer management region 6052.

In a case where the data to be written into the region specified as a read request region are recorded in the write buffer 402, in step S1659 a determination is made as to whether or not the data are correct, through use of the data check value recorded in the write buffer management region 6052. More specifically, the data to be written into the region specified as a read request region are read from the write buffer 402. A value is calculated on the basis of the data (in accordance with the calculation rule used for calculating a data check value registered in the write buffer management region 6052). The thus-calculated value is compared with the data check value registered in the write buffer management region 6052. If the calculated value is identical with the data check value, it is determined that the data recorded in the write buffer 402 are appropriate.

In a case where the data are determined to be appropriate, in step S1661 the data are read from the write buffer 402, and processing is terminated.

In contrast, if the data are determined to be inappropriate, in step S1650 error notification is sent to the data processing device, and processing is terminated.

In a case where in step S1657 it is determined that the data to be written into the region specified as a read request region are not recorded in the write buffer 402, in step S1658 read data are read from the flash memory 101.

In a case where in step S1653 it is determined that an erasure-unit number is recorded in the erasure-unit-number hold region within the erasure-block-buffer management region 6051 and where the erasure-unit number coincides with the erasure-unit number determined in step S1652, the data pertaining to the read request data are recorded in the erasure-block buffer 103. Accordingly, in step S1654, a determination is made as to whether or not the data recorded in the erasure-block buffer 103 are correct, through use of the erasure-block-buffer management region 6051. The determination is performed in accordance with the same procedures as those used in step S1659.

If in step S1654 it is determined that the data are appropriate, in step S1655 the data are read from the erasure-block buffer 103, and processing is terminated.

In contrast, if in step S1654 it is determined that the data are inappropriate, error notification is sent to the data processing device in step S1656, and processing is terminated.

The foregoing operations are to be performed when data are read from memory.

Figure 49:
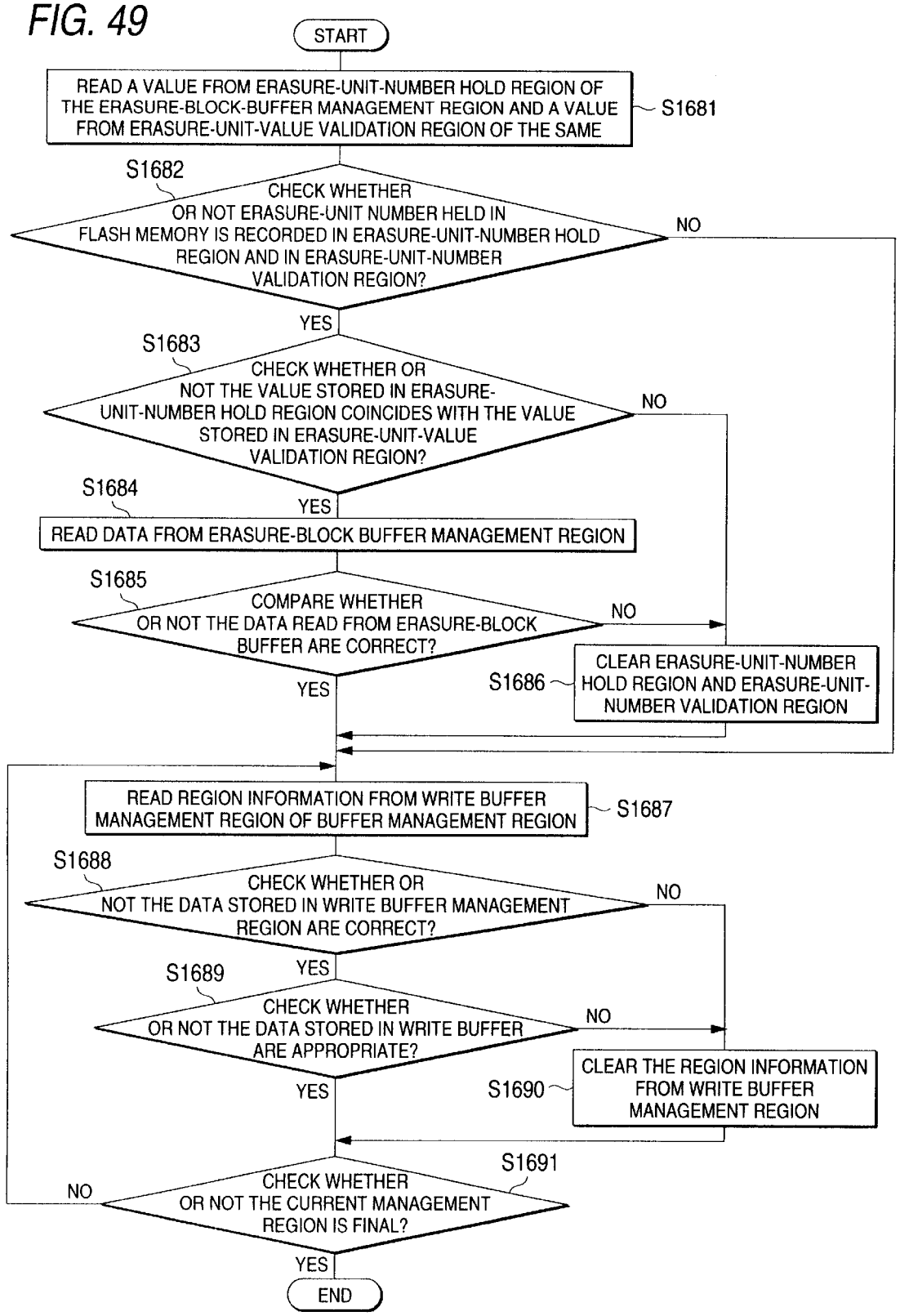
FIG. 49 is a flowchart showing the operation of recovery means 611.

The operation of the recovery means 611 to be performed at the time of startup of the information processing device will be described by reference to FIG. 49.

In step S1681, the recovery means 611 reads the value stored in the erasure-unit-number hold region provided in the erasure-block-buffer management region 6051 and the value stored in the erasure-unit-number validation region provided in the same. Subsequently, in step S1682 a determination is made as to whether or not an erasure-unit number equal to that recorded in the flash memory 101 is stored in both the erasure-unit-number hold region and the erasure-unit-number validation region.

In a case where an erasure-unit number is recorded, in step S1683 a check is made as to whether or not the value recorded in the erasure-unit-number hold region coincides with that recorded in the erasure-unit-number validation region.

In a case where the value recorded in the erasure-unit-number hold region coincides with that recorded in the erasure-unit-number validation region, in step S1684 a data check value recorded in the erasure-block-buffer management region 6051 is read.

Figure 48:
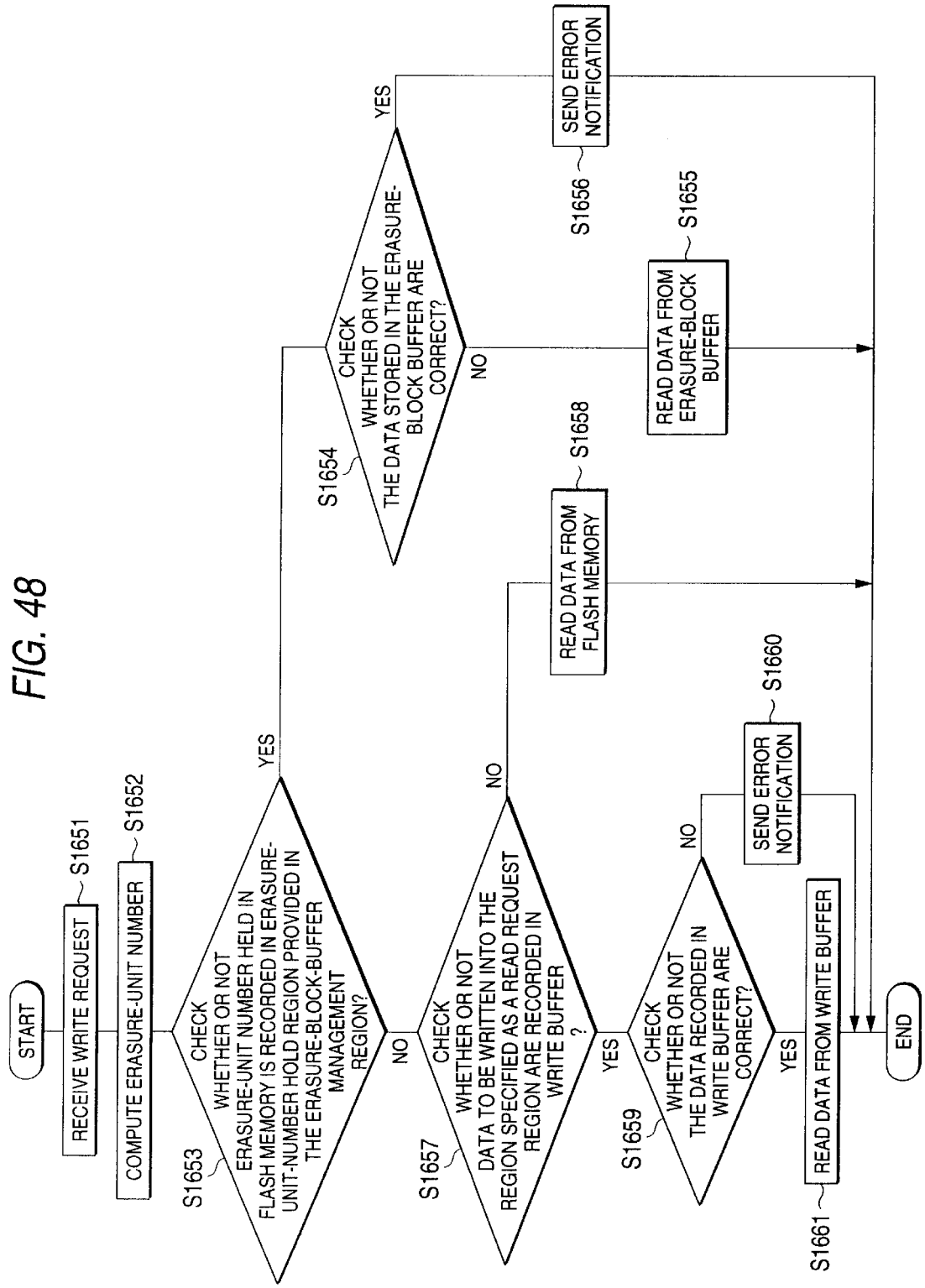
FIG. 48 is a flowchart showing the operation of the data processing device according to the sixteenth embodiment of the present embodiment performed when data are read.

In step S1685, a determination is made as to whether or not the data recorded in the erasure-block buffer 103 are correct, through use of the data check value read in step S1684 and in the same manner as in step S1654 shown in FIG. 48.

In a case where in step S1685 it is determined that the data stored in the erasure-block buffer 103 are appropriate, it is found that the data recorded in the erasure-block buffer 103 remain intact. Accordingly, in order to recover to the previous state of the write buffer 402, in step S1687 region information is read from the write buffer management region of the buffer management region 605.

In step S1688 a determination is made as to whether or not the data recorded in the write buffer management region 6052 are correct, through use of a management region check value. To this end, information other than the management region check value (i.e., an erasure-unit number, an offset, the size of the data, and a data check value) is extracted, and a checksum value is calculated. The thus-calculated checksum value is compared with the management region check value. If the checksum value coincides with the management region check value, it is determined that the data recorded in the write buffer management region 6052 are appropriate.

In a case where in step S1688 it is determined that the data recorded in the write buffer management region 6052 are appropriate, in step S1689 a determination is made as to whether or not the data that are recorded in the write buffer 402 and correspond to the region information are correct, through use of the data check value included in the region information. Such determination is made through use of a determination method employing a checksum value such as that mentioned previously.

In a case where in step S1689 it is determined that the data recorded in the write buffer 402 are correct, in step S1691 a determination is made as to whether or not the region information corresponds to the final region information stored in the buffer management region 6052. If the region information is the final region information, processing is terminated.

In a case where in step S1691 it is determined that the region information is not the final one, the next region information is read, and processing pertaining to steps S1687 through S1691 is performed in order to determine whether or not the thus-read region information is correct.

In a case where in step S1689 it is determined that the data recorded in the write buffer 402 are incorrect, the region information recorded in the write buffer management region 6052 is cleared in step S1690, to thereby enable a data set to use the region information and another data set to use the write buffer. Processing then proceeds to step S1691, in which processing of the next region information is pursued.

In contrast, in a case where in step S1688 it is determined that the data pertaining to the region information are incorrect, the region information recorded in the write buffer management region 6052 is cleared in step S1690, to thereby enable a data set to use the region information and another data set to use the write buffer. Processing then proceeds to step S1691, in which processing of the next region information is pursued.

In a case where in step S1685 it is determined that the data recorded in the erasure-block buffer 103 are incorrect, clearing of the erasure-unit-number hold region provided in the erasure-block-buffer management region 6051 and clearing of the erasure-unit-number validation region provided in the same are effected in step S1686, to thereby render the erasure-block buffer 103 available. Processing pertaining to steps S1687 through S1691 is performed, and recovery of the previous state of the write buffer 104 is effected.

In a case where in step S1683 it is determined that the value recorded in the erasure-unit-number hold region of the erasure-block-buffer management region 6051 does not coincide with that recorded in the erasure-unit-number validation region of the same, in step S1686 clearing of the erasure-unit-number hold region and clearing of the erasure-unit-number validation region are effected, thereby rendering the erasure-block buffer 103 available. Processing pertaining to steps S1687 through S1691 is performed, to thereby effect recovery of previous state of the write buffer 104.

As mentioned above, the data processing device according to the present embodiment is provided with the erasure-block-buffer management region 6051 for managing the erasure-block buffer 103 and the write buffer management region 6052 for managing the write buffer 402. The erasure-block-buffer management region 6051 has an erasure-unit-number hold region and a data check value region, in addition to an erasure-unit-number hold region. The write buffer management region 6052 retains the data check value region and the management region check value, in addition to an erasure-unit-number region, an offset value region provided in the erasure unit, and a write data size region.

Therefore, at the time of reading data from memory and recovery of previous state of the data processing device, a determination can be made as to whether or not the data recorded in the erasure-block buffer 103 and the data recorded in the write buffer 402 are correct, through use of a data check value. In the event of a failure arising in the nonvolatile memory 102 having the erasure-block buffer 103 and the write buffer 402, to thereby render the data recorded in the erasure-block buffer 103 falsified, the data processing device can detect such a failure and its associated result.

Further, even when data are written into the erasure-block-buffer 103 or the write buffer 402 in an unauthorized manner, by way of means other than that of the present invention, the data processing device can detect such invalid writing of data.

Seventeenth Embodiment

A data processing device according to a seventeenth embodiment of the present invention will now be described. The data processing device is identical in configuration with that described in connection with the sixteenth embodiment. As shown in FIG. 45, the data processing device is identical with that described in connection with the sixteenth embodiment, with the exception of operation of the recovery means 611.

Figure 50:
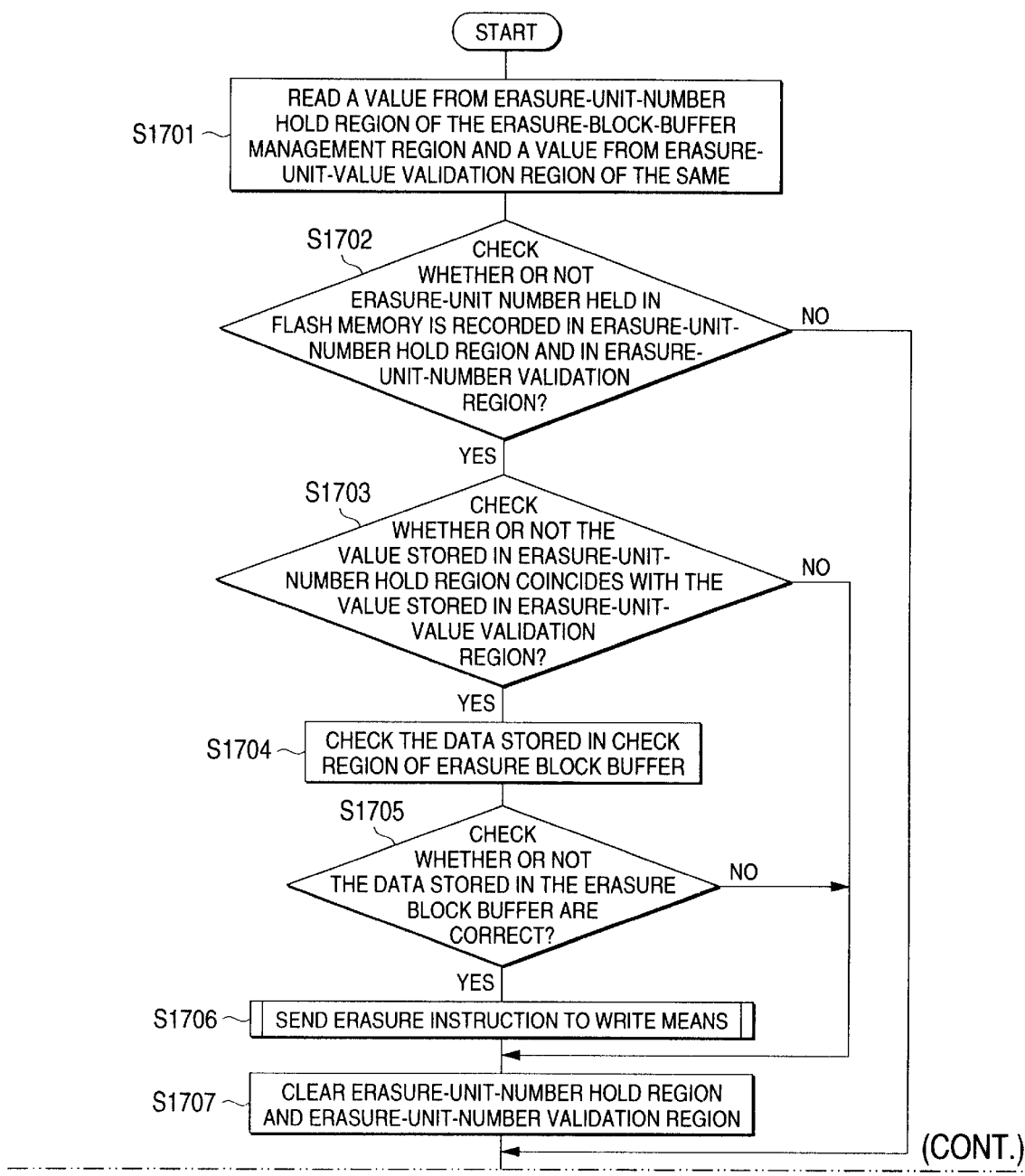
FIG. 50 is a flowchart showing the operation of recovery means 611 according to a seventeenth embodiment of the present invention.

The operation of the recovery means 611 according to the present embodiment will be described by reference to FIG. 50. The flowchart shown in FIG. 50 differs from that employed in the sixteenth embodiment and shown in FIG. 49 with regard to a portion of operations of the recovery means 611.

Processing pertaining to steps S1701 through S1705 is identical with the processing pertaining to steps S1681 through S1685 which has been described in connection with the sixteenth embodiment.

In a case where in step S1705 it is determined that the data recorded in the erasure-block buffer 103 are incorrect, processing proceeds to step S1707. In step S1707, clearing of the erasure-unit-number hold region and clearing of the erasure-unit-number validation region are effected, thereby rendering the erasure-block buffer 103 available again. Processing proceeds to step S1708, where the previous state of the write buffer 402 is recovered.

In a case where in step S1705 it is determined that the data recorded in the erasure-block buffer 103 are correct, in step S1706 an erasure instruction is sent to the erasure instruction means 301, wherewith there is deleted the erasure-unit region which corresponds to the erasure-block buffer 103 and is stored in the flash memory 101. The details of the erasure instruction are the same as those of the erasure instruction described in connection with the first embodiment. A write instruction is sent to the write means 302, to thereby write, into a region of the flash memory 101 from which data have been deleted, data identical with those stored in the erasure-block buffer 103. The write instruction is identical with that employed in the first embodiment.

In step S1707, clearing of the erasure-unit-number hold region of the erasure-block-buffer management region 6051 and clearing of the erasure-unit-number validation region of the same are effected.

After recovery of the previous state of the erasure-block buffer 103 has been completed through processing pertaining to steps S1702 through S1707, in step S1708 the region information is read from the write buffer management region 6052.

Next, there will be described processing pertaining to steps S1709 and S1710. The processing is identical with the processing pertaining to steps S1688 and S1689 which has been described in connection with the sixteenth embodiment.

In a case where in step S1709 it is determined that the region information stored in the write buffer management region 6052 is inappropriate, or in a case where in step S1710 the data recorded in the write buffer 402 are found to be incorrect, it is considered that power supply has been interrupted during the course of data being written into the write buffer 402. In step S1716, the region information is deleted from the write buffer management region 6052, thereby rendering the write buffer 402 available again.

In a case where in step S1710 it is determined that the data recorded in the write buffer 402 are correct, in step S1711 the data that correspond to the region information and are recorded in the write buffer 402 are written into the erasure-block buffer 103.

In step S1712, a save instruction is issued to the save means 112. The save instruction is identical with that employed in the first embodiment. The save means 112 that has received the save instruction saves non-changing data recorded in the erasure unit by means of writing the non-changing data into the erasure-block buffer 103.

In step S1713, the data stored in the erasure-block-buffer management region 6051 are updated. Namely, an erasure-unit number is written into the erasure-unit-number hold region as well as into the erasure-unit-number validation region, to thereby write, into the erasure-block-buffer management region 6051, a data check value pertaining to the data that have been written into the erasure-block buffer 102 in steps S1711 and S1712.

In step S1714, an erasure instruction is sent to the erasure instruction means 301, to thereby delete an erasure-unit region which corresponds to the erasure-block buffer 301 and is provided in the flash memory 101. The erasure instruction is identical with that described in connection with the first embodiment. A write instruction is sent to the write means 302, to thereby copy the data recorded in the erasure-block buffer 103 into the area from which the data have been deleted. The write instruction is identical with that described in connection with the first embodiment.

In step S1715, clearing of the erasure-unit-number hold region of the erasure-block-buffer management region 6051 and clearing of the erasure-unit-number validation region of the same are effected.

In step S1716, the region information read in step S1708 is deleted from the write buffer management region 6052, to thereby render the corresponding region of the write buffer 402 available again.

In step S1717, a determination is made as to whether or not the region information read in step S1708 corresponds to the final portion of the region information registered in the write buffer management region 6052 of the buffer management region 605.

In a case where the thus-read region information is not the final portion of the region information registered in the write buffer management region 6052, the next portion of region information is subjected to processing pertaining to steps S1708 through S1717.

In a case where the thus-read region information is the final portion, no data remain in the write buffer 402, and hence processing is terminated.

According to the present embodiment, at the time of recovery of the data processing device, the data stored in the erasure-block buffer 103 and the data stored in the write buffer 402 are written into the flash memory 101. Unless data are written into memory after recovery, there can be prevented corruption of data which would otherwise be caused by a failure in the nonvolatile memory 102.

Eighteenth Embodiment

Figure 51:
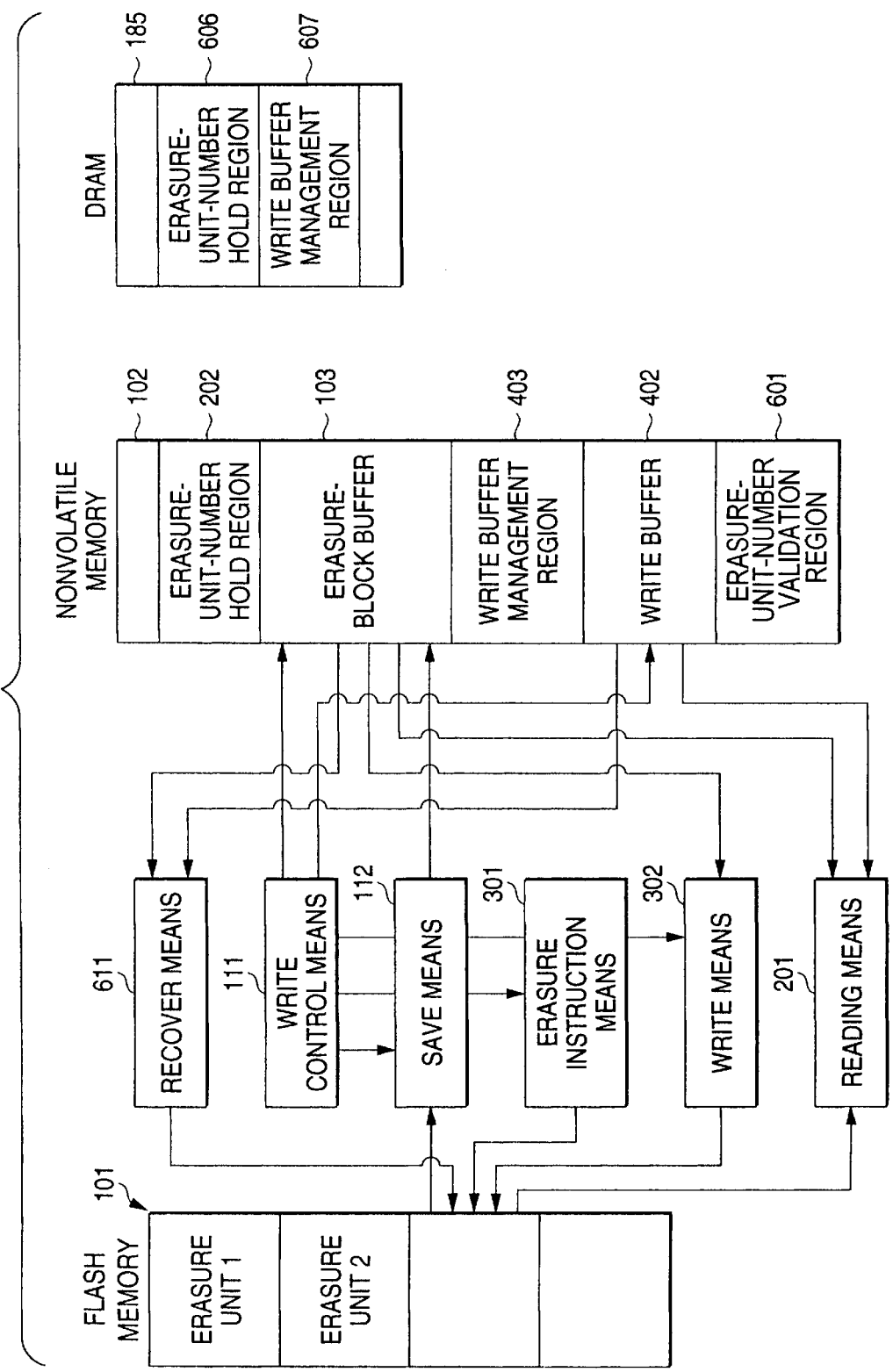
FIG. 51 is a block diagram showing the outline of a data processing device according to an eighteenth embodiment of the present invention.

FIG. 51 is a block diagram showing the configuration of a data processing device according to an eighteenth embodiment of the present invention. In the drawing, reference numeral 185 designates DRAM corresponding to nonvolatile memory. The DRAM 185 has an erasure-unit-number hold region 606 and a write buffer management region 607. The erasure-unit-number hold region 606 retains a value which is the same as that stored in the erasure-unit-number hold region 202 of the nonvolatile memory 102. Further, the write buffer management region 607 retains a value which is the same as that stored in the write buffer management region 403 of the nonvolatile memory 102. The DRAM 185 can write and read data as a speed higher than that at which the nonvolatile memory 102 reads and writes data.

In the drawing, reference numeral 611 designates recovery means which is to be activated at the time of startup of the data processing device. The data processing device is identical in configuration with or corresponds to that shown in FIG. 8, and repeated explanation is omitted.

Figure 52:
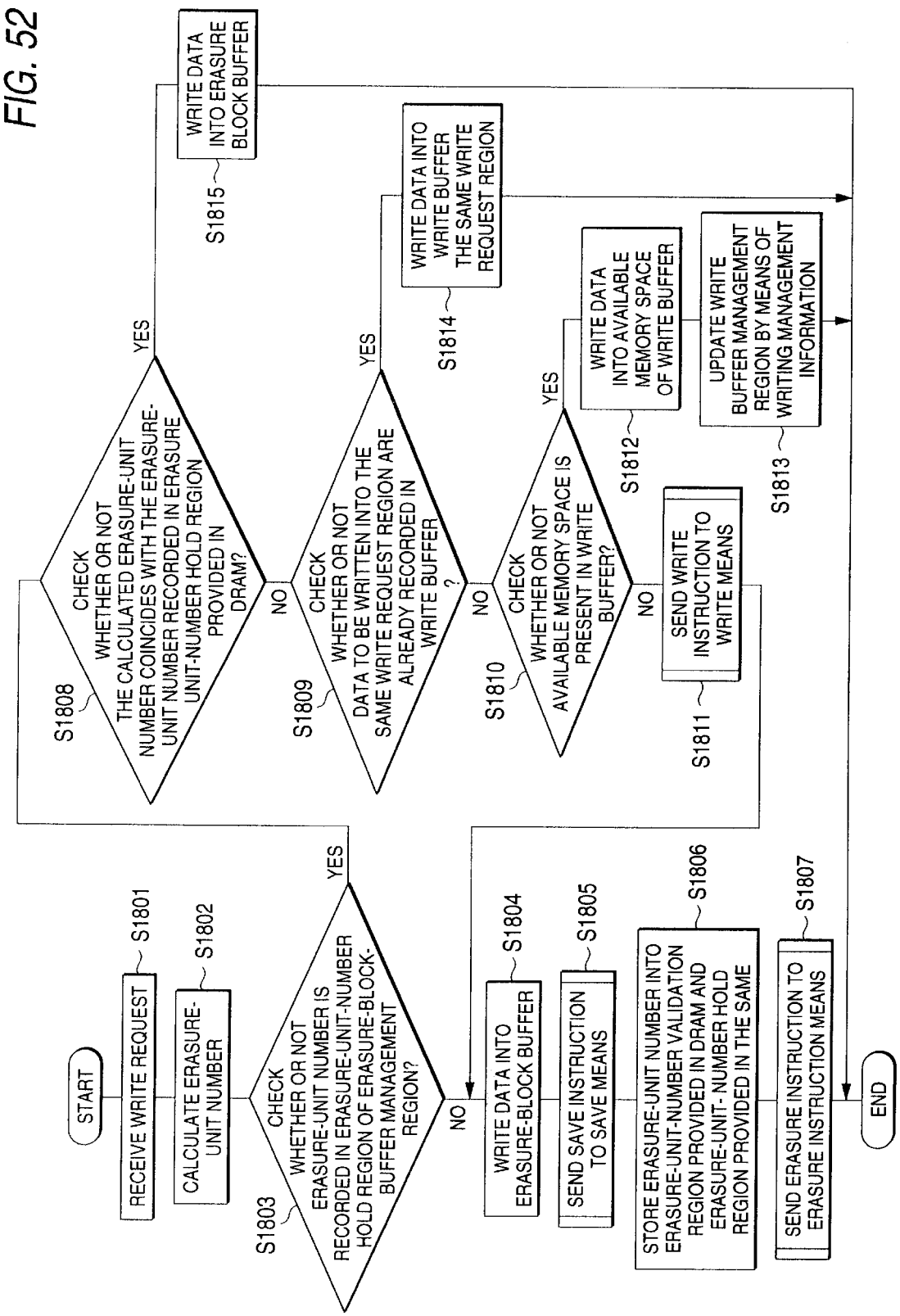
FIG. 52 is a flowchart showing the operation of the data processing device according to the eighteenth embodiment performed for rewriting the data stored in flash memory.

The operation of the data processing device according to the present embodiment performed when data are written into memory will be described, by reference to FIG. 52. Unless otherwise specified, the write control means 111 performs the following processing operations.

Processing pertaining to steps S1801 and S1802 is analogous to that performed in the fourth embodiment.

In step S1803, a determination is made as to whether or not an erasure-unit number is recorded, by reference to the erasure-unit-number hold region 606 on the DRAM 185.

If an erasure-unit number is not recorded, in step S1804 the write control means 111 writes write request data into the erasure-block buffer 103.

In step S1805, a save instruction is sent to the save means 112. Details of the save instruction and the operation of the save means 112 are the same as those described in connection with the fourth embodiment.

In step S1806, the erasure-unit number determined in step S1802 is recorded in the erasure-unit-number hold region 202 of the nonvolatile memory 102 as well as in the erasure-unit-number hold region 606 of the DRAM 185. Writing data into the DRAM 185 corresponds to processing pertaining to step S1851 shown in FIG. 54.

In step S1807, an erasure instruction is sent to the erasure instruction means 301. Details of the erasure instruction and the operation of the erasure instruction means 301 are the same as those described in connection with the fourth embodiment.

In a case where in step S1803 it is determined that an erasure-unit number is recorded in the erasure-unit-number hold region 606 of the DRAM 185, in step S1808 a determination is made as to whether or not the erasure-unit number determined in step S1802 coincides with that recorded in the erasure-unit-number hold region 606.

In a case where in step S1808 it is determined that the erasure-unit number differs from that recorded in the erasure-unit-number hold region 606, in step S1809 a determination is made as to whether or not the data to be written into a region identical with the write request region are already recorded in the write buffer 401, by reference to the write buffer management region 607 provided in the DRAM 185 and on the basis of the information recorded i the write buffer management region 607. Such a determination can be made on the basis of the erasure-unit number recorded in the write buffer management region 607 of the DRAM 185, an offset range within the erasure unit, and the size of write data.

In a case where in step S1809 it is determined that the data to be written into a region identical with the write request region are not recorded in the write buffer 402, in step S1810 the write control means 111 determines whether or not an available memory space into which write request data can be written is present in the write buffer 402. The presence of a available memory space can be determined on the basis of the information recorded in the write buffer management region 607 of the DRAM 185.

In a case where it is determined that no available memory space is present in the write buffer 402, in step S1811 the write control means 111 sends a write instruction to the write means 302. Details of the write instruction and the operation of the write means 302 are the same as those described in connection with the fourth embodiment.

Subsequently, processing pertaining to step S1804 through S1807 is performed, as in the case where an erasure-unit number is not recorded.

In contrast, in a case where in step S1810 it is determined that an available memory space is present in the write buffer 402, in step S1812 write data are written into the write buffer 402.

In step S1813, management information pertaining to the write data written in step S1812 is recorded in the write buffer management region 403 of the nonvolatile memory 102 and in the buffer management region 607 of the DRAM 185. As the management information, there are recorded an erasure-unit number, an offset for specifying a position in the erasure-unit number, and the size of write data. Recording the management information pertaining to the write data into the DRAM 185 corresponds to processing pertaining to step S1852 shown in FIG. 54.

In a case where in step S1809 it is determined that data to be written into a region identical with the write request region are already recorded, in step S1814 the write data are written into an area of the write buffer 402 in which the data are already recorded.

In a case where in step S1808 it is determined that the erasure-unit number calculated in step S1802 coincides with the erasure-unit number stored in the erasure-unit-number hold region 606 of the DRAM 185, in step S1815 the write request data are written into the erasure-block buffer 103.

Figure 53:
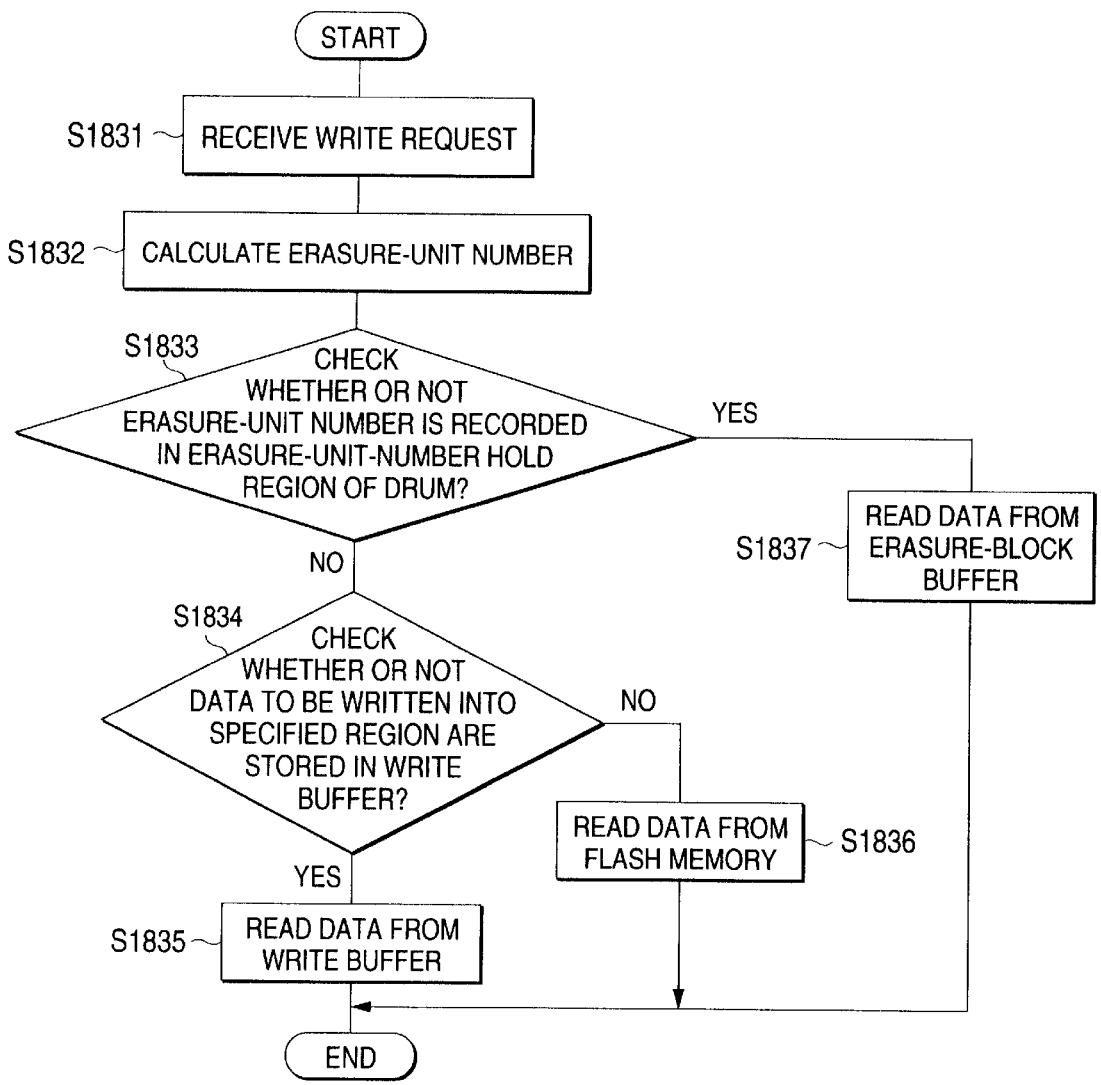
FIG. 53 is a flowchart showing the operation of the data processing device according to the eighteenth embodiment of the present embodiment performed when data are read.

The operation of the data processing device performed when data are read from memory will now be described by reference to FIG. 53. Unless otherwise specified, the reading means 201 performs the following processing operations.

Processing pertaining to steps S1831 and S1832 is identical with that described in connection with the fourth embodiment.

In step S1833, a determination is made whether or not an erasure-unit number is recorded in the erasure-unit-number hold region 606 of the DRAM 185.

In a case where in step S1833 it is determined that no erasure-unit number is recorded, in step S1834 a determination is made as to whether or not the data to be written into the region specified as a read request region are recorded in the write buffer 402, by reference to the management information stored in the write buffer management region 607 of the DRAM 185.

In a case where in step S1834 it is determined that the data to be written into the region specified as a read request region are recorded in the write buffer 402, in step S1835 the data are read from the write buffer 402.

In contrast, in a case where in step S1834 it is determined that the data to be written into the region specified as a read request region are not recorded in the write buffer 402, in step S1836 read data are read from the flash memory 101.

In a case where in step S1833 it is determined that an erasure-unit number is recorded in the erasure-unit-number hold region 606 of the DRAM 185 and where the erasure-unit number determined in step S1832 coincides with the erasure-unit number recorded in the erasure-unit-number hold region 606, the data pertaining to the read region are held in the erasure-block buffer 103. Hence, in step S1837 the read data are read from the erasure-block buffer 103.

The foregoing operations are to be performed by the data processing device when data are read from memory.

Figure 54:
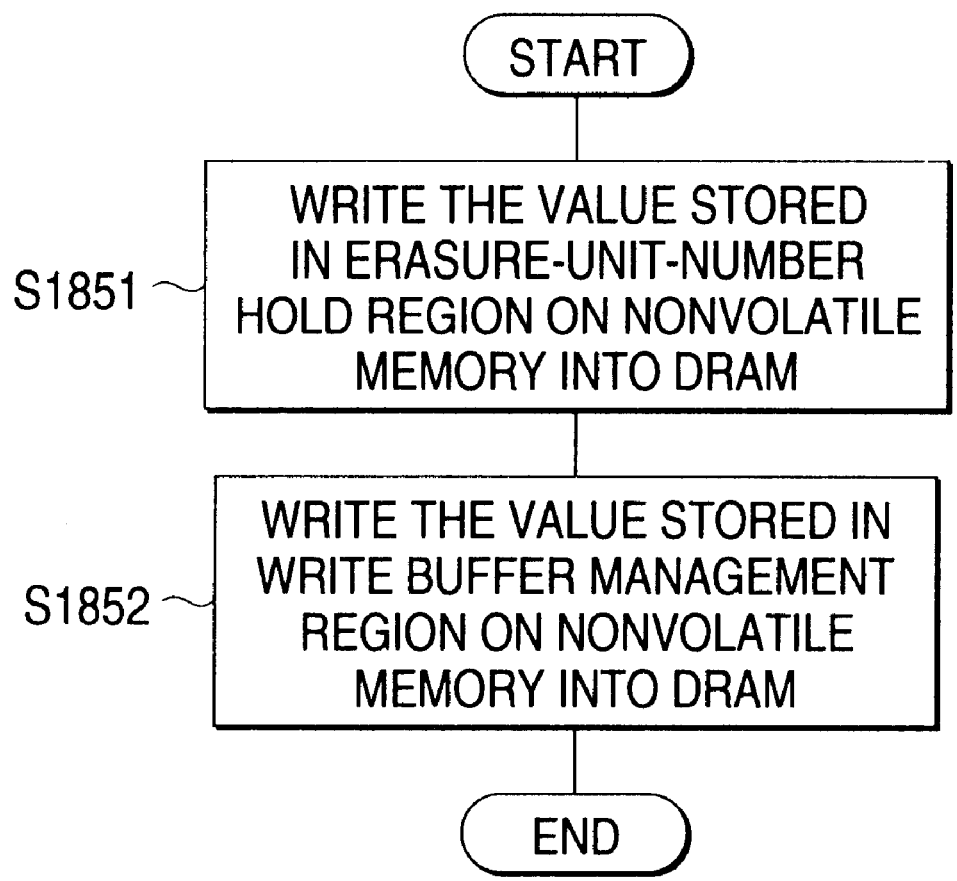
FIG. 54 is a flowchart showing the operation of the data processing device performed for writing data into DRAM 152.

The operation of the recovery means 611 will now be described by reference to FIG. 54.

In step S1851, the recovery means 611 writes data—which are identical with those written in the erasure-unit-number hold region 202 of the nonvolatile memory 102—into the erasure-unit-number hold region 606 of the DRAM 185. The reason for this is that the DRAM 185 is nonvolatile memory and the data stored in the DRAM 185 are deleted when the data processing device is re-activated.

In step S1852, data identical with those written in the write buffer management region 403 of the nonvolatile memory 102 are written into the write buffer management region 607 of the DRAM 185.

The foregoing operations are to be performed by the recovery means 611. After completion of operation of the recovery means 611, the data recorded in the erasure-unit-number hold region 202 of the nonvolatile memory 102 become identical with those recorded in the erasure-unit-number hold region 606 of the DRAM 185, and the data recorded in the write buffer management region 403 of the nonvolatile memory 102 become identical with those recorded in the write buffer management region 607 of the DRAM 185.

As mentioned above, in the present embodiment, an erasure-unit-number hold region and a write buffer management region are provided in the nonvolatile memory 102 as well as on the DRAM 185 which operates faster than does the nonvolatile memory 102. Data are read from the erasure-unit-number hold region and the write buffer management region, which are provided in the DRAM 185. Data are written into the erasure-unit-number hold region and the write buffer management region, which are provided in the DRAM 18, as well as into the erasure-unit-number hold region and the write buffer management region, which are provided in the nonvolatile memory 102. At the time of recovery of the data processing device, the data recorded in the nonvolatile memory 102 are copied to the DRAM 185. Accordingly, the data processing device can quickly write data into memory and read data from memory without involvement of corruption of the data stored in the erasure-unit-number hold region and the data stored in the write buffer management region, which would otherwise be caused by interruption of power supply.

Nineteenth Embodiment

A data processing device according to a nineteenth embodiment of the present invention will now be described. The data processing device is identical in configuration with the data processing device shown in FIG. 12 which has been described in connection with the fifth embodiment.

The operation of the data processing device according to the present embodiment performed when data are written will now be described by reference to FIG. 55. Unless otherwise specified, the write control means 111 performs the following processing operations.

Figure 13:
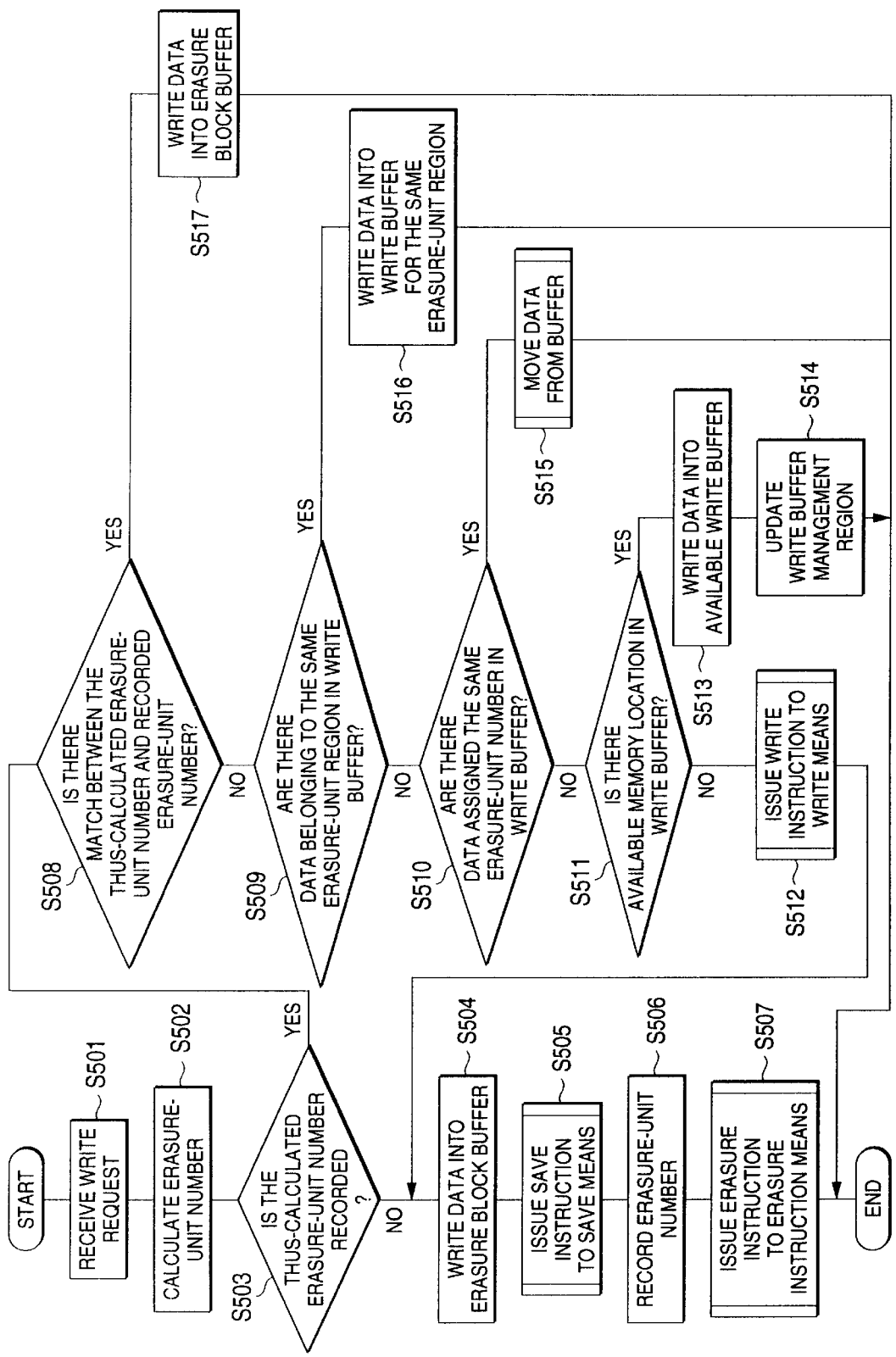
FIG. 13 is a flowchart showing the operation of a data processing device of the fifth embodiment for rewriting data stored in flash memory.
Figure 14:
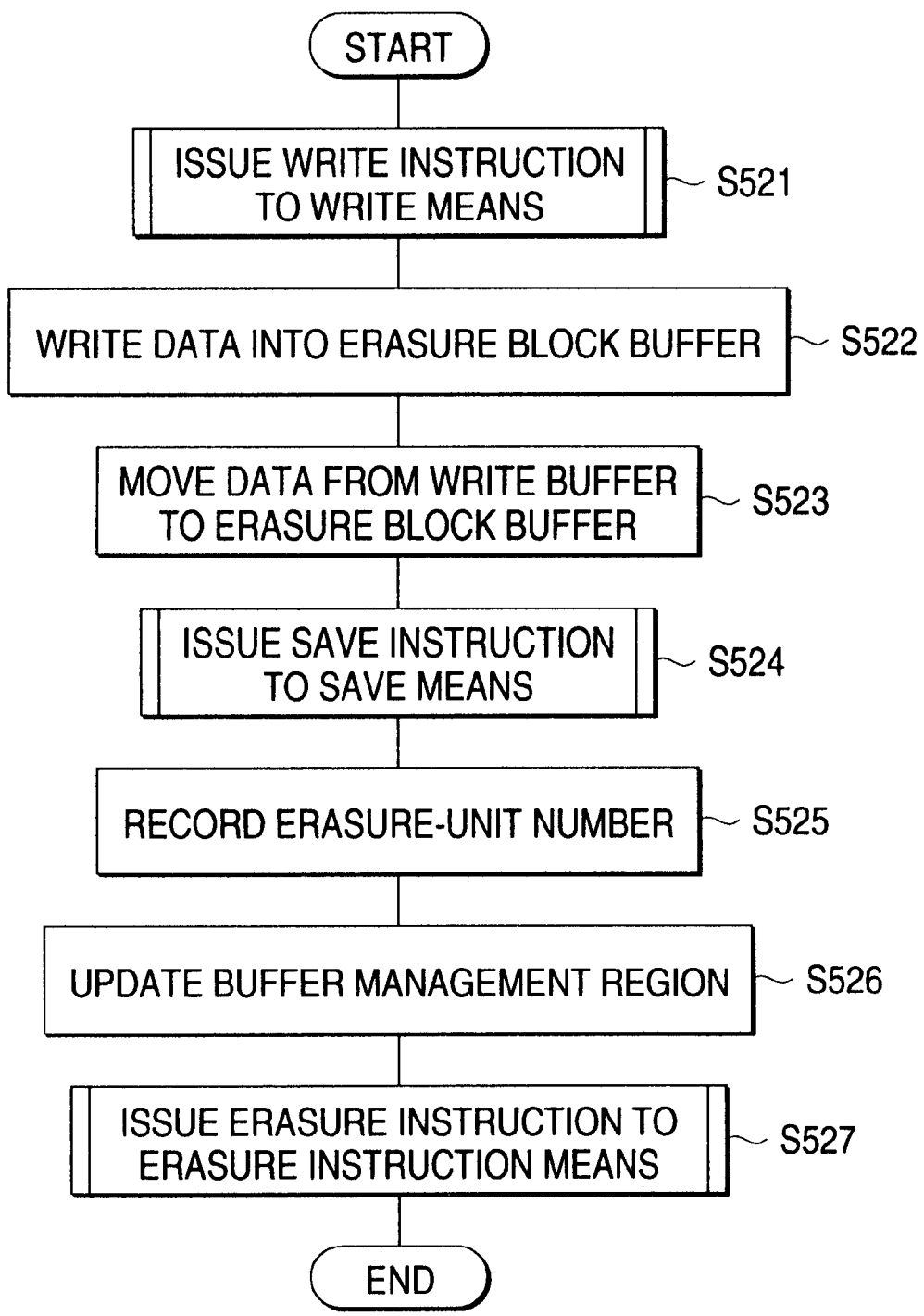
FIG. 14 is a flowchart showing the operation of the data processing device for performing buffer data movement processing pertaining to steps S515 and S620.
Figure 55:
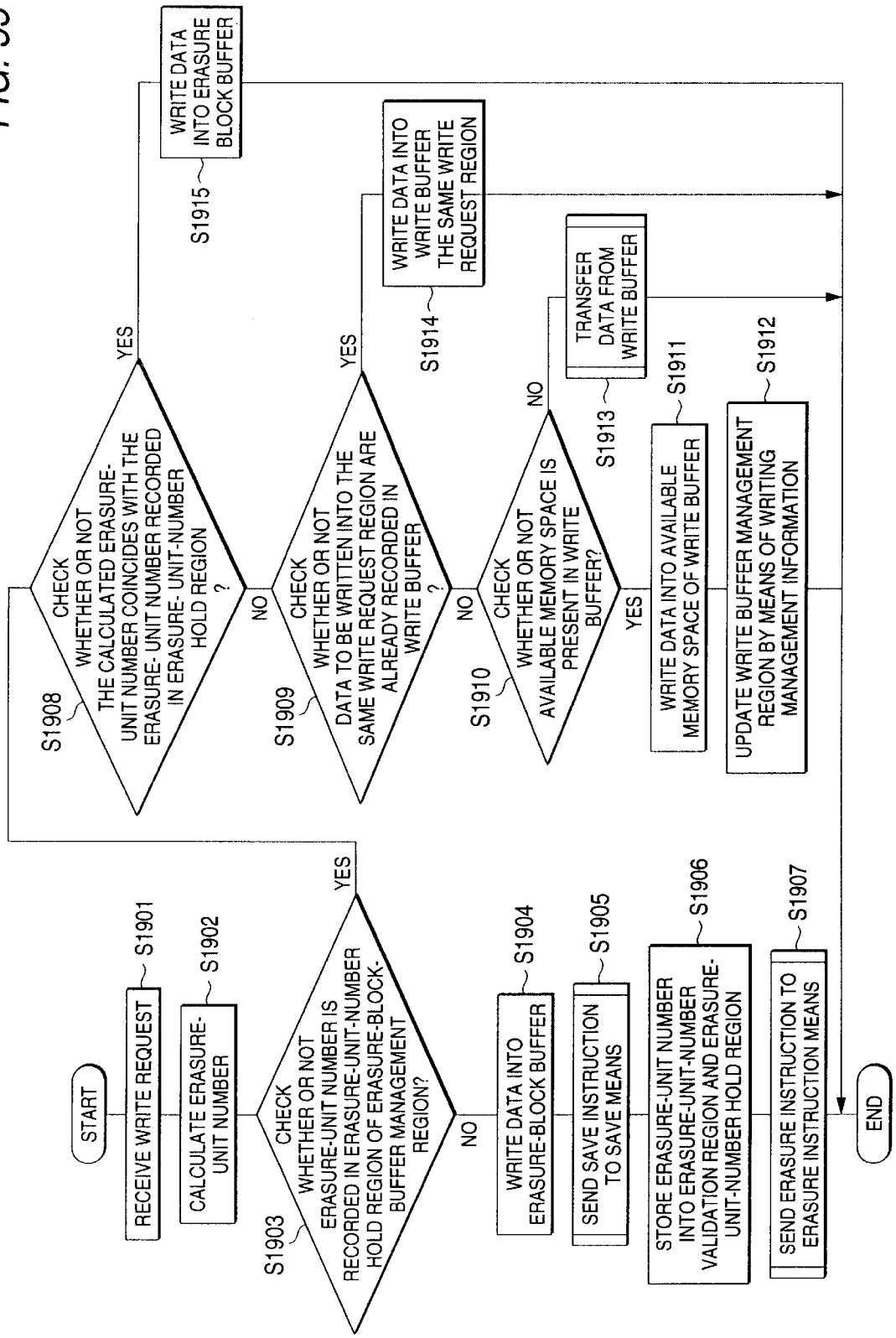
FIG. 55 is a flowchart showing the operation of the data processing device according to a nineteenth embodiment performed for rewriting the data stored in flash memory.

In FIG. 55, processing pertaining to steps S1901 through S1910 and steps S1914 and S1915 is identical with processing according to the fifth embodiment (i.e., processing pertaining to steps S501 through S510 and S516 and S517 shown in FIG. 13), and repeated explanations are omitted.

The present embodiment differs from the fifth embodiment in that processing pertaining to steps S1911, S1912, and S1913 follow processing pertaining to step S1910. Explanation of primarily the difference will be given.

Processing pertaining to steps S1901 through S1910 is performed in the same manner as in the fifth embodiment.

In a case where in step S1910 it is determined that an available memory space is present, in step S1911 the write control means 111 writes write data into an available memory space of the write buffer 402. In step S1912, an erasure-unit number, an offset in the erasure-unit number, and the size of write data are recorded as management information in the write buffer management region 403. After completion of processing pertaining to step S1912, processing is terminated.

In a case where in step S1910 it is determined that no available memory space is present in the write buffer 402, a buffer data transfer operation is performed in step S1913.

Figure 56:
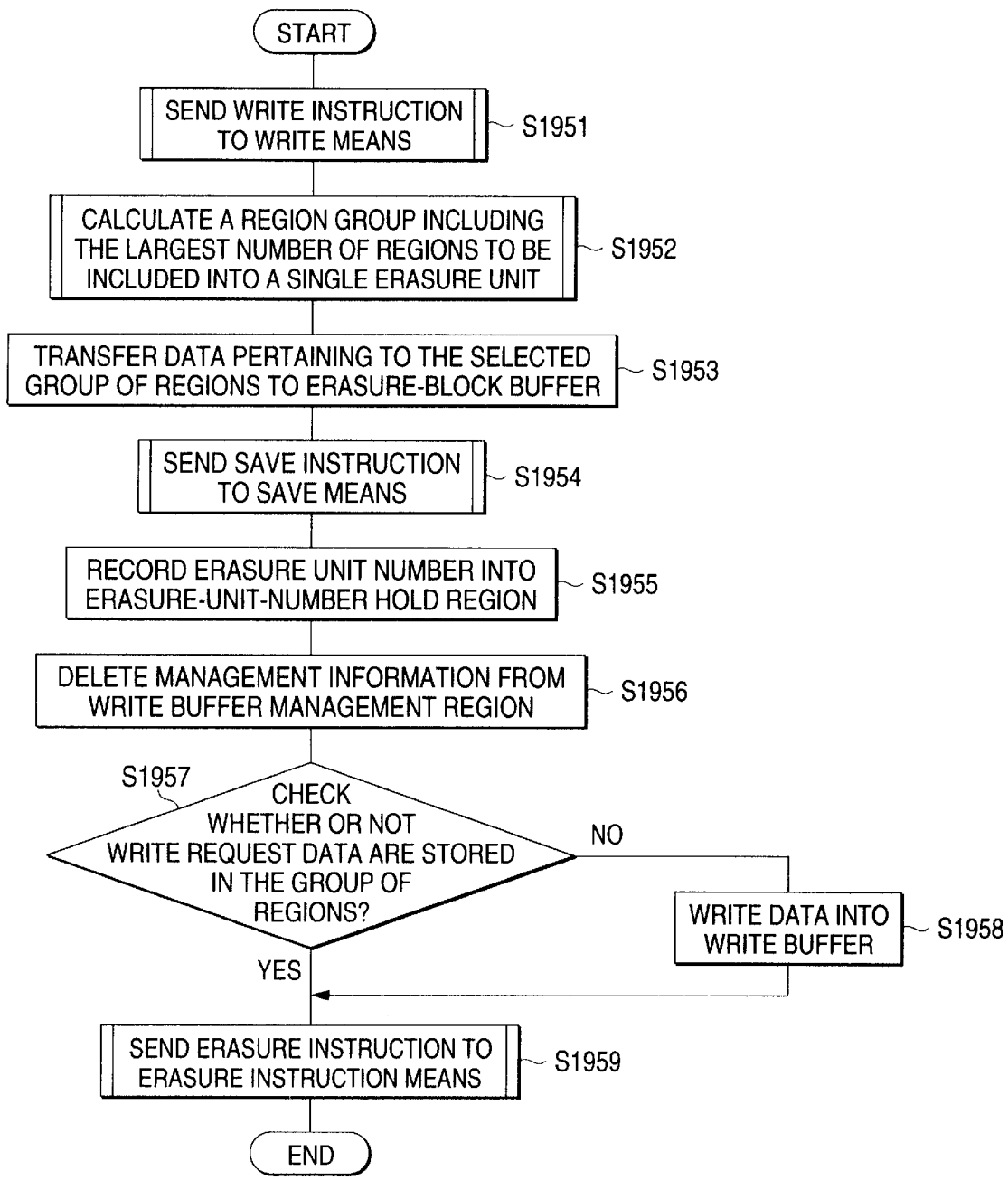
FIG. 56 is a flowchart showing the operation of the data processing device required for effecting a buffer data transfer operation.

Buffer data transfer operation of the data processing device will now be described by reference to FIG. 56. Unless otherwise specified, the write control means 111 performs the following processing operations.

In step S1951, the data that are currently registered in the erasure-block buffer 103 are written into the flash memory 101.

In step S1952, from the regions registered in the write buffer management region 403 and the write request data, there are retrieved a group of regions of the largest size, provided that the regions are grouped according to presence in a single erasure unit.

For example, it is assumed that two regions to be included in erasure-unit number 1 are recorded in the write buffer 402, one region having a size of 100 bytes and the other region having a size of 200 bytes. It is also assumed that three regions to be included in erasure-unit number 2 are recorded in the write buffer 402, one having a size of 10 bytes, another having a size of 20 bytes, and the last one having a size of 30 bytes, and that write request data have a size of 50 bytes and are to be written into erasure-unit number 3. In this case, a group of regions belonging to erasure-unit number 1 have the largest size, at 300 bytes, and hence the two regions belonging to this region group are selected in step S1952.

In step S1953, buffer transfer means 501 transfers to the erasure-block buffer 103 data pertaining to the group of regions, the regions having been selected in step S1952 from the data recorded in the write buffer 302 and the write request data.

In step S1954, a save instruction is sent to the save means 112. The save means 112 that has received a save instruction saves non-changing data, which are data other than the data written into the erasure-block buffer 103 in step S1953, from the erasure unit of the flash memory 101. In step S1955, an erasure-unit number is recorded in the erasure-unit-number hold region 202.

In step S1956, the write control means 111 deletes, from the write buffer management region 403, the management information pertaining to the group of regions which have been transferred to the erasure-block buffer 103 in step S1953.

In step S1957, a determination is made as to whether or not write request data are included in the group of regions selected in step S1952. If no write request data are included in the group of region, in step S1958 write request data are written into an available memory space in the write buffer 402, the space being formed through processing pertaining to step S1956, and management information pertaining to the write request data is registered in the write buffer management region 403.

In step S1959, an erasure instruction is sent to the erasure instruction means 301. Upon receipt of the erasure instruction, the erasure instruction means 301 sends an instruction to the flash memory 101 such that the erasure unit saved in the erasure-block buffer 103 is deleted.

The foregoing operations are to be performed when data are written into memory.

In the present embodiment, at the time of reading data, the data processing device performs the same operation as in the fourth embodiment.

As mentioned above, in the present embodiment, a write buffer and write request data are grouped according to regions to be included in a single erasure unit of the flash memory 101. A group of regions having the largest size are moved to the erasure-block buffer 103, to thereby efficiently increase an available memory space in the write buffer 402. Accordingly, the number of times data are written into the flash memory 101 can be reduced, as can deterioration in the flash memory 101.

Twentieth Embodiment

A data processing device according to a twentieth embodiment of the present invention will now be described. The data processing device is identical in configuration with that described in connection with the fifth embodiment. As shown in FIG. 12, the data processing device according to the present embodiment operates in the same manner as in the nineteenth embodiment, except for a buffer transfer operation to be performed at the time of writing data into memory.

A buffer data transfer operation, which would be performed when no available memory space is present in the write buffer 402, will now be described by reference to FIG. 57. Unless otherwise specified, the write control means 111 performs the following processing operations.

Figure 57:
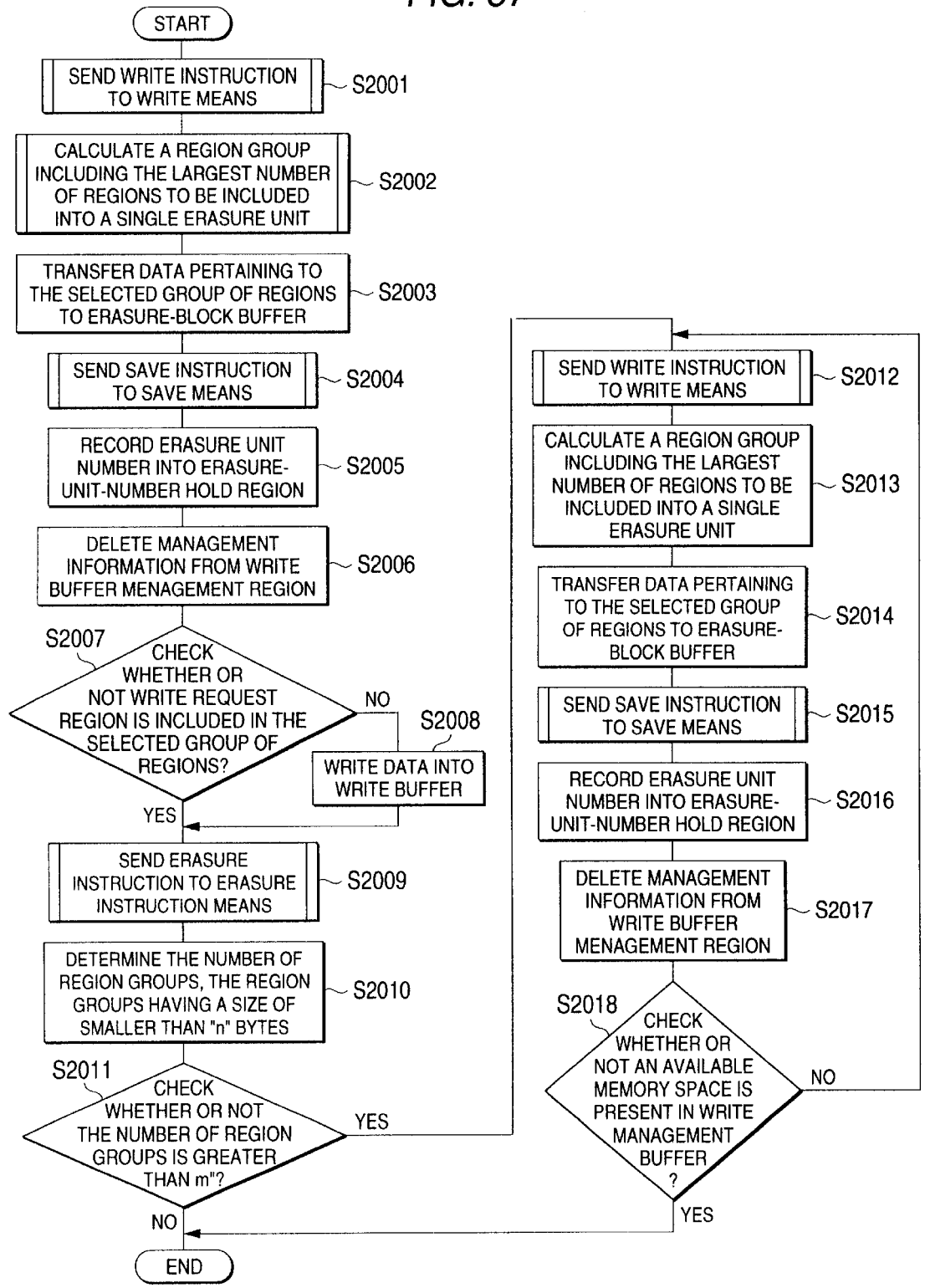
FIG. 57 is a flowchart showing the buffer data transfer operation of the data processing device according to a twentieth embodiment.

In FIG. 57, processing pertaining to steps S2001 through S2009 is identical with that described in connection with the nineteenth embodiment (i.e., processing pertaining to steps S1951 through S1959 shown in FIG. 56), and hence repeated explanation is omitted.

In the present embodiment, processing pertaining steps S2010 through S2018 follow processing pertaining to step S2009.

Processing pertaining to steps S2001 through S2009 is performed in the same manner as is processing pertaining to steps S1951 through S1959 according to the nineteenth embodiment.

In step S2010, by means of retrieval through the write buffer management region 403, the write control means 111 examines the number of region groups having a size smaller than "n" bytes, provided that the regions registered in the write buffer management region 403 are grouped according to presence in a single erasure unit.

In step S2011, a determination is made as to whether or not the number of groups examined in step S2010 is greater than "mm." In a case where the number of groups is not greater than "m," processing is then terminated.

In a case where in step S2011 the number of groups is greater than "m," the write buffer 402 is made empty.

In step S2012 the write control means 111 sends a write instruction to the write means 302, to thereby write into the flash memory 101 the data recorded in the erasure-block buffer 103.

In step S2013, by means of retrieval through the write buffer management region 403, a group of regions having the largest size are selected from regions registered in the write buffer management region 403, provided that the regions are grouped according to presence in a single erasure unit.

In step S2014, the buffer transfer means 501 transfers from the data recorded in the write buffer 402 to the erasure-block buffer 103 data pertaining to the group of regions selected in step S2013.

In step S2015, a save instruction is sent to the save means 112. Upon receipt of the save instruction, the save means 112 saves, from the corresponding erasure unit in the flash memory 101, non-changing data which are data other than the data pertaining to the regions written into the erasure-block buffer 102 in step S2014. In step S2016, an erasure-unit number is recorded in the erasure-unit-number hold region 202.

In step S2017, the write control means 111 deletes, from the write buffer management region 403, region information pertaining to the group of regions transferred to the erasure-block buffer 103 in step S2014.

In step S2018, a determination is made as to whether or not the registered management information still remains, by means of retrieval through the write buffer management region 403 updated in step S2017. In a case where the registered management information is found to still remain, processing pertaining to steps S2012 through S2018 is repeated.

In a case where no registered management information is found to remain, processing is terminated. As a result, no data remain in the write buffer 402.

As mentioned above, in the present embodiment, in a case where no available memory space is present in the write buffer 402, the data recorded in the write buffer 402 are transferred to the erasure-block buffer 103. Then, by means of retrieval through the write buffer management region 403, a determination is made as to whether or not the number of region groups having a size smaller than "n" bytes is greater than "m," provided that the regions registered in the write buffer management region 403 are grouped according to presence in a single erasure unit. If the number of region groups is greater than "m," the write buffer 402 is made empty, to thereby forcefully preclude write data of small sizes from the write buffer 402. Accordingly, an available memory space in the write buffer 402 can be increased more efficiently than in the nineteenth embodiment, thereby reducing the number of times data are written into the flash memory 101.

The present invention has been embodied in the manner as mentioned above and yields the following advantages.

The present invention is embodied by a data storage method by which data recorded in memory are rewritten through use of memory having a plurality of erasure-unit regions into which data are written in predetermined units and from which data are erased in predetermined units, as well as through use of a nonvolatile erasure block buffer for storing write data to be written into the erasure-unit regions and non-changing data belonging to the erasure-unit regions, the method comprising:

a first erasure block buffer write step of writing first write data into the erasure block buffer, in response to a first write request for requesting writing of the first write data into a first erasure-unit region of the memory;

a second erasure block buffer write step of writing into the erasure block buffer non-changing data recorded in the first erasure-unit region, in response to the first write request for requesting writing of the first write data into the first erasure-unit region of the memory;

an erasure step of erasing the data from the first erasure-unit region after the second erasure block buffer write step; and a memory write step of writing into the first erasure-unit region the first write data and the non-changing data stored in the erasure block buffer. Therefore, even if supply of power to a data processing device is interrupted during a period from the time non-changing data are erased from the memory until before first write data are written into the memory, loss of the non-changing data and the first write data is prevented, thus improving the reliability of rewriting of data stored in the memory.

Further, the present invention is embodied by a data storage method by which data stored in memory are rewritten through use of memory having a plurality of erasure-unit regions into which data are written in predetermined units and from which data are erased in predetermined units, as well as a nonvolatile erasure block buffer for storing write data to be written into the erasure-unit regions and non-changing data belonging to the erasure-unit regions, the method comprising:

a first erasure block buffer write step of writing first write data into the erasure block buffer, in response to a first write request for requesting writing of the first write data into a first erasure-unit region of the memory;

a second erasure block buffer write step of writing into the erasure block buffer non-changing data recorded in the first erasure-unit region, in response to the first write request for requesting writing of the first write data into the first erasure-unit region of the memory;

a third erasure block buffer write step of writing second write data into the memory, in response to a second write request for requesting writing of the second write data into the memory, after the first erasure block buffer write step; and a memory write step of writing the data written in the erasure block buffer into the first erasure-unit region after the second erasure block buffer write step and the third erasure block buffer write step. Even if a plurality of write requests are issued, data can be collectively written into the first erasure-unit region, thus preventing the deterioration of the memory.

Preferably, the first erasure block buffer write step is followed by a comparison step of comparing the erasure-unit region into which the first write data are to be written with the erasure-unit region into which the second write data are to be written, and, in a case where a match is obtained as a comparison result in the comparison step, processing pertaining to the third erasure block buffer write step and processing pertaining to the memory write step are performed. Even in a case where requests for writing data into a single erasure-unit region are continuously issued, writing of data into the single erasure-unit region can be collectively effected, thus preventing deterioration of the memory.

Still further, the present invention is embodied by a data storage method by which data recorded in memory are rewritten through use of memory having a plurality of erasure-unit regions into which data are written in predetermined units and from which data are erased in predetermined units, as well as an erasure block buffer for storing write data to be written into the erasure-unit regions and non-changing data belonging to the erasure-unit regions, the method comprising:

a first erasure block buffer write step of writing first write data into the erasure block buffer, in response to a first write request for requesting writing of the first write data into a first erasure-unit region of the memory;

a second erasure block buffer write step of writing into the erasure block buffer non-changing data recorded in the first erasure-unit region, in response to the first write request for requesting writing of the first write data into the first erasure-unit region of the memory;

an erasure step of erasing the data from the first erasure-unit region after the second erasure block buffer write step; and a memory write step of writing the data stored in the erasure block buffer into the first erasure-unit region from which the data have been erased in the erasure step, in response to a second write request for requesting writing of second write data into the memory. Since there is eliminated a necessity for performing pertaining to the erasure step when processing pertaining to the memory write step is performed, thereby shortening the time required for performing processing pertaining to the memory write step.

Preferably, the erasure step is followed by a comparison step of comparing the erasure-unit region into which the first write data are to be written with the erasure-unit region into which the second write data are to be written, and, in a case where a match is obtained as a comparison result in the comparison step, processing pertaining to the memory write step is performed. Accordingly, the time required for performing processing pertaining to the memory write step can be shortened.

Furthermore, the present invention is embodied by a data storage method by which data recorded in memory are rewritten, through use of memory having a plurality of erasure-unit regions into which data are written in predetermined units and from which data are erased in predetermined units, a nonvolatile erasure block buffer for storing write data to be written into the erasure-unit regions and non-changing data belonging to the erasure-unit regions, and a write buffer for storing the write data without storing the non-changing data, the method comprising:

an erasure block buffer write step of writing into the erasure block buffer first write data and the non-changing data stored in a first erasure-unit region of the memory, in response to a first write request for requesting writing of the first write data into the first erasure-unit region of the memory;

a first write buffer write step of writing second write data into the write buffer, in response to a second write request for requesting writing of the second write data into a second erasure-unit region of the memory, after the erasure block buffer write step; and a second write buffer write step of writing third write data into the write buffer, in response to a third write request for requesting writing of the third write data into an erasure-unit region of the memory, after the first write buffer write step. The data storage method of the present invention enables utilization of a buffer more effectively than a data storage method employing erasure block buffers for use with second and third write requests.

Preferably, the data storage method further comprises a comparison step of comparing a write request region for specifying a location in the memory in which the second write data are to be written with a write request region for specifying a location in the memory in which the third write data are to be written, and, in a case where the write request region into which the third write data are to be written is included in the write request region in which the second write data are to be written, in the second write buffer write step the third write data are written over the area of the write buffer in which the second write data are written. Accordingly, the number of times data are written over the memory can be diminished, thus enabling prevention of deterioration of the memory.

The present invention is also embodied by a data storage method by which data recorded in memory are rewritten through use of memory having a plurality of erasure-unit regions into which data are written in predetermined units and from which data are erased in predetermined units, a nonvolatile erasure block buffer for storing write data to be written into the erasure-unit regions and non-changing data belonging to the erasure-unit regions, and a write buffer for storing the write data without storing the non-changing data, the method comprising:

a first erasure block buffer write step of writing into the erasure block buffer first write data and the non-changing data stored in a first erasure-unit region of the memory, in response to a first write request for requesting writing of the first write data into the first erasure-unit region of the memory;

a first write buffer write step of writing second write data into the write buffer, in response to a second write request for requesting writing of the second write data into a second erasure-unit region of the memory, after the first erasure block buffer write step;

a memory write step of writing into the first erasure-unit region the first write data written in the erasure block buffer and the non-changing data after the first write buffer write step, in a case where there arises a third write request for requesting writing third write data into an erasure-unit region of the memory; and a second erasure block buffer write step of writing into the erasure block buffer the second write data, the third write data, and the non-changing data stored in the second erasure-unit region, after the memory write step. Writing of a plurality of write data sets and non-changing data is collectively performed in the block buffer write step, thus reducing the number of times data are written into memory. Accordingly, deterioration of memory can be reduced.

Preferably, the first erasure block buffer write step is followed by a comparison step of comparing the erasure-unit region into which the second write data are to be written with the erasure-unit region into which the third write data are to be written, and, in a case where a match is obtained as a comparison result in the comparison step, processing pertaining to the third erasure block buffer write step and processing pertaining to the memory write step are performed. Writing of a plurality of write data sets belonging to the same erasure-unit region can be collectively performed, thus reducing the number of times data are written into the memory.

The present invention is embodied by a data processing device which includes memory having a plurality of erasure-unit regions into which data are written in predetermined units and from which data are erased in predetermined units, and erasure means for erasing the data stored in the erasure-unit regions in the predetermined units and which rewrites the data stored in the erasure-unit region through use of first write data, the processing device comprising:

a nonvolatile block buffer which permits writing of data in arbitrary units;

write data write means for writing the first write data into the erasure block buffer;

save means for writing, into the erasure block buffer, non-changing data which are not to be rewritten by the first write data from among the data stored in the erasure-unit region of the memory; and memory write means for writing the first write data and the non-changing data, both data sets being written into the erasure block buffer, into the erasure-unit region from which the data have been erased by the erasure means. Therefore, even if supply of power to a data processing device is interrupted during a period from the time non-changing data are erased from the memory until before first write data are written into the memory, loss of the non-changing data and the first write data is prevented, thus improving the reliability of rewriting of data stored in the memory.

The present invention is embodied by a data processing device which rewrites data stored in memory, through use of memory having a plurality of erasure-unit regions into which data are written in predetermined units and from which data are erased in predetermined units, as well as an erasure block buffer for storing both write data to be written into the erasure-unit region and non-changing data stored in the erasure-unit region, the device comprising:

write data write means for writing first write data into the erasure block buffer, in response to a first write request for requesting writing of the first write data into a first erasure-unit region of the memory;

save means for writing into the erasure block buffer non-changing data stored in the first erasure-unit region, in response to the first request for requesting writing of the first write data into the first erasure-unit region of the memory;

memory write means for writing into the first erasure-unit region the data written in the erasure block buffer;

the erasure block buffer retaining the first write data and the non-changing data stored in the first erasure-unit region, until a second write request is issued after the first write request; and the write data write means writing the second write data into the erasure block buffer in a case where the second write request requests writing of the second write data into the first erasure-unit region, and the memory write means writing, to the first erasure-unit region, data belonging to the erasure block buffer in which the second write data are written. Even if a plurality of write requests are issued, data can be collectively written into the first erasure-unit region, thus preventing the deterioration of the memory.

The present invention further provides a data processing device which rewrites data stored in memory, through use of memory having a plurality of erasure-unit regions into which data are written in predetermined units and from which data are erased in predetermined units, an erasure block buffer for storing both write data to be written into the erasure-unit region and non-changing data stored in the erasure-unit region, and a write buffer for storing the write data without storing the non-changing data, the device comprising:

write data write means for writing first write data into the erasure block buffer, in response to a first write request for requesting writing of the first write data into a first erasure-unit region of the memory;

save means for writing into the erasure block buffer non-changing data stored in the first erasure-unit region, in response to the first request for requesting writing of the first write data into the first erasure-unit region of the memory;

write buffer write means for writing second write data into the write buffer, in response to a second write request for writing the second write data into a second erasure-unit region of the memory;

the write buffer retaining the second write data until a third write request is issued after the second write request; and the write buffer write means writing the third write data into the write buffer in a case where the third write request requests writing of the third write data into the write request region for the second write data. The data storage method of the present invention enables utilization of a buffer more effectively than a data storage method employing erasure block buffers for use with second and third write requests.

The present invention provides a data processing device including:

first memory having a plurality of erasure-unit regions into which data are written and from which data are deleted in predetermined erasure units, and erasure means for deleting the data stored in the erasure-unit region in the erasure units, the data stored in the erasure-unit region being converted into first write data, the data processing device comprising:

nonvolatile second memory which has an erasure block buffer, an erasure-unit-number hold region, and an erasure-unit-number validation region and which can write data in arbitrary data units;

save means for writing, into the erasure-block buffer, non-changing data which constitute a portion of the data stored in the erasure unit regions and are not rewritten by the first write data;

write control means for writing into the erasure-unit-number hold region information for specifying an erasure-unit region into which the first write data are to be written, writing the first write data into the erasure-block buffer, and writing into the erasure-unit-number validation region information corresponding to the information written into the erasure-unit-number hold region after completion of writing of the first write data and the non-changing data;

memory write means for writing the first write data written into the erasure-block buffer and the non-changing data into the erasure-unit regions; and recovery means for recovering the data processing device on the basis of information pertaining to the erasure-unit-number hold region and the erasure-unit-number validation region. Therefore, the recovery means can ascertain a step in which rewriting of first rewrite data is interrupted, thereby enabling appropriate recovery of the first rewrite data.

Preferably, the second memory has an erasure-block buffer validation region into which is to be written a data check value, which is obtained as a result of processing of the data stored in the erasure-block buffer;

the write control means writes the data check value into the erasure-block-buffer validation region; and the recovery means performs a recovery operation on the basis of the value stored in the erasure-unit-number hold region, the value stored in the erasure-unit-number validation region, and the data check value stored in the erasure-block-buffer validation region. Accordingly, the data processing device can determine whether or not the data stored in the erasure-block buffer are normal, thus enabling an appropriate recovery operation.

The present invention also provides a data processing device including:

first memory having a plurality of erasure-unit regions into which data are written and from which data are deleted in predetermined erasure units, and erasure means for deleting the data stored in the erasure-unit region in the erasure units, the data stored in the erasure-unit region being converted into first write data, the data processing device comprising:

nonvolatile second memory which has an erasure block buffer and a write inhibition flag region and can write data in arbitrary data units;

write control means which, in response to a first write request for requesting writing of the first write data into a first erasure-unit region of the first memory, writes the first write data into the erasure-block buffer in a case where a value stored in the write inhibition flag region shows a write enable state;

save means which, in response to the first write request, writes non-changing data stored in the first erasure-unit region into the erasure-block buffer in a case where a value stored in the write inhibition flag region shows a write enable state; and memory write means which writes the data stored in the erasure-block buffer into the first memory in a case where a value stored in the write inhibition flag region shows a write enable state. Therefore, the data processing device can prevent writing of data into the erasure-block buffer.

Preferably, the erasure-block buffer retains the first write data and the non-changing data in the first erasure-unit region until a second write request arises after the first write request for requesting writing of the first write data; and in a case where the second write request requests writing second write data into the first erasure-unit region, the write control means writes the second write data into the erasure-block buffer, and the memory write means writes into the first erasure-unit region data stored in the erasure-block buffer in which the second write data have been written. In the even of a plurality of write request having arisen, writing of data into a first erasure-unit region by a single operation, thereby preventing deterioration in the first memory.

Preferably, the write control means deletes data from the erasure-unit-number hold means and data from the erasureunit-number validation means after completion of writing the data stored in the erasure-block buffer into the erasure-unit region of the first memory. On the basis of the presence of data in the erasure-unit-number hold region and the presence of data in the erasure-unit-number validation region, the recovery means can ascertain of whether or not writing of the data stored in the erasure-block buffer into the erasure unit region of the first memory has been completed.

Preferably, in a case where the value stored in the erasure-unit-number hold region coincides with the value stored in the erasure-unit-number validation region, the recovery means instructs the memory write means to write the first write data and the non-changing data, both data sets being written in the erasure-block buffer, into the erasure-unit region of the first memory through use of the erasure means. The data stored in the erasure-block buffer can be stored in the first memory, thereby preventing corruption of data.

Preferably, in a case where the value stored in the erasure-unit-number hold region does not coincide with the value stored in the erasure-unit-number validation region, the recovery means deletes the value from the erasure-unit-number hold region and the value from the erasure-unit-number validation region. Even after recovery of data, the erasure-unit-number hold region and the erasure-unit number validation region can be utilized.

Preferably, the second memory has an erasure-block-buffer management region which manages the regions stored in the erasure-block buffer in a divided manner and into which is to be stored a data check value, which would be obtained as a result of processing of data belonging to the divided regions;

the write control means writes the data check value into the erasure-block-buffer validation region; and the recovery means performs a recovery operation on the basis of the value stored in the erasure-unit-number hold region, the value stored in the erasure-unit-number validation region, and the data check value stored in the erasure-block-buffer validation region. Accordingly, the data processing device can ascertain of whether or not the data stored in the erasure-block buffer are correct, on a per-minute-region basis.

Preferably, in a case where a write request region of the second write data coincides with the divided regions managed in the erasure-block-buffer management region, the write control means rewrites the data check value. Therefore, there is obviated the necessity for rewriting the data check value of the overall data stored in the erasure block buffer.

Preferably, in a case where the data requested to be read are stored in the erasure-block buffer, the data processing device further comprises:

reading means for reading data from the erasure-block buffer in a case where the data requested to be read are stored in the erasure-block buffer. In a case where data stored in the erasure-block buffer are determined to be correct on the basis of the data check value stored in the erasure-block-buffer management region, the reading means reads data from the erasure-block buffer. Therefore, reading of anomalous data can be prevented.

Preferably, in a case where the data requested to be read are stored in the erasure-block buffer, the data processing device further comprises:

reading means for reading data from the erasure-block buffer in a case where the data requested to be read are stored in the erasure-block buffer. In a case where data stored in the erasure-block-buffer are determined to be incorrect on the basis of the data check value stored in the erasure-block-buffer management region, the reading means reads data from the first memory. The operation of the data processing device can be continued while using data stored in the first memory.

The present invention provides a data processing device including:

first memory having a plurality of erasure-unit regions into which data are written and from which data are deleted in predetermined erasure units, and erasure means for deleting the data stored in the erasure-unit region in the erasure units, the data processing device comprising:

nonvolatile second memory which can write data in arbitrary data units and has an erasure-block buffer for storing write data to be written into the erasure-unit region and non-changing data stored in the erasure-unit region, a write buffer for storing write data without storage of non-changing data, a region for retaining a first data check value which is obtained as a result of processing of the data stored in the erasure-block buffer, and a region for retaining a second data check value which is obtained as a result of processing of the data written into the write buffer;

write control means which writes the first write data into the erasure-block buffer in response to a first write request for requesting writing of first write data into the first erasure-unit region, writes the second write data into the write buffer in response to a second write request for requesting writing of second write data into the second erasure-unit region, and writes the first data check value and the second data check value into the second memory;

save means for writing non-changing data stored in the first erasure-unit region into the erasure-block buffer in response to the first write request;

memory write means for writing the first write data and the non-changing data, both data sets being written in the erasure-block buffer, into the first erasure-unit region from which data have been deleted by the erasure means; and recovery means which recovers the data processing device on the basis of the first data check value and the second data check value, both values being written in the second memory. Therefore, even after a determination has been made as to whether or not the data recorded in the erasure-block buffer and the data recorded in the write buffer are correct, recovery of the data can be performed appropriately.

Preferably, the recover means instructs the memory write means to write the data stored in the erasure-block buffer into the first erasure-unit region in a case where the data stored in the erasure-block buffer are determined to be correct on the basis of the first data check value, instructs the write control means to write the second write data stored in the write buffer into the erasure-block buffer in a case where the data stored in the write buffer are determined to be correct on the basis of the second data check value, and instructs the save means to write into the erasure-block buffer the non-changing data stored in the second erasure-unit region. Therefore, corruption of the data stored in the erasure-block buffer and the data stored in the write buffer can be prevented.

Preferably, the data processing device further comprises third memory which has an erasure-unit-number hold region and reds data at a higher speed than does the second memory;

the write control means writing information for specifying the erasure-unit region into the erasure-unit-number hold region of the second memory and into the erasure-unit-number hold region of the third memory. When the information for specifying the erasure-unit region is referred to, data are read from the erasure-unit-number hold region of the third memory. Therefore, recovery of data can be made faster.

The present invention provides a data processing device including:

first memory having a plurality of erasure-unit regions into which data are written and from which data are deleted in predetermined erasure units, and erasure means for deleting the data stored in the erasure-unit region in the erasure units, the data stored in the erasure-unit region being converted into first write data, the data processing device comprising:

nonvolatile second memory which can write data in arbitrary data units and has an erasure-block buffer for storing the first write data and non-changing data stored in the erasure-unit region and a write buffer for storing write data without storage of non-changing data;

save means for writing non-changing data stored in the first erasure-unit region into the erasure-block buffer in response to the first write request;

buffer write means for writing a plurality of write data sets into the write data buffer in response to a plurality of write requests other than the first write request;

memory write means for writing the first write into the first erasure-unit region data and the non-changing data, both data sets being written in the erasure-block buffer write means; and data transfer means which calculates the amount of the plurality of write data sets stored in the write buffer, for each erasure-unit region for which a write request has been issued, and which transfers into the erasure-block buffer all the data sets to be written into a single erasure-unit region on the basis of the calculation result, wherein the save means writes into the erasure-block buffer non-changing data, which are stored in the erasure-unit region and correspond to the write data having been transferred to the erasure-block buffer. Accordingly, an available memory space in the write buffer can be efficiently increased.

Preferably, in a case where, from among the write data stored in the write buffer, the amount of the write data requested to be written into a single erasure-unit region is smaller than a predetermined amount and where the amount of the write data is greater than a predetermined amount, the data transfer means transfers all the write data into the erasure-block buffer. Accordingly, the number times data are written into the first memory can be diminished.

What is claimed is:

1. A data storage method by which data stored in memory are rewritten through use of memory having a plurality of erasure-unit regions into which data are written in predetermined units and from which data are erased in predetermined units, as well as a nonvolatile erasure block buffer for storing write data that is to be written into the erasure-unit regions and non-changing data belonging to the erasure-unit regions, said method comprising:

a first erasure block buffer write step of writing first write data into said erasure block buffer, in response to a first write request for requesting writing of the first write data into a first erasure-unit region of said memory;

a second erasure block buffer write step of writing into said erasure block buffer non-changing data recorded in the first erasure-unit region, in response to the first write request for requesting writing of the first write data into the first erasure-unit region of said memory;

a third erasure block buffer write step of writing second write data into said memory, in response to a second write request for requesting writing of the second write data into said memory, after the first erasure block buffer write step; and a memory write step of writing the first write data and the non-changing data written in said erasure block buffer into the first erasure-unit region after the second erasure block buffer write step and the third erasure block buffer write step.

2. The data storage method as defined in claim 1, wherein the first erasure block buffer write step is followed by a comparison step of comparing the erasure-unit region into which the first write data are to be written with the erasure-unit region into which the second write data are to be written, and, in a case where a match is obtained as a comparison result in the comparison step, processing pertaining to the third erasure block buffer write step and processing pertaining to the memory write step are performed.

3. A data processing device including:

first memory having a plurality of erasure-unit regions into which data are written and from which data are deleted in predetermined erasure units, and erasure means for deleting the data stored in the erasure-unit region in said erasure units, the data stored in the erasure-unit region corresponding to first write data, said data processing device comprising:

nonvolatile second memory, which has an erasure block buffer, an erasure-unit-number hold region and an erasure unit-number validation region and which can write data in arbitrary data units;

save means for writing, into said erasure-block buffer, non-changing data which constitute a portion of the data stored in the erasure-unit regions and are not rewritten by the first write data;

write control means for writing into the erasure unit-number hold region information for specifying an erasure-unit region into which the first write data are to be written, writing the first write data into said erasure-block buffer, and writing into the erasure-unit-number validation region information corresponding to the information written into the erasure-unit-number hold region after completion of writing of the first write data and the non-changing data;

memory write-means for writing the first write data written into said erasure-block buffer and, the non-changing data into the erasure-unit regions; and recovery means for recovering said data processing device on the basis of information pertaining to the erasure-unit-number hold region and the erasure-unit-number validation region.

4. The data processing device as defined in claim 3, wherein said second memory has an erasure-block buffer validation region into which is to be written a data check value, which is obtained as a result of processing of the data stored in said erasure-block buffer;

said write control means writes the data check value into the erasure-block-buffer validation region; and said recovery means performs a recovery operation on the basis of the value stored in the erasure-unit-number hold region, the value stored in the erasure-unit-number validation region, and the data check value stored in the erasure-block-buffer validation region.

5. The data processing device as defined in claim 3, wherein said erasure-block buffer retains the first write data and the non-changing data in the first erasure-unit region until a second write request arises after the first write request for requesting writing of the first write data; and in a case where the second write request requests writing second write data into the first erasure-unit region, said write control means writes the second write data into said erasure-block buffer, and said memory write means writes into the first erasure-unit region data stored in said erasure-block buffer in which the second write data have been written.

6. The data processing device as defined in claim 3, wherein said write control means deletes the information, which specifies the erasure-unit region from said erasure-unit-number hold region and deletes the information, which corresponds to the information written into the erasure-unit-number hold region after completion of writing of the first write data and the non-changing data, from said erasure-unit-number validation region after completion of writing the data stored in said erasure-block buffer into the erasure-unit region of said first memory.

7. The data processing device as defined in claim 3, wherein in a case where the value stored in the erasure-unit-number hold region coincides with the value stored in the erasure-unit-number validation region, said recovery means instructs said memory write means to write the first write data and the non-changing data, both data sets being written in said erasure-block buffer, into the erasure-unit region of said first memory through use of said erasure means.

8. The data processing device as defined in claim 5, wherein in a case where the value stored in the erasure-unit number hold region does not coincide with the value stored in the erasure-unit-number validation region, said recovery means deletes the value from the erasure-unit-number hold region and the value from the-erasure-unit-number validation region.

9. The data processing device as defined in claim 5, wherein said second memory has an erasure-block-buffer management region which manages the regions stored in said erasure-block buffer in a divided manner and into which is to be stored a data check value, which would be obtained as a result of processing of data belonging to the divided regions;

said write control means writes the data check value into the erasure-block-buffer validation region; and said recovery means performs a recovery operation on the basis of the value stored in the erasure-unit-number hold region, the value stored in the erasure-unit-number validation region, and the data check value stored in the erasure-block-buffer validation region.

10. The data processing device as defined in claim 9, wherein in a case where a write request region of the second write data coincides with the divided regions managed in the erasure-block-buffer management region, said write control means rewrites the data check value.

11. The data processing device as defined in claim 9, further comprising:

reading means for reading data from said erasure-block buffer in a case where the data requested to be read are stored in said erasure-block buffer, and in a case where data stored in said erasure-block buffer are determined to be correct on the basis of the data check value stored in the erasure-block-buffer management region, said reading means reading data from said erasure-block buffer.

12. The data processing device as defined in claim 9, further comprising:

reading means for reading data from said erasure-block buffer in a case where the data requested to be read are stored in said erasure-block buffer, and in a case where data stored in said erasure-block buffer are determined to be incorrect on the basis of the data check value stored in the erasure-block-buffer management region, the reading means reading data from said first memory.

13. The data processing device as defined in claim 3, further comprising:

third memory which has an erasure-unit-number hold region and reads data at a higher speed than said second memory;

said write control means writing information for specifying the erasure-unit region into the erasure-unit number hold region of said second memory and into the erasure-unit-number hold region of said third memory; and when the information for specifying the erasure-unit region is referred to, data being read from the erasure-unit-number hold region of said third memory.

* * * * *